US011610908B2

(12) United States Patent
Baek

(10) Patent No.: US 11,610,908 B2
(45) Date of Patent: Mar. 21, 2023

(54) VERTICAL MEMORY DEVICES

(71) Applicant: SAMSUNG ELECTRONICS CO., LTD., Suwon-si (KR)

(72) Inventor: Seokcheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 16/833,925

(22) Filed: Mar. 30, 2020

(65) Prior Publication Data

US 2020/0388624 A1    Dec. 10, 2020

(30) Foreign Application Priority Data

Jun. 4, 2019 (KR) .......................... 10-2019-0066135

(51) Int. Cl.
| | |
|---|---|
| *H01L 27/11573* | (2017.01) |
| *H01L 27/11556* | (2017.01) |
| *H01L 27/11582* | (2017.01) |
| *G11C 5/06* | (2006.01) |
| *G11C 5/02* | (2006.01) |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
None
See application file for complete search history.

(56) References Cited

U.S. PATENT DOCUMENTS

| | | |
|---|---|---|
| 8,791,523 B2 | 7/2014 | Iino et al. |
| 9,331,082 B2 | 5/2016 | Lee et al. |
| 9,768,193 B2 | 9/2017 | Lee et al. |
| 9,865,540 B2 | 1/2018 | Kim et al. |
| 9,871,053 B2 | 1/2018 | Kwak |
| 10,134,757 B2 | 11/2018 | Chun et al. |
| 10,153,297 B2 | 12/2018 | Oh |
| 2016/0293624 A1* | 10/2016 | Sonehara .......... H01L 27/11565 |
| 2017/0103929 A1* | 4/2017 | Lee .......................... H01L 22/34 |
| 2017/0103993 A1* | 4/2017 | Lee ..................... H01L 27/1157 |
| 2018/0053686 A1 | 2/2018 | Hyun et al. |

(Continued)

FOREIGN PATENT DOCUMENTS

KR    10-2017-0046892    5/2017

*Primary Examiner* — Sarah K Salerno
(74) *Attorney, Agent, or Firm* — F. Chau & Associates, LLC

(57) ABSTRACT

A vertical memory device including: a substrate including a first and second regions; gate electrodes spaced apart from each other in a first direction, each of the gate electrodes extending in a second direction on the first and second regions, and the gate electrode are stacked on the second region; a channel extending in the first direction on the first region, the channel extending through the gate electrodes; a first conductive structure on an end portion of a first gate electrode, the end portion on the second region, the first gate electrode being disposed at a lowermost level; and a second conductive structure spaced apart from the first conductive structure in the second direction on the second region, the second conductive structure not overlapping the first gate electrode in the first direction and being disposed at a height different from that of the first conductive structure.

15 Claims, 82 Drawing Sheets

(56) References Cited

U.S. PATENT DOCUMENTS

| | | |
|---|---|---|
| 2018/0166380 A1 | 6/2018 | Park et al. |
| 2018/0269226 A1 | 9/2018 | Sonehara et al. |
| 2018/0301460 A1 | 10/2018 | Yoo et al. |
| 2018/0323207 A1* | 11/2018 | Shim .................. H01L 27/1203 |
| 2019/0043876 A1 | 2/2019 | Van Schravendijk et al. |

* cited by examiner

FIG. 1
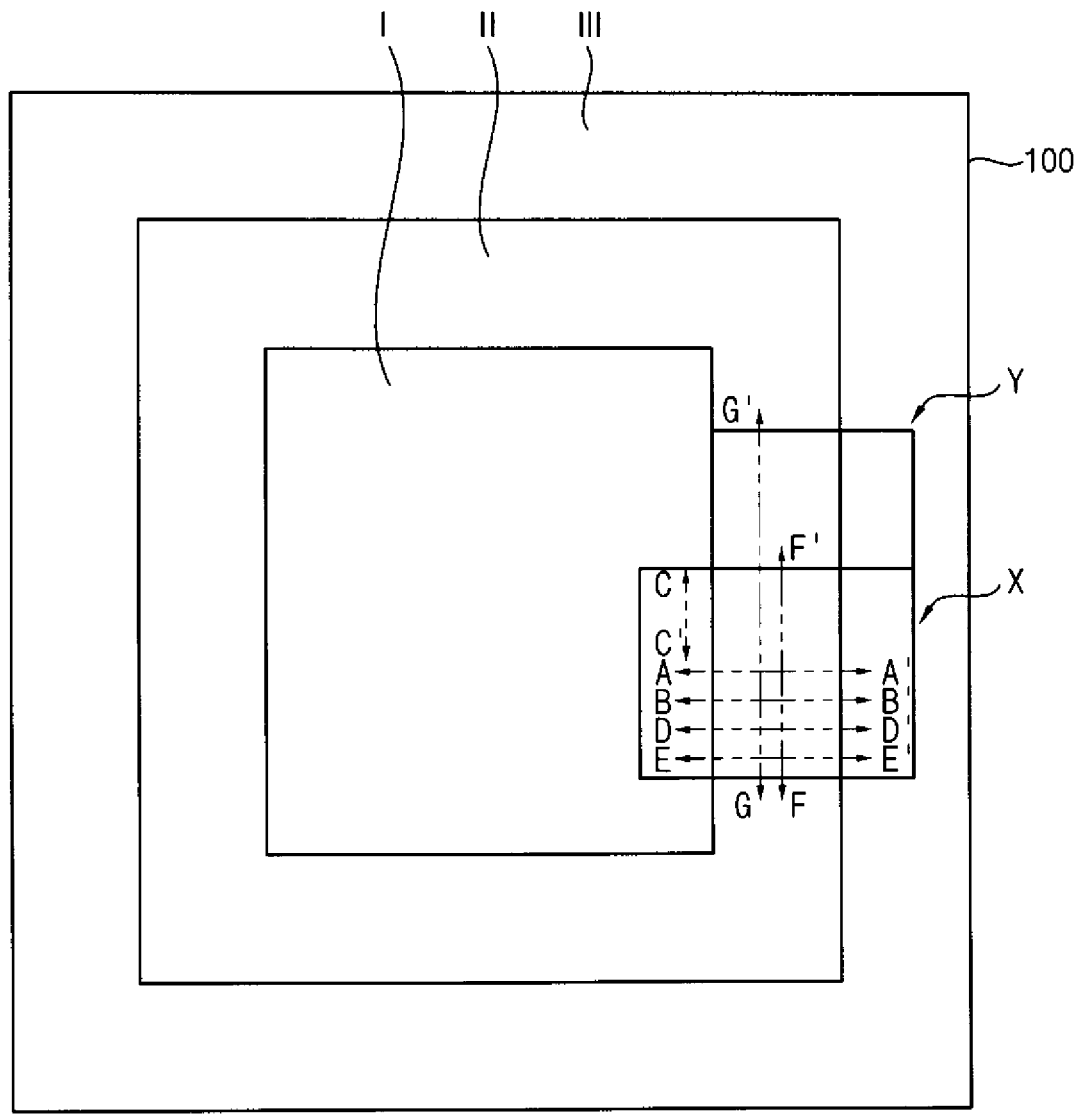
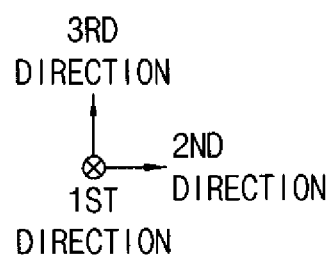

VERTICAL MEMORY DEVICES

CROSS-REFERENCE TO RELATED APPLICATION

This application claims priority under 35 U.S.C. § 119 to Korean Patent Application No. 10-2019-0066135, filed on Jun. 4, 2019 in the Korean Intellectual Property Office (KIPO) the disclosure of which is incorporated by reference herein in its entirety.

1. Field

The inventive concept relates to vertical memory devices.

2. Description of the Related Art

When a VNAND flash memory device is manufactured an is pad may be provided at an end of a sacrificial layer to form a pad at an end of a gate electrode for contacting a contact plug. The insulation pad may be replaced with a metal during a gate replacement process. The metal gate may cause an electrical short, and thus, is eventually removed. However, the removal of the insulation pad takes time and is not easy, thereby leading to increased cost of the VNAND flash memory device.

SUMMARY

According to an exemplary embodiment of the inventive concept, there is provided a vertical memory device. The vertical memory device may include a substrate including a first region and a second region at least partially surrounding the first region; gate electrodes at a plurality of levels, the gate electrodes spaced apart from each other in a first direction substantially perpendicular to an upper surface of the substrate, each of the gate electrodes extending in a second direction substantially parallel to the upper surface on the first region and the second region, and the gate electrodes are stacked in a staircase shape on the second region; a channel extending in the first direction on the first region, the channel extending through the gate electrodes; a first conductive structure on an end portion of a first gate electrode among the gate electrodes, the end portion on the second region, the first gate electrode being disposed at a lowermost level of the plurality of levels; and a second conductive structure spaced apart from the first conductive structure in the second direction on the second region, the second conductive structure not overlapping the first gate electrode in the first direction and being disposed at a height different from that of the first conductive structure.

According to an exemplary embodiment of the inventive concept, there is provided a vertical memory device. The vertical memory device may include a substrate including a cell array region, an extension region at least partially surrounding the cell array region, and a circuit region at least partially surrounding the extension region; gate electrodes at a plurality of levels, the gate electrodes spaced apart from each other in a first direction substantially perpendicular to an upper surface of the substrate, each of the gate electrodes extending in a second direction substantially parallel to the upper surface of the substrate on the cell array region and the extension region of the substrate, and the gate electrodes are stacked in a staircase shape on the extension region of the substrate; a channel extending in the first direction on the cell array region of the substrate, the channel extending through the gate electrodes; a first insulation pad on a portion of the circuit region of the substrate spaced apart from an end portion, in the second direction, of a first gate electrode among the gate electrodes, the first gate electrode being disposed at a lowermost level of the plurality of levels, and the first insulation pad being higher than the first gate electrode with respect to the upper surface of the substrate; and a second insulation pad spaced apart from the first insulation pad in the second direction on the circuit region of the substrate, the second insulation pad being at a height different from that of the first insulation pad, wherein the first and second insulation pads include substantially the same material.

According to an exemplary embodiment of the inventive concept, there is provided a vertical memory device. The vertical memory device may include a substrate including a cell array region, an extension region at least partially surrounding the cell array region, and a circuit region at least partially surrounding the extension region; gate electrodes at a plurality of levels, the gate electrodes spaced apart from each other in a first direction substantially perpendicular to an upper surface of the substrate, each of the gate electrodes extending in a second direction substantially parallel to the upper surface of the substrate on the cell array region and the extension region of the substrate, and the gate electrodes stacked in a staircase shape on the extension region of the substrate, a channel extending in the first direction on the cell array region of the substrate, the channel extending through the gate electrodes; a conductive structure higher than a first gate electrode among the gate electrodes and lower than a second gate electrode of the gate electrodes, the conductive structure overlapping an end portion of the first gate electrode in the first direction, the first gate electrode being adjacent to the upper surface of the substrate; and a cut-off pattern extending in the first direction on the circuit region of the substrate, the cut-off pattern contacting the conductive structure.

According to an exemplary embodiment of the inventive concept, there is provided a vertical memory device. The vertical memory device may include a substrate including a cell array region and an extension region at least partially surrounding the cell array region; gate electrodes at a plurality of levels, the gate electrodes spaced apart from each other in a first direction substantially perpendicular to an upper surface of the substrate, each of the gate electrodes extending in a second direction substantially parallel to the upper surface of the substrate on the cell array region and the extension region of the substrate, and the gate electrodes having a staircase shape on the extension region of the substrate; a channel extending in the first direction on the cell array region of the substrate, the channel extending through the gate electrodes; a conductive structure on an end portion of a first gate electrode among the gate electrodes on the extension region of the substrate, the first gate electrode being disposed at a lowermost level of the plurality of levels; and conductive pads formed at end portions of the gate electrodes, respectively, each of the conductive pads being thicker than other portions of the gate electrodes on which they are formed, wherein each of the conductive pads protrudes from its respective gate electrode in a third direction substantially parallel to the upper surface of the substrate and substantially perpendicular to the second direction.

According to an exemplary embodiment of the inventive concept, there is provided a vertical memory device. The vertical memory device may include a circuit pattern on a substrate; gate electrodes spaced apart from each other on the circuit pattern in a first direction substantially perpendicular to an upper surface of the substrate, each of the gate electrodes extending in a second direction substantially parallel to the upper surface of the substrate, and the gate electrodes being stacked in a staircase shape; a channel extending in the first direction through the gate electrodes; and a first contact plug extending in the first direction through at least one of the gate electrodes to be electrically connected to the circuit pattern, wherein conductive pads are formed at end portions in the second direction of the gate electrodes, respectively, each of the conductive pads having a thickness greater than that of the gate electrode on which it is formed, and each of the conductive pads protrudes from the gate electrode on which it is formed in a third direction substantially parallel to the upper surface of the substrate and substantially perpendicular to the second direction, and wherein the first contact plug extends through the conductive pad of the at least one of the gate electrodes.

According to an exemplary embodiment of the inventive concept, there is provided a vertical memory device. The vertical memory device may include a substrate including a cell array region and an extension region at least partially surrounding the cell array region; gate electrodes at a plurality of levels, the gate electrodes spaced apart from each other in a first direction substantially perpendicular to an upper surface of the substrate, each of the gate electrodes extending in a second direction substantially parallel to the upper surface of the substrate on the cell array region and, the extension region of the substrate, and the gate electrodes have a staircase shape on the extension region of the substrate; and a channel extending in the first direction on the cell array region of the substrate, the channel extending through the gate electrodes, wherein end portions, in the second direction, of the gate electrodes form a staircase structure including steps disposed in a third direction substantially parallel to the upper surface of the substrate and substantially perpendicular to the second direction, and wherein a sacrificial pattern and an insulation layer are formed between a portion of one of the gate electrodes at a level directly under an uppermost level of the staircase structure and a step at a second level from among, the steps, the sacrificial pattern and the insulation layer including different materials from each other.

BRIEF DESCRIPTION OF THE DRAWINGS

FIGS. 1, 2, 3, 4 and 5 are plan views and cross-sectional views illustrating a vertical memory device in accordance with exemplary embodiments of the inventive concept.

DETAILED DESCRIPTION OF THE EMBODIMENTS

The above and other features of the inventive concept will become readily understood by describing in detail exemplary embodiments thereof with reference to the accompanying drawings.

Hereinafter, two directions substantially parallel to an upper surface of a substrate 100 and crossing each other may be referred to as first and second directions, respectively. In addition, a direction substantially perpendicular to the upper surface of the substrate 100 may be referred to as a third direction. In exemplary embodiments of the inventive concept, the first and second directions may be substantially perpendicular to each other.

Figure 2:
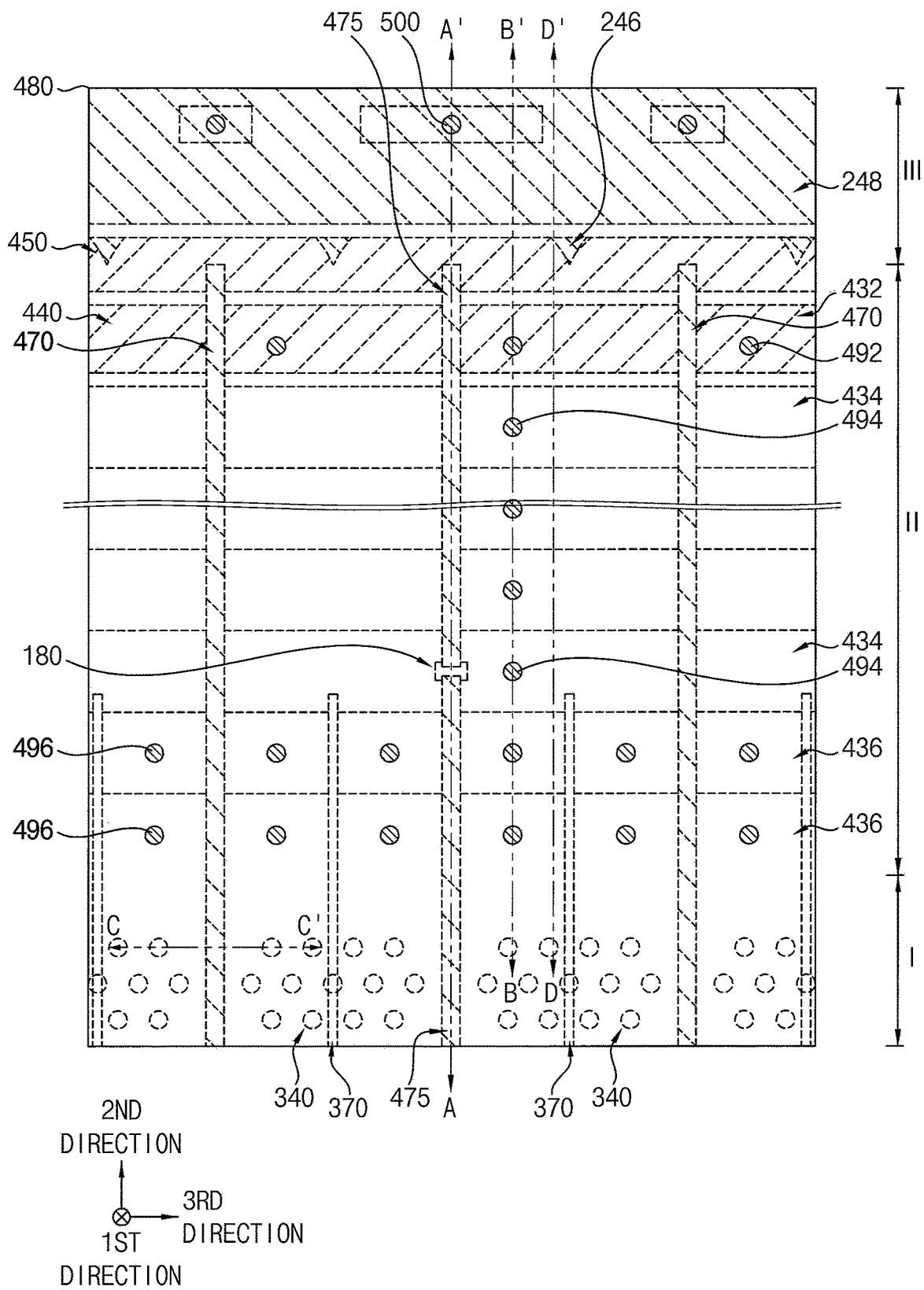
Figure 3:
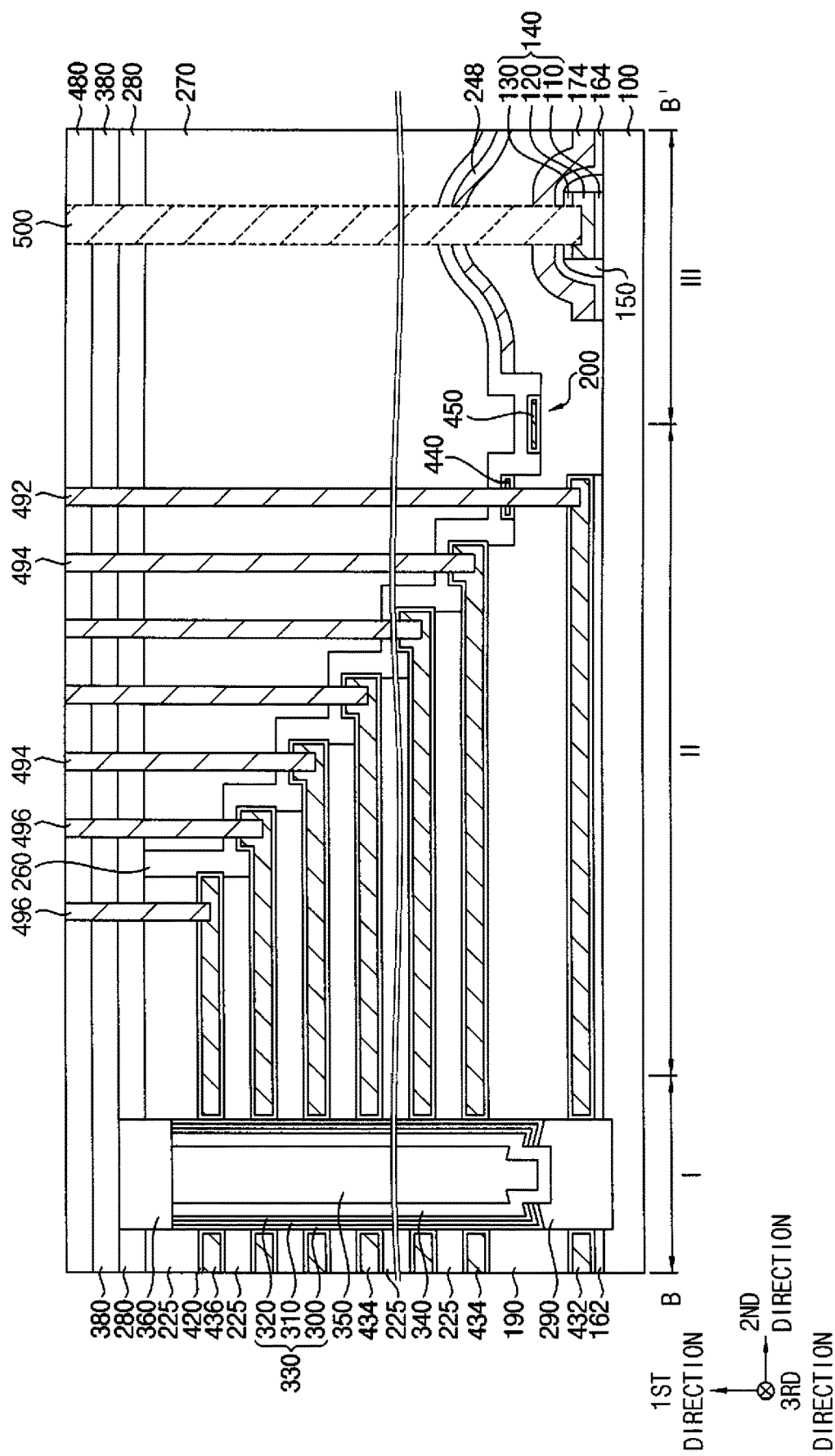
Figure 4:
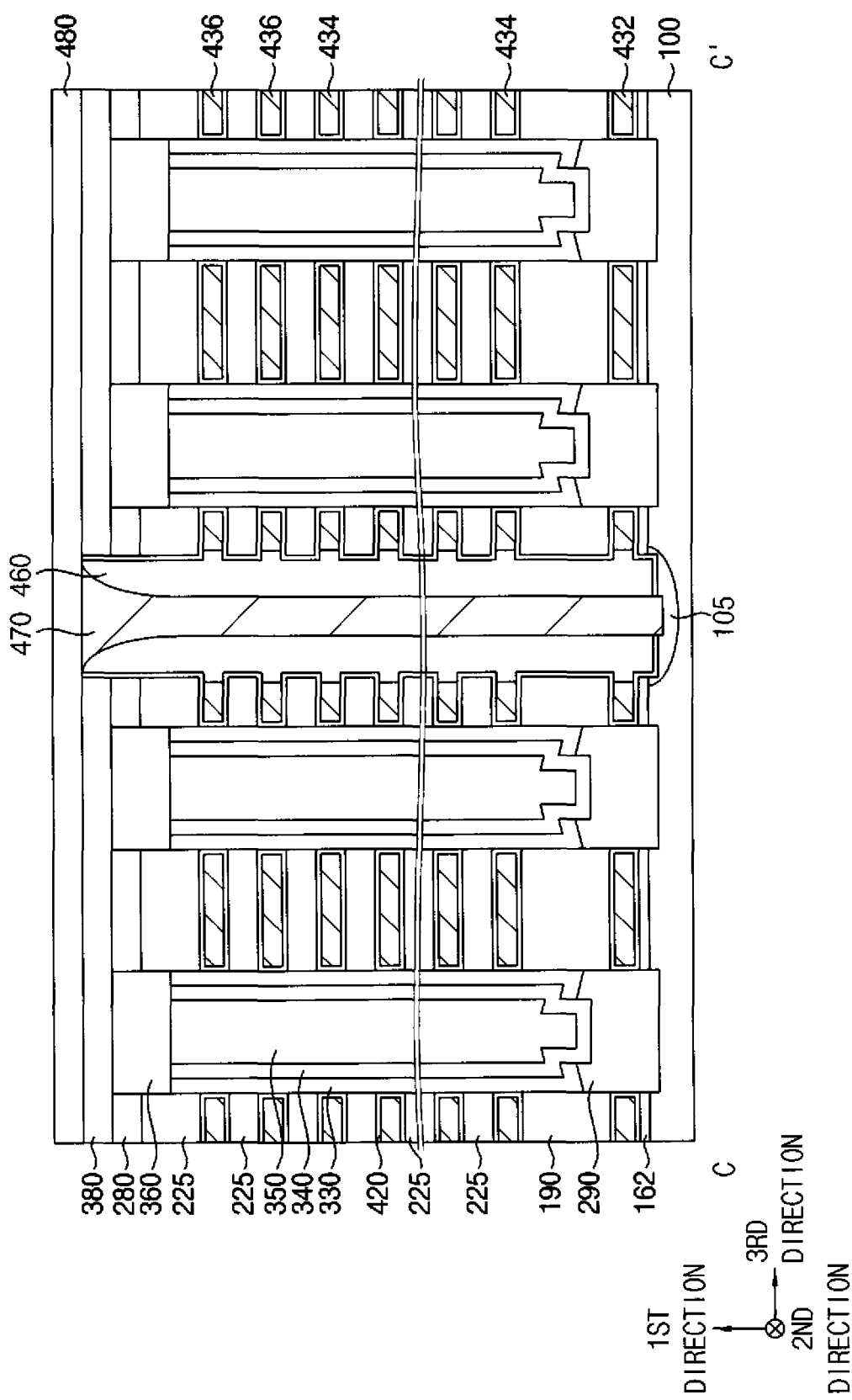
Figure 5:
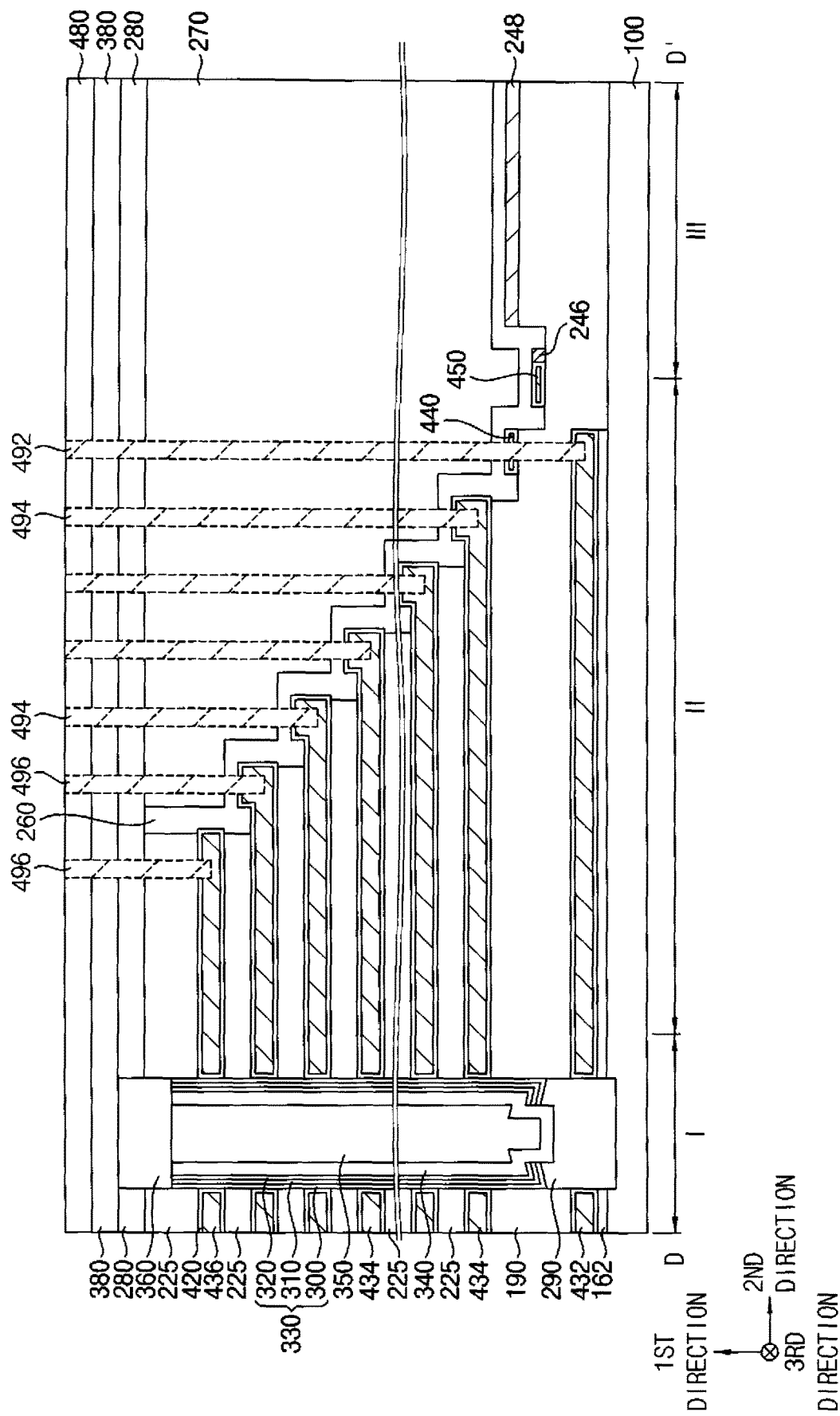

FIGS. 1 to 5 are plan views and cross-sectional views illustrating a vertical memory device in accordance with exemplary embodiments of the inventive concept. Particularly, FIGS. 1 and 2 are the plan views, FIG. 3 is a cross-sectional view taken along a line B-B' of FIG. 2, FIG. 4 is a cross-sectional view taken along a line C-C' of FIG. 1, and FIG. 5 is a cross-sectional view taken along a line D-D' of FIG. 1. FIGS. 2 to 5 are drawings of a region X of FIG. 1.

Referring to FIGS. 1 to 5, the vertical memory device may include a gate electrode structure including gate electrodes 432, 434 and 436 disposed at a plurality of levels, respectively, in the first direction, each of which may extend in the second direction and be stacked in a staircase shape on first and second regions I and II of the substrate 100. The substrate 100 may include the first region I, the second region II and a third region III. The vertical memory device may further include a channel 340 extending in the first direction on the first region I of the substrate 100 at least partially through the gate electrode structure, first and second conductive structures 440 and 450, and third and fourth insulation pads 246 and 248.

The vertical memory device may further include a first impurity region 105, first, second and third insulation patterns 162, 164 and 225, a first gate structure 140, a first gate spacer 150, a first etch stop pattern 174, a semiconductor pattern 290, a charge storage structure 330, a filling pattern 350, a capping pattern 360, a second blocking layer 420, first and second division patterns 180 and 370, first and second common source lines (CSLs) 470 and 475, a second spacer 460, first, second, third and fourth contact plugs 492, 494, 496 and 500, and first, second, third, fourth and fifth insulating interlayers 190, 270, 280, 380 and 480.

The vertical memory device may further include a bit line, a via, an upper wiring, etc. The bit line may extend in the third direction, and a plurality of bit lines may be spaced apart from each other in the second direction.

The substrate 100 may include silicon, germanium, silicon-germanium or a III-V compound such as GaP, GaAs, GaSb, etc. In some embodiments of the inventive concept, the substrate 100 may be a silicon-on-insulator (SOI) substrate or a germanium-on-insulator (GOI) substrate.

The substrate 100 may include the first region I in which memory cells may be formed, the second region II at least partially surrounding the first region I, and the third region III at least partially surrounding the second region II. The contact plugs 492, 494, 496 and 500 for transferring electrical signals to the memory cells may be formed in the second region II and circuit patterns for applying electrical signals to the memory cells through the contact plugs 492, 494, 496 and 500 may be formed in the third region III. The first to third regions I, II and III may be referred to as a cell region, an extension (e.g., a connection) region and a peripheral circuit region, respectively.

The gate electrode structure may include at least one first gate electrode 432, a plurality of second gate electrodes 434, and at least one third gate electrode 436, which may be sequentially stacked in the first direction. A plurality of gate electrode structures may be spaced apart from each other in the third direction by the first and second CSLs 470 and 475 extending in the second direction and the second spacer 460 covering each opposite sidewall of the first and second CSLs 470 and 475 in the third direction.

The first insulation pattern 162 may be formed between the substrate 100 and the first gate electrode 432, the first insulating interlayer 190 may be formed between the first gate electrode 432 and the second gate electrode 434, and the third insulation pattern 225 may be formed between the second gate electrodes 434, between the second and third gate electrodes 434 and 436, and between the third gate electrodes 436. The first and third insulation patterns 162 and 225 may include an oxide, e.g., silicon oxide.

In exemplary embodiments of the inventive concept, the gate electrode structure may have a staircase shape in which a length in the second direction may gradually decrease in the first direction from a bottom level toward a top level thereof on the second region II of the substrate 100, and thus, may be referred to as a staircase structure. Herein, each level composing the staircase structure may be referred to as a "step layer," and an end portion of the step layer that is not be overlapped with upper step layers to be exposed may be referred to as a "step."

In exemplary embodiments of the inventive concept, an end portion in the second direction of one of the second and third gate electrodes 434 and 436 except for an uppermost one of the third gate electrodes 436 may have a higher top surface and a thicker thickness than other portions thereof. This end portion may be referred to as a "conductive pad" of the gate electrode. However, the first gate electrode 432 and the uppermost one of the third gate electrodes 436 may include no conductive pad. The conductive pad may extend in the third direction to a given length.

Each of the first to third gate electrodes 432, 434 and 436 may include a gate conductive pattern and a gate barrier pattern covering at least a portion of a surface of the gate conductive pattern. The gate conductive pattern may include a metal having a low resistance, e.g., tungsten, titanium, tantalum, platinum, etc., and the gate barrier pattern may include a metal nitride, e.g., titanium nitride, tantalum nitride, etc.

The second blocking layer 420 may cover upper and lower surfaces and a sidewall of each of the first to third gate electrodes 432, 434 and 436, and may be further formed on a sidewall of the second division pattern 370, an outer sidewall of the first blocking pattern 300, a sidewall of the semiconductor pattern 290, a surface of the third insulation pattern 225, and the upper surface of the substrate 100. The second blocking layer 420 may include a metal oxide, e.g., aluminum oxide.

The first CSL 470 may continuously extend in the second direction on the first and second regions I and II of the substrate 100, however, the second CSL 475 may extend in the second direction on the first and second regions I and II and be partially cut on the second region II. In an exemplary embodiment of the inventive concept, the cut portion of the second CSL 475 may overlap the first division pattern 180 in the first direction, and one of the gate electrodes corresponding to the cut portion of the second CSL 475 may not be divided. Each of the first and second CSLs 470 and 475 may include a metal, e.g., tungsten, copper, aluminum, etc.

The first impurity region 105 may be formed at an upper portion of the substrate 100 contacting a bottom of each of the first and second CSLs 470 and 475. The first impurity region 105 may include, e.g., single crystalline silicon doped with n-type impurities. As the first impurity region 105 is formed, a contact resistance between the substrate 100 and each of the first and second CSLs 470 and 475 may decrease.

The first division pattern 180 may extend through the first gate electrode 432 on the second region II of the substrate 100 to divide the first gate electrode 432 in the third direction, and a plurality of first division patterns 180 may be formed in the third direction. The first division pattern 180 may include an oxide, e.g., silicon oxide.

The semiconductor pattern 290 may be formed through the first gate electrode 432 on the first region I of the substrate 100, and the channel 340 may be formed on the semiconductor pattern 290 to extend through the second and third gate electrodes 434 and 436. The channel 340 may have a shape of, e.g., a cup, and an outer sidewall of the channel 340 may be covered by the charge storage structure 330, and an inner space formed by the channel 340 may be filled with the filling pattern 350. The channel 340 may include, e.g., undoped polysilicon, and the filling pattern 350 may include an oxide, e.g., silicon oxide.

A plurality of channels 340 may be formed in each of the second and third directions. In exemplary embodiments of the inventive concept, a plurality of channels 340 disposed in the second direction may form a channel column, a plurality of channel columns disposed in the third direction may form a channel group, and two channel groups at opposite sides of the second CSL 475, and spaced apart from each other in the third direction between neighboring ones of the first CSLs 470 may form a channel block.

The charge storage structure 330 may include a tunnel insulation pattern 320, a charge storage pattern 310 and a first blocking pattern 300 sequentially stacked in a horizontal direction substantially parallel to the upper surface of the substrate 100 from the outer sidewall of the channel 340. For example, the tunnel insulation pattern 320, the charge storage pattern 310, and the first blocking pattern 300 may include an oxide such as silicon oxide, a nitride such as silicon nitride, and an oxide such as silicon oxide, respectively.

The capping pattern 360 may be formed on the channel 340, the charge storage structure 330 and the filling pattern 350, and thus may be connected to the channel 340. The capping pattern 360 may include, e.g., doped polysilicon.

In exemplary embodiments of the inventive concept, the second division pattern 370 may extend in the second direction at a central portion in the third direction of one channel group. Thus, the second division pattern 370 may extend through upper portions of the channels 340 included in one of the channel columns at a central portion of one channel group.

In exemplary embodiments of the inventive concept, each of the third gate electrodes 436 may be divided in the third direction by the second division pattern 370.

The first gate structure 140 may include a first gate insulation pattern 110, a first gate electrode pattern 120 and a first gate mask 130 sequentially stacked on the third region III of the substrate 100. The first gate spacer 150 may be formed on a sidewall of the first gate structure 140.

The second insulation pattern 164 may be formed on the third region III of the substrate 100 to cover the first gate structure 140 and the first gate spacer 150, and the first etch stop pattern 174 may be formed on the second insulation pattern 164. The second insulation pattern 164 and the first etch stop pattern 174 may include an oxide and a nitride, respectively.

The first insulating interlayer 190 may cover the first gate electrode 432 on the first and second regions I and II of the substrate 100, and may cover the first etch stop pattern 174 on the third region III of the substrate 100.

In exemplary embodiments of the inventive concept, a step connected to a lowermost one of the second gate electrodes 434 may be formed on an upper surface of the first insulating interlayer 190 on an end portion of the first gate electrode 432 in the second direction, and a recess 200 lower than the step may be formed at a portion of a boundary between the second and third regions II and III adjacent the step.

The first conductive structure 440 may be formed on the step on the upper surface of the first insulating interlayer 190 on the second region II of the substrate 100, and may have a linear shape extending in the third direction. The second conductive structure 450 may be formed on the recess 200 at the portion of the boundary between the second and third regions II and III of the substrate 100 to be spaced apart from the first conductive structure 440 in the second direction, and may extend in the third direction. Thus, the second conductive structure 450 may not overlap the first gate electrode 432 in the first direction, and may be formed at a height different from that of the first conductive structure 440, e.g., at a lower height.

However, a portion of the second conductive structure 450 may have a width in the second direction less than other portions thereof, and may contact the third insulation pad 246 on the recess 200.

Each of the first and second conductive structures 440 and 450 may have a structure and a material substantially the same as those of each of the first to third gate electrodes 432, 434 and 436, and upper and lower surfaces and a sidewall of each of the first and second conductive structures 440 and 450 may be covered by the second blocking layer 420.

The third insulation pad 246 may be spaced apart in the second direction from an end portion of the first gate electrode 432. The fourth insulation pad 248 may be formed on the third region III of the substrate 100, and have a linear shape extending in the third direction. In exemplary embodiments of the inventive concept, the fourth insulation pad 248 may be formed at a height different from that of the third insulation pad 246, e.g., at a higher height. Each of the third and fourth insulation pads 246 and 248 may include a nitride, e.g., silicon nitride.

The fourth insulation layer 260 may be formed on the third insulation pattern 225, the first and second conductive structures 440 and 450, and the third and fourth insulation pads 246 and 248. The fourth insulation layer 260 may include an oxide, e.g., silicon oxide.

The second to fifth insulating interlayers 270, 280, 380 and 480 may be sequentially stacked on the fourth insulation layer 260, and may include an oxide, e.g., silicon oxide.

The first to third contact plugs 492, 494 and 496 may extend through the first to fifth insulating interlayers 190, 270, 280, 380 and 480, the third insulation patterns 225, the fourth insulation layer 260 and the second blocking layer 420 to contact the first to third gate electrodes 432, 434 and 436, respectively, on the second region II of the substrate 100, and the fourth contact plug 500 may extend through the first to fifth insulating interlayers 190, 270, 280, 380 and 480, the fourth insulation layer 260, the fourth insulation pad 248, the first etch stop pattern 274, the second insulation pattern 164 and the first gate mask 130 to contact the first gate electrode pattern 120 on the third region III of the substrate 100.

The second contact plug 494 may contact a conductive pad of each of the second gate electrodes 434, and the third contact plug 496 may contact each of the third gate electrodes 436, particularly, a conductive pad thereof, except for the uppermost one of the third gate electrodes 436.

In exemplary embodiments of the inventive concept, the first contact plug 492 may extend through the first conductive structure 440 to contact the first gate electrode 432. The first and second conductive structures 440 and 450 may be formed at different heights and spaced apart from each other to be electrically insulated from each other. Thus, the first contact plugs 492 at opposite sides of one of the first and second CSLs 470 and 475 in the third direction may not be electrically short through the first and second conductive structures 440 and 450.

Up to this point, the word line extending in the second direction and the bit line extending in the third direction have been explained, however, the inventive concept is not be limited thereto. For example, the extending directions of the word line and the bit line may be exchangeable. In other words, the explanations given for the word line may be applied to the bit line.

FIGS. 6 to 22 are plan views and cross-sectional views illustrating a method of manufacturing a vertical memory device in accordance with exemplary embodiments of the inventive concept. Particularly, FIGS. 6, 8, 11, 14, 16 and 19 are plan views of a region X of FIG. 1, and FIGS. 7, 9-10, 12-13, 15, 17-18 and 20-22 are cross-sectional views of the region X of FIG. 1.

Figure 15:
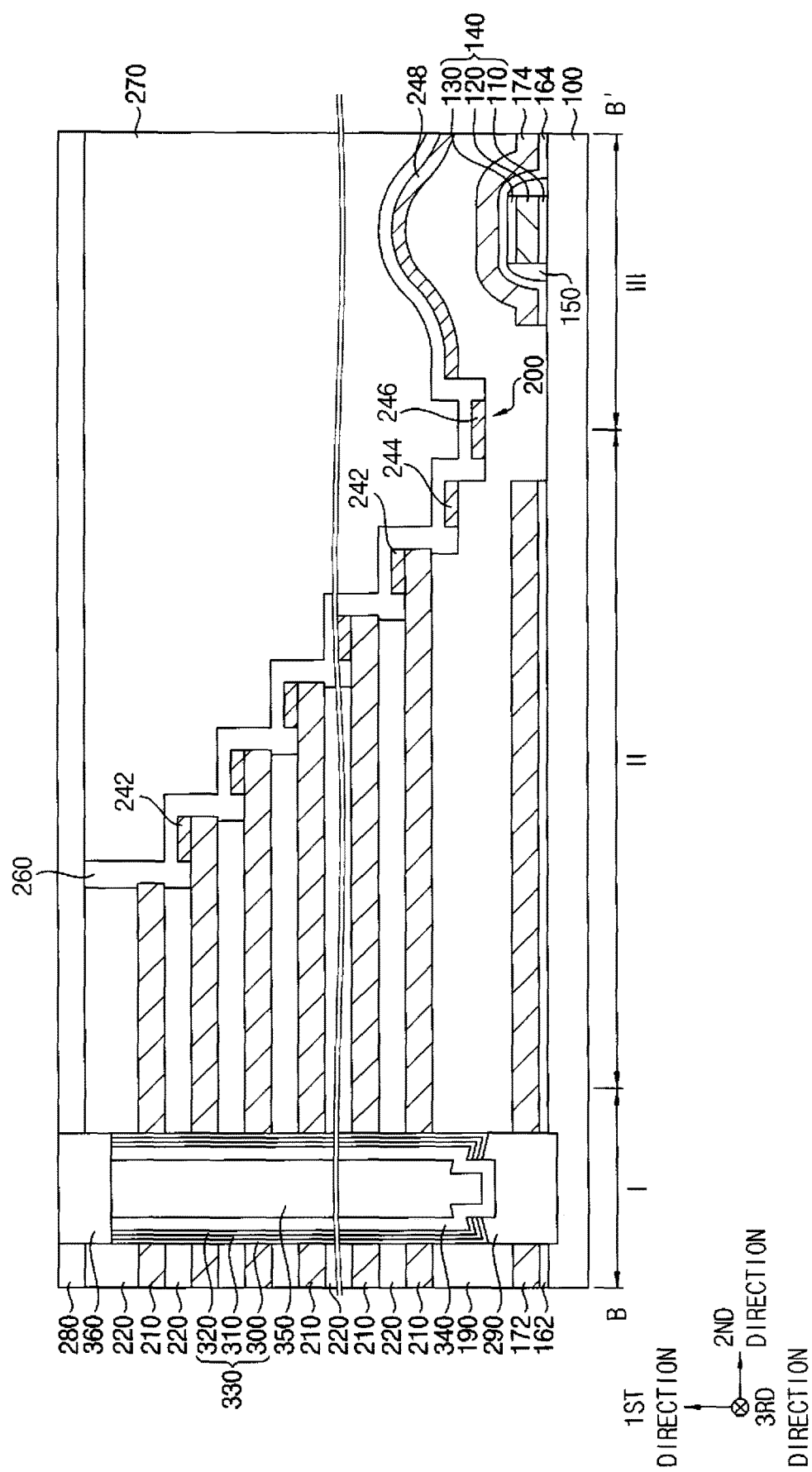
Figure 17:
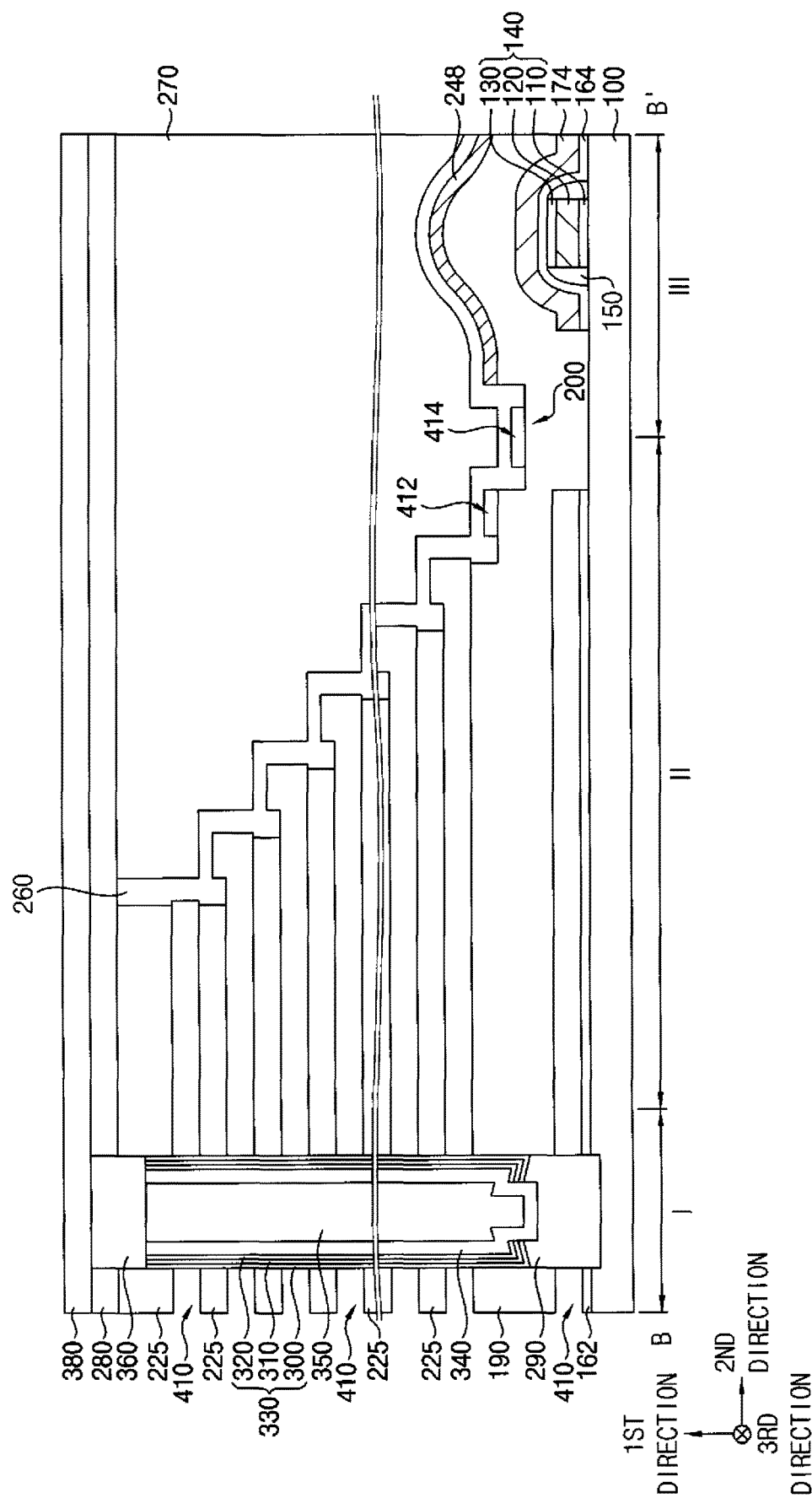
Figure 18:
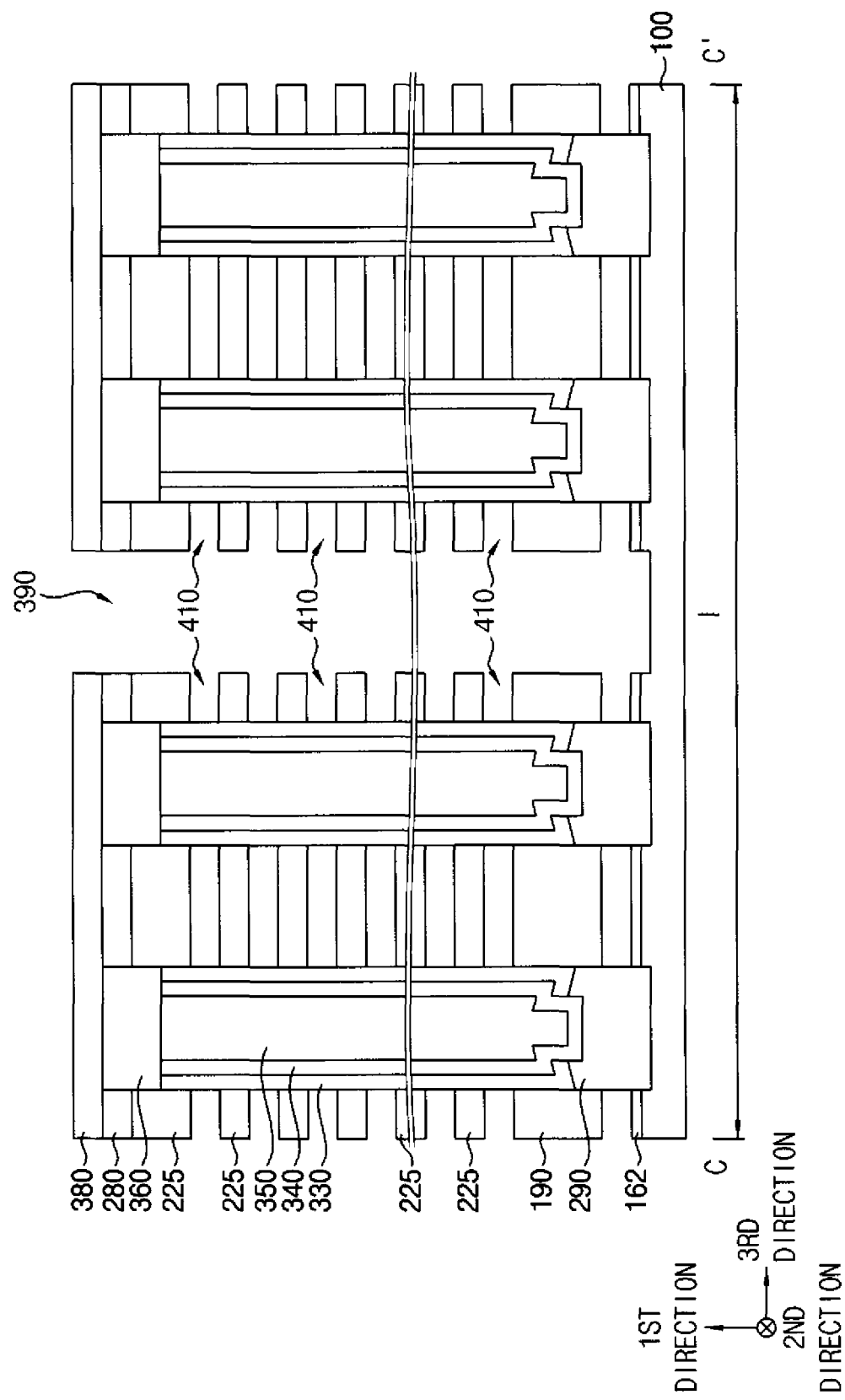
Figure 20:
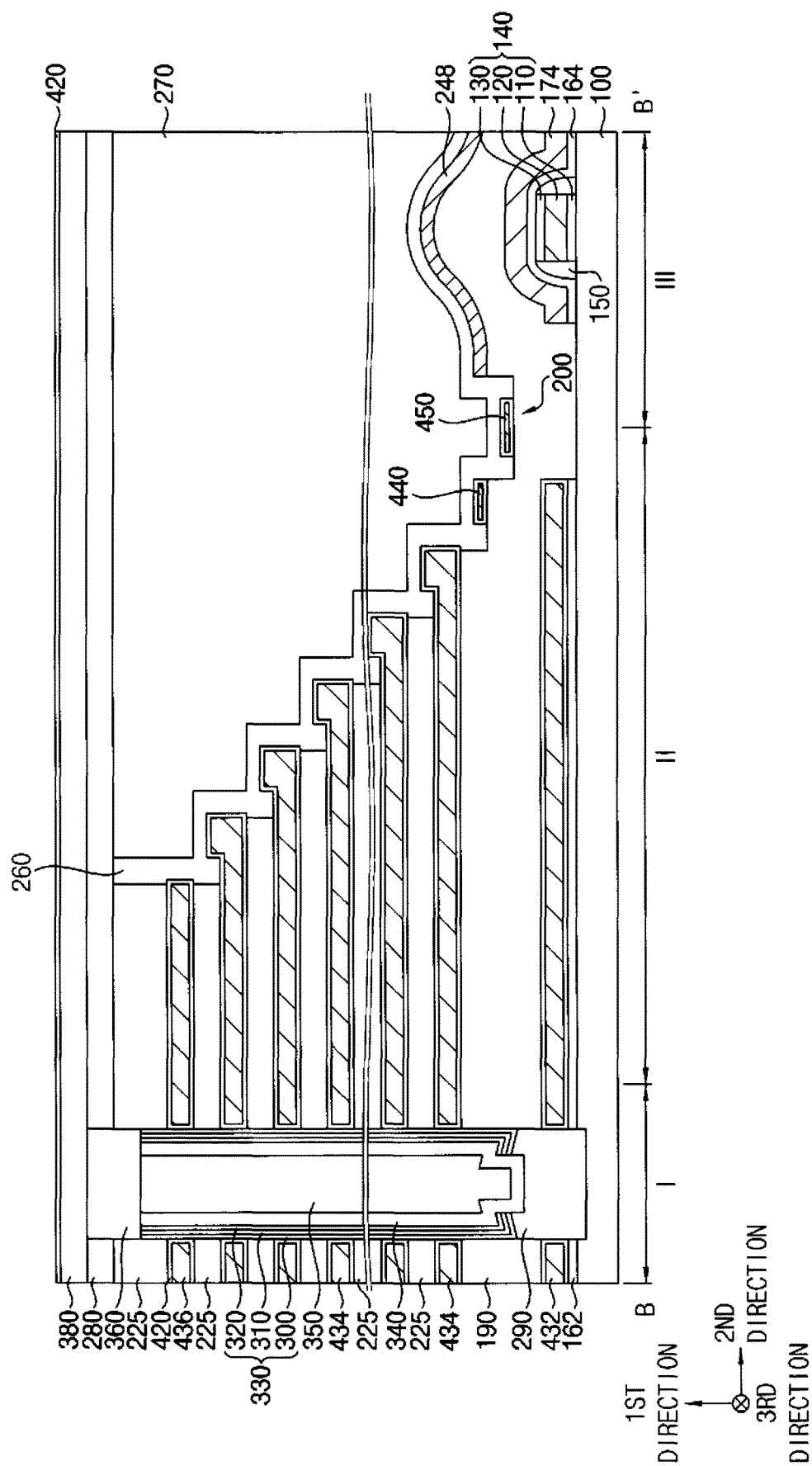
Figure 21:
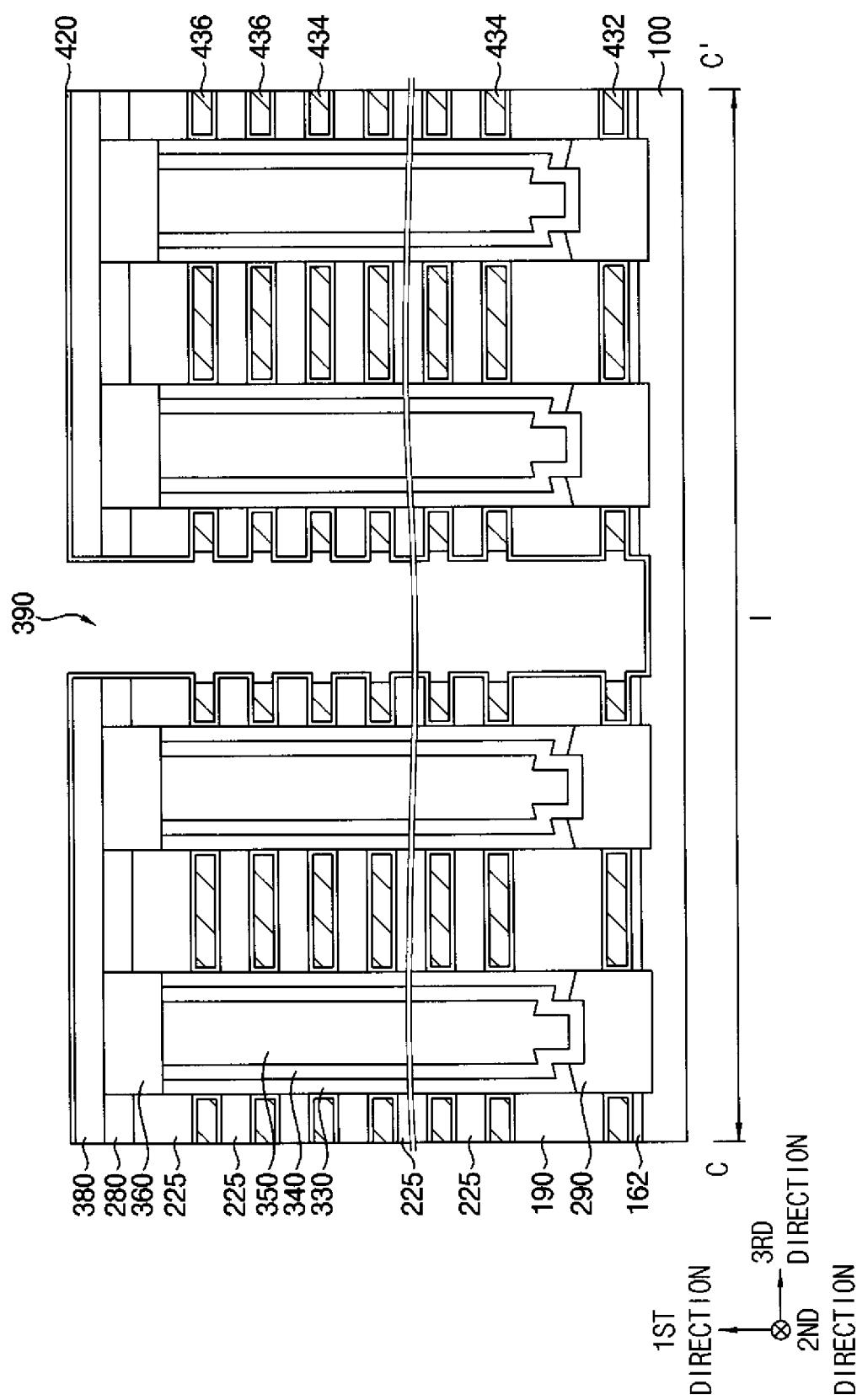
Figure 22:
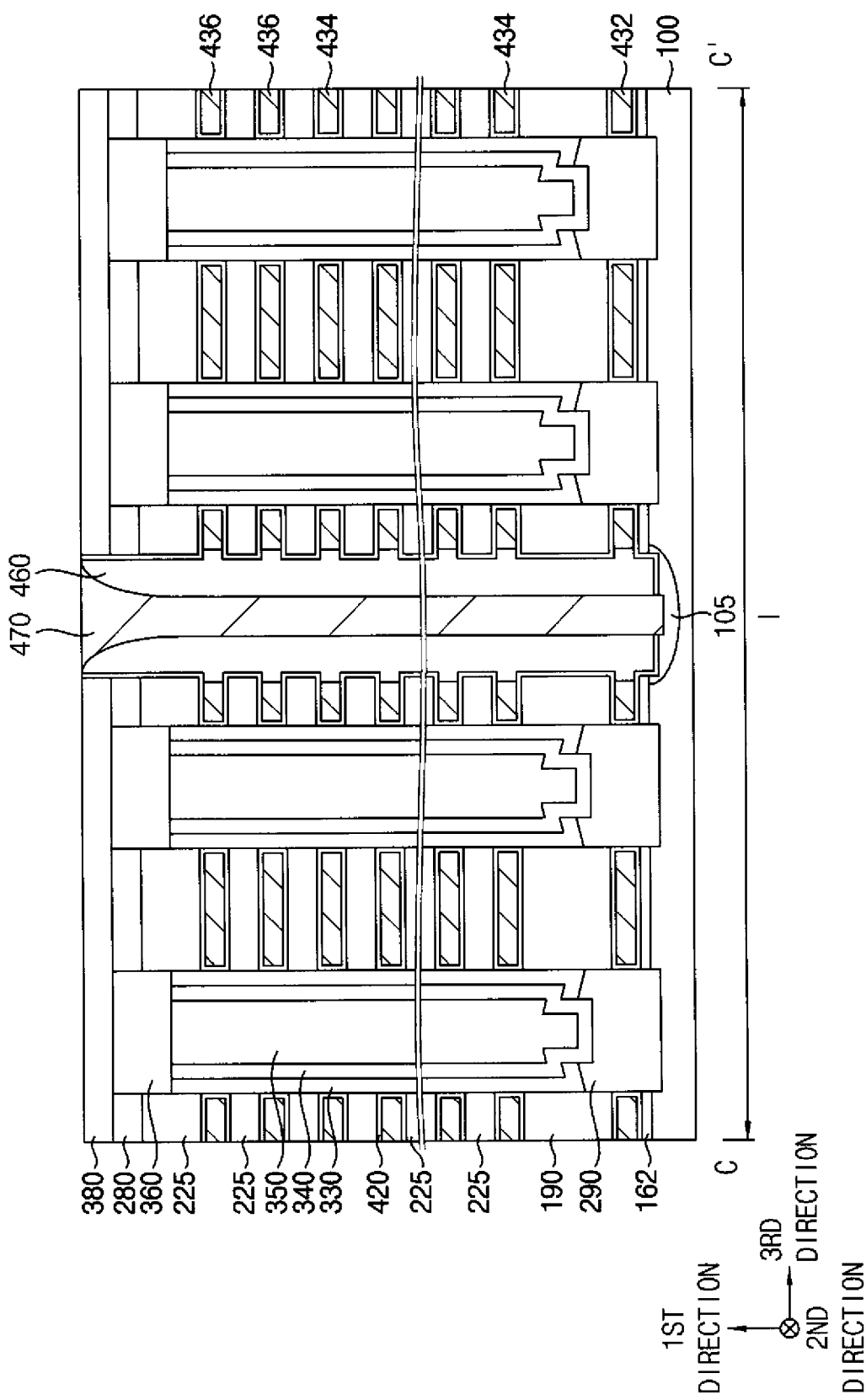

FIGS. 7, 9-10 and 12-13 are cross-sectional views taken along lines A-A' of corresponding plan views, respectively, FIGS. 15, 17 and 20 are cross-sectional views taken along lines B-B' of corresponding plan views, respectively, and FIGS. 18 and 21-22 are cross-sectional views taken along lines C-C' of corresponding plan views, respectively.

Figure 6:
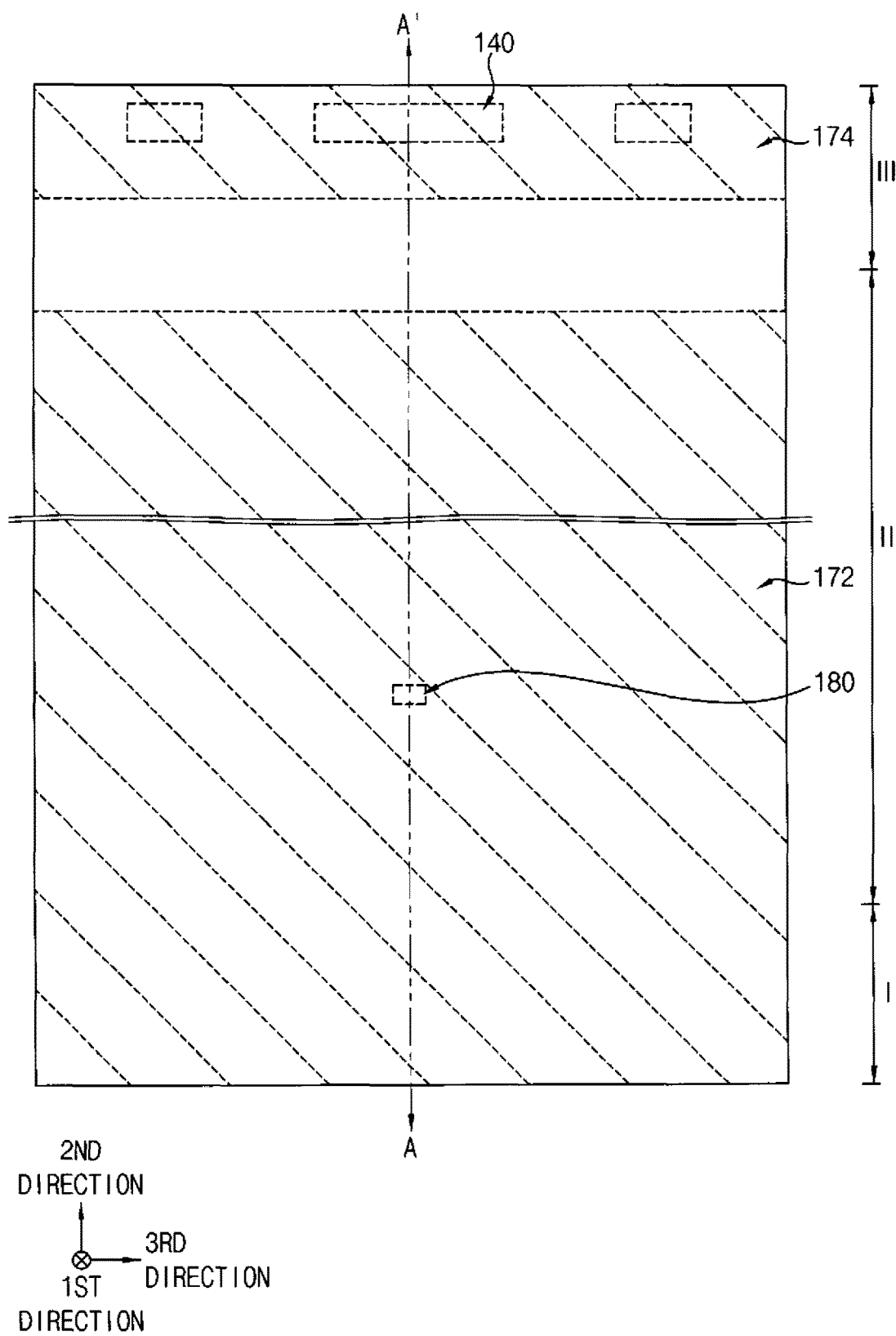
FIGS. 6, 7, 8, 9, 10, 11, 12, 13, 14, 15, 16, 17, 18, 19, 20, 21 and 22 are plan views and cross-sectional views illustrating a method of manufacturing a vertical memory device in accordance with exemplary embodiments of the inventive concept.
Figure 7:
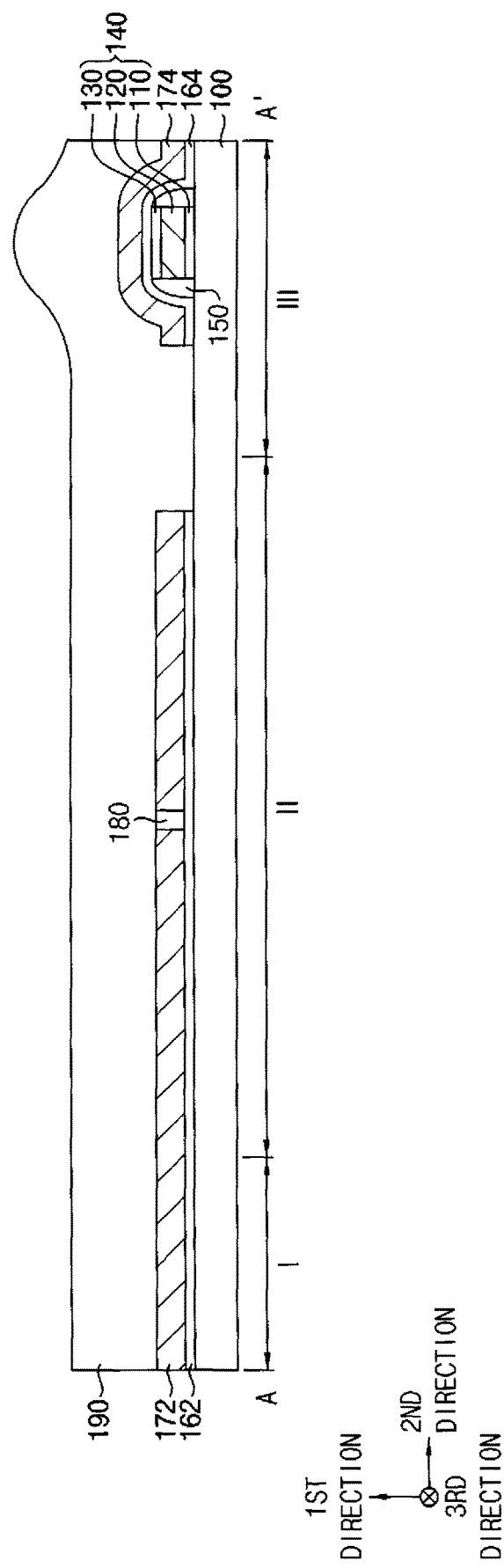

Referring to FIGS. 6 and 7, a first gate structure 140 may be formed on a substrate 100 including first to third regions I, II and III.

The first gate structure 140 may include a first gate insulation pattern 110, a first gate electrode pattern 120 and a first gate mask 130 sequentially stacked on the substrate 100. A first gate spacer 150 may be formed on a sidewall of the first gate structure 140.

A first insulation layer and a first etch stop layer may be formed on the substrate 100 to cover the first gate structure 140 and the first gate spacer 150, and may be patterned to form a first insulation pattern 162 and a first sacrificial pattern 172 sequentially stacked on the first and second regions I and II of the substrate 100, and to form a second insulation pattern 164 and a first etch stop pattern 174 on the third region III of the substrate 100.

In exemplary embodiments of the inventive concept, the first insulation pattern 162 and the first sacrificial pattern 172 may have a rectangular shape on the first and second regions I and II in a plan view, and the second insulation pattern 164 and the first etch stop pattern 174 may cover the first gate structure 140 and the first gate spacer 150 on the third region III of the substrate 100.

The first etch stop layer may include a nitride, e.g., silicon nitride.

The first sacrificial pattern 172 on the second region II of the substrate 100 may be partially removed to form a first opening exposing the first insulation pattern 162, and a first division pattern 180 may be formed to fill the first opening.

A first insulating interlayer 190 may be formed on the substrate 100 to cover the first and second insulation patterns 162 and 164, the first sacrificial pattern 172 and the first etch stop pattern 174.

Figure 8:
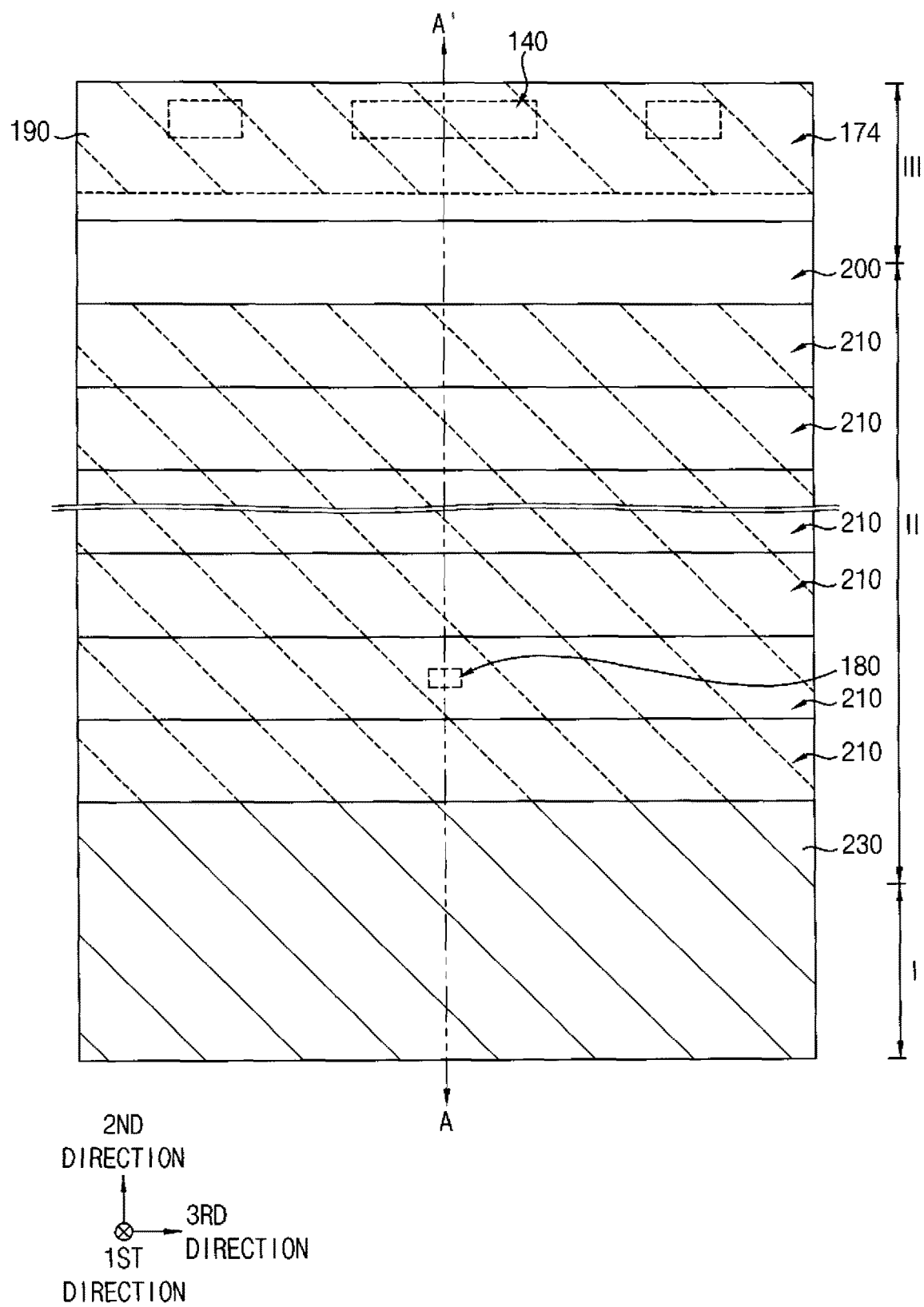
Figure 9:
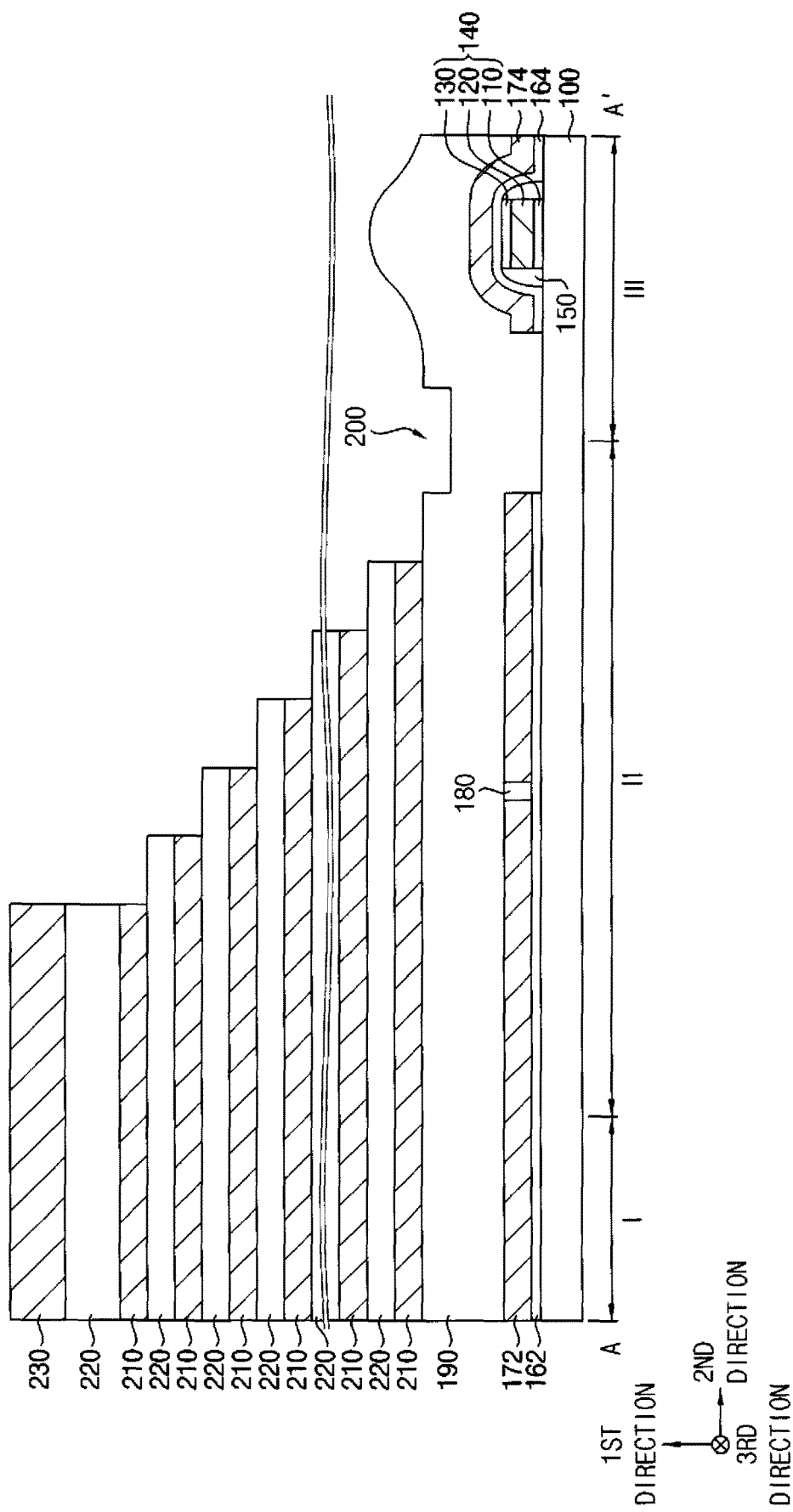

Referring to FIGS. 8 and 9, a sacrificial layer 210 and a third insulation layer 220 may be alternately and repeatedly stacked on the first insulating interlayer 190. Thus, a plurality of sacrificial layers 210 and a plurality of third insulation layers 220 may be alternately stacked in the first direction. A second etch stop layer 230 may be formed on an uppermost one of the third insulation layers 220.

The sacrificial layer 210 may include a material having an etching selectivity with respect to the third insulation layer 220, e.g., silicon nitride, and the second etch stop layer 230 may include a material substantially the same as that of the sacrificial layer 210.

A photoresist pattern partially covering the second etch stop layer 230 may be formed on the second etch stop layer 230, and thus, the second etch stop layer 230, an uppermost one of the third insulation layers 220 and an uppermost one of the sacrificial layers 210 may be etched using the photoresist pattern as an etching mask. Thus, a portion of one of the third insulation layers 220 under the uppermost one of the sacrificial layers 210 may be partially exposed. An area of the photoresist pattern may be reduced by a trimming process, and the second etch stop layer 230, the uppermost one of the third insulation layers 220, the uppermost one of the sacrificial layers 210, the exposed one of the third insulation layers 220, and the exposed one of the sacrificial layers 210 therebeneath may be etched using the reduced photoresist pattern as an etching mask. The trimming process and the etching process ma be repeatedly performed so that a mold having a staircase shape including a plurality of step layers each of which may consist of the sacrificial layer 210 and the third insulation layer 220 sequentially stacked may be formed on the first and second regions I and II of the substrate 100. The second etch stop layer 230 may remain on the mold. An upper surface of the first insulating interlayer 190 may be exposed on the second region II of the substrate 100 adjacent to the third region III of the substrate 100. Hereinafter, each layer included in the staircase structure may be referred to as a "step layer," and an end portion of each layer not covered by upper step layers to be exposed may be referred to as a "step."

In exemplary embodiments of the inventive concept, areas of the step layers of the mold may gradually decrease from a bottom level toward a top level. In a plan view, a lowermost one of the step layers of the mold may have an area smaller than that of a step layer consisting of the first insulation pattern 162 and the first sacrificial pattern 172. Thus, an upper surface of the first insulating interlayer 190 may be exposed on a step layer consisting of the first insulation pattern 162 and the first sacrificial pattern 172.

A portion of the first insulating interlayer 190 at a boundary between the second and third regions II and III of the substrate 100 may be partially removed to form a recess 200. The recess 200 may be formed by partially removing a portion of the first insulating interlayer 190, which does not overlap in the first direction an end portion of the first sacrificial pattern 172, in each of the second and third directions on the second and third regions II and III of the substrate 100. Thus, in a plan view, the recess 200 may have a rectangular ring shape, and may extend in each of the second and third directions in a cross-sectional view. FIGS. 8 and 9 are a plan view and a cross-sectional view, respectively, of the region X, and thus the recess 200 is shown to extend in the third direction. Hereinafter, the shapes of elements will be illustrated regarding the region X.

Figure 10:
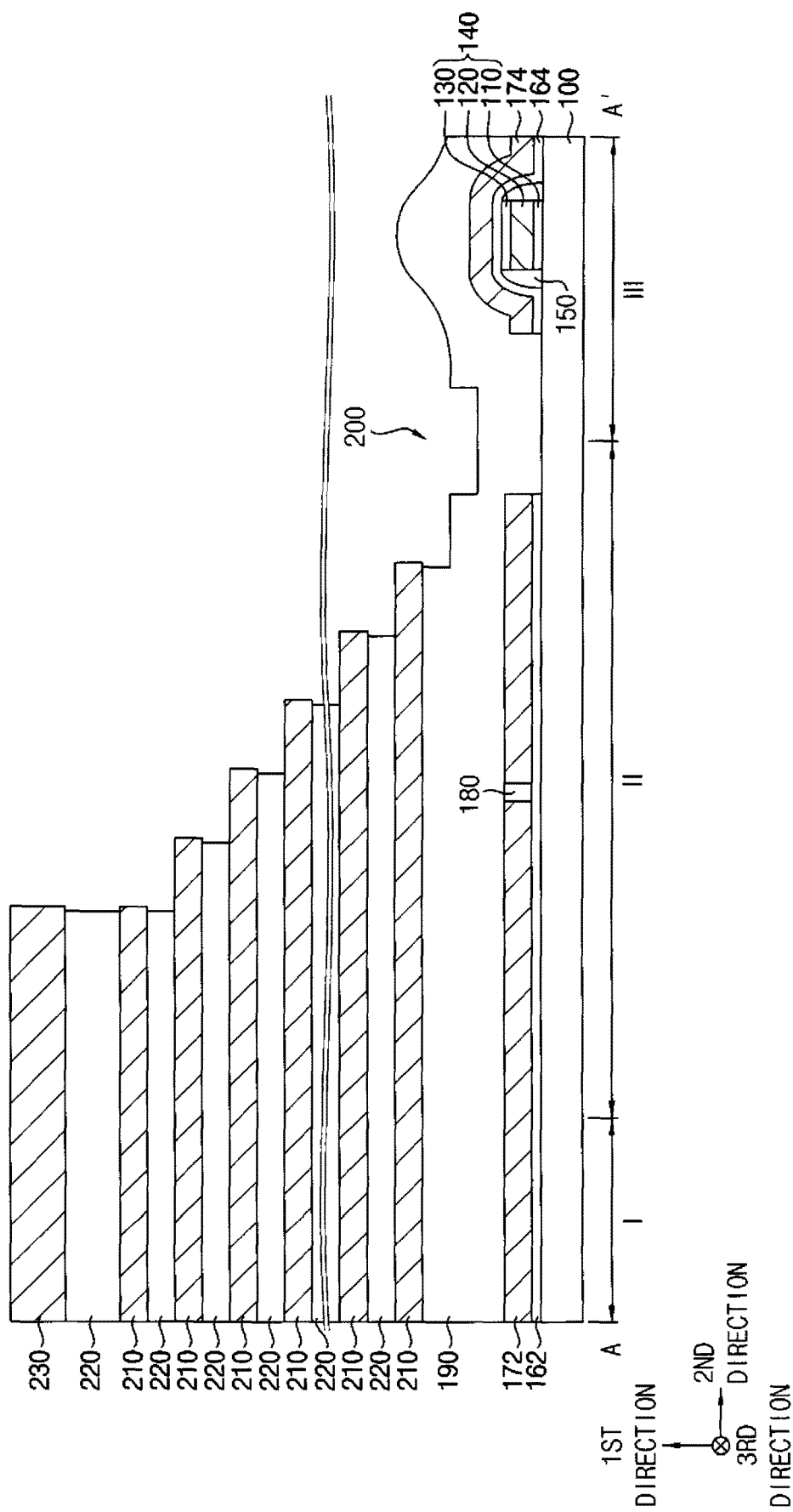

Referring to FIG. 10, a portion of the third insulation layer 220 in a step of each step layer consisting of the sacrificial layer 210 and the third insulation layer 220 sequentially stacked may be removed to expose the sacrificial layer 210.

The portion of the third insulation layer 220 may be removed by, e.g., a wet etching process, and a sidewall of a remaining portion of the third insulation layer 220 of a first step layer may be closer to the first region I of the substrate 100 than a sidewall of an end portion of the sacrificial layer 210 of a second step layer directly on the first step layer.

During the etching process, an exposed upper portion of the first insulating interlayer 190 on the step layer consisting of the first insulation pattern 162 and the first sacrificial pattern 172, the recess 200 at the boundary between the second and third regions II and III of the substrate 100, and an upper portion of the first insulating interlayer 190 on the third region III of the substrate 100 may be also removed by a given thickness. Thus, a step of the first insulating interlayer 190 on the end portion of the first sacrificial pattern 172 and a step of the first insulating interlayer 190 in the recess 200 at the boundary between the second and third regions II and III of the substrate 100 may be further formed under a lowermost step of the mold.

Figure 11:
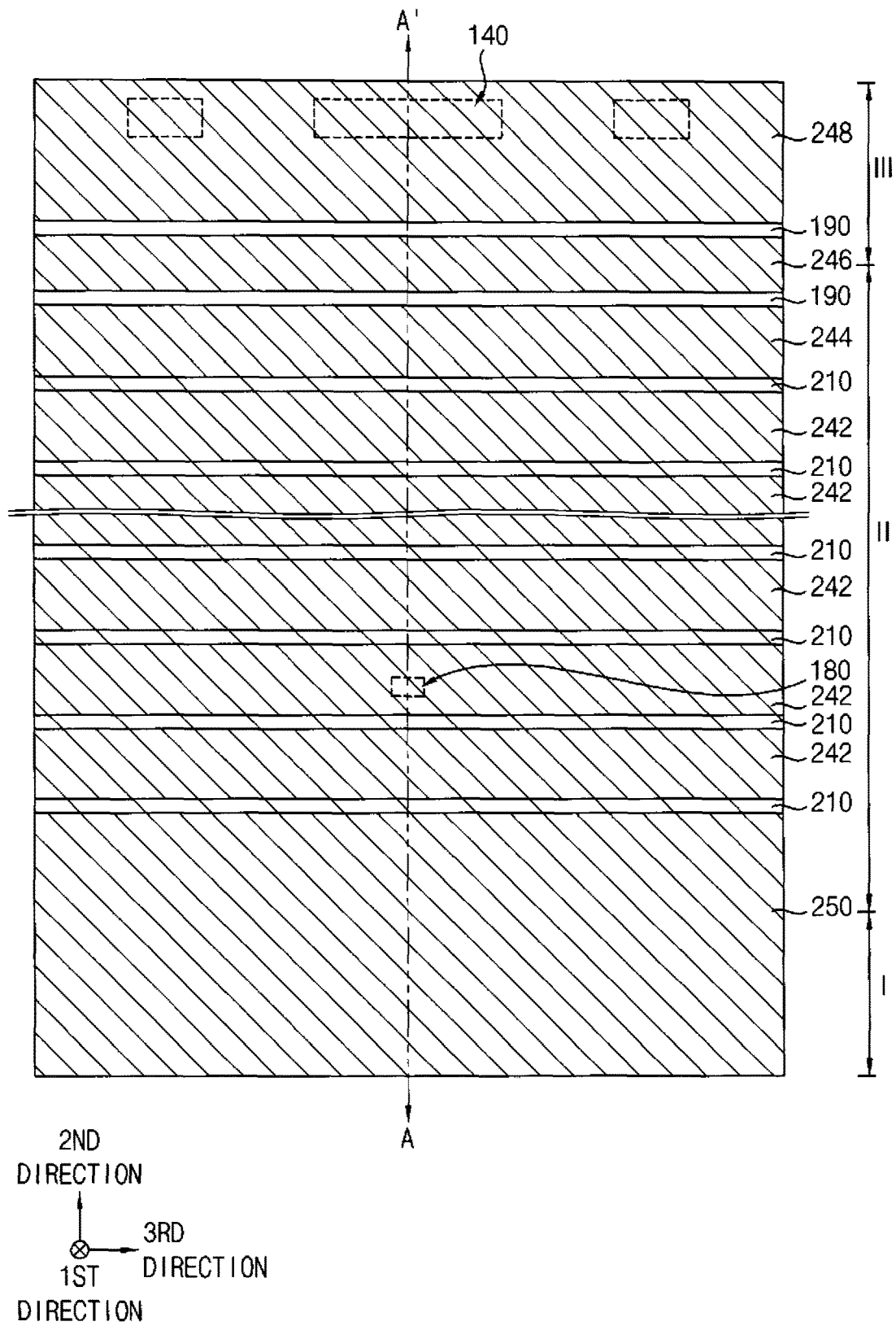
Figure 12:
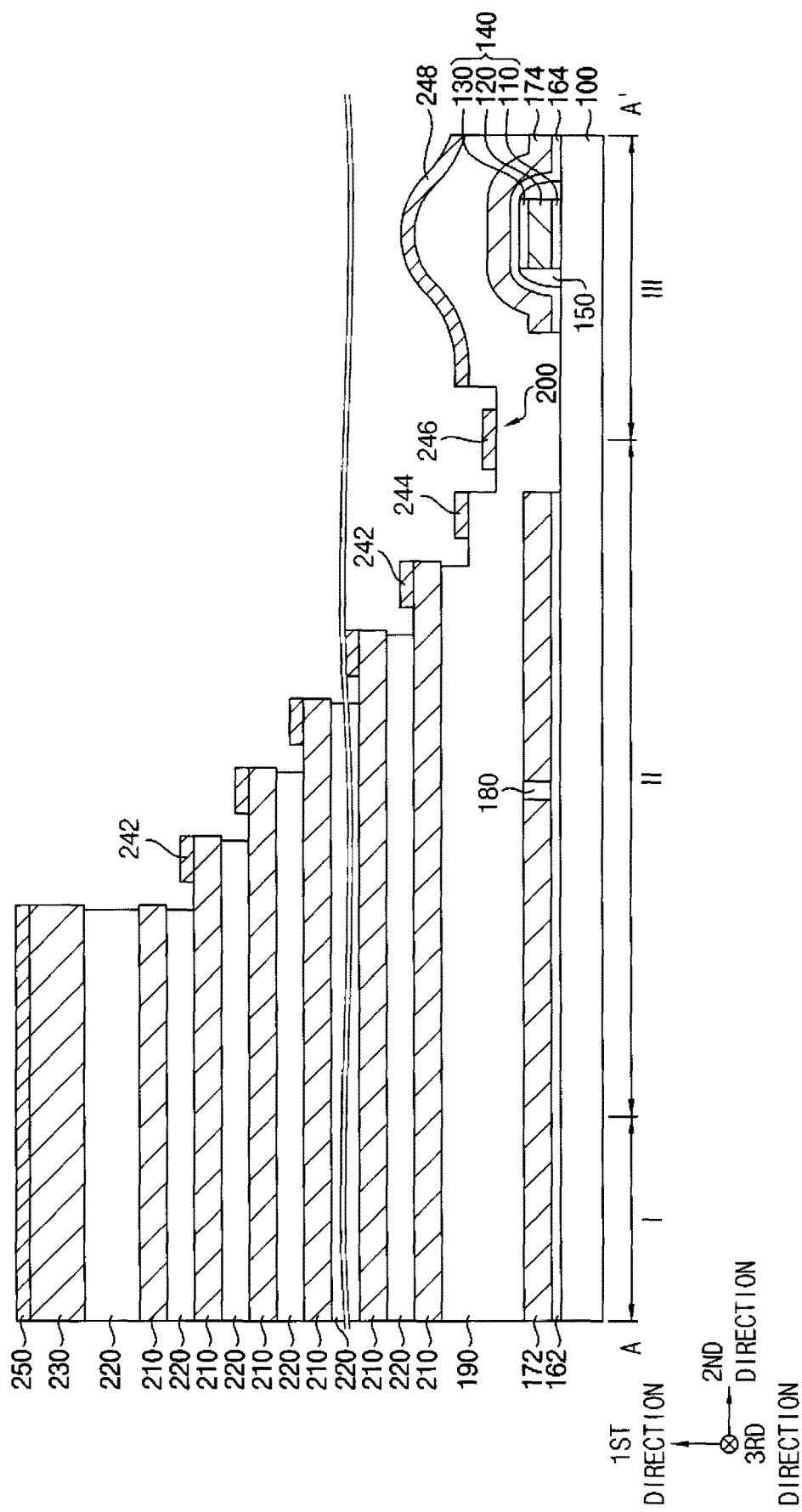

Referring to FIGS. 11 and 12, an insulation pad layer may be formed on the first to third regions I, II and III of the substrate 100 having the mold and the first insulating interlayer 190 thereon, and may be partially removed to form first, second, third, fourth and fifth insulation pads 242, 244, 246, 248 and 250.

In exemplary embodiments of the inventive concept, the insulation pad layer may include a material substantially the same as that of the sacrificial layer 210, however, and an etch rate of the insulation pad layer may be different from that of the sacrificial layer 210. For example, the insulation pad layer may be formed by depositing a nitride, e.g., silicon nitride, and performing an ion implantation process or a plasma treatment process thereon to change an etch rate thereof. Alternatively, a deposition rate and/or process gases may be adjusted during the deposition process, so that the insulation pad layer including substantially the same material as that of the sacrificial layer 210 may have an etch rate different from that of the sacrificial layer 210. In exemplary embodiments of the inventive concept, the etch rate of the insulation pad layer may be greater than that of the sacrificial layer 210.

After forming the insulation pad layer, portions of the insulation pad layer adjacent to sidewalls of steps of the mold and the first insulating interlayer 190 may be removed, so that the first to fifth insulation pads 242, 244, 246, 248 and 250 may be formed to be spaced apart from the sidewalls of the steps of the mold and the first insulating interlayer 190. The first insulation pad 242 may be formed on a portion of the sacrificial layer 210 of each step of the mold, the second insulation pad 244 may be formed on a step of the first insulating interlayer 190 on the end portion of the first sacrificial pattern 172, the third insulation pad 246 may be formed on the recess 200, the fourth, insulation pad 248 may be formed on the third region of the substrate 100, and the fifth insulation pad 250 may be formed on the second etch stop layer 230. In exemplary embodiments of the inventive concept, each of the insulation pads 242, 244, 246, 248 and 250 may have a linear shape extending in the third direction.

Figure 13:
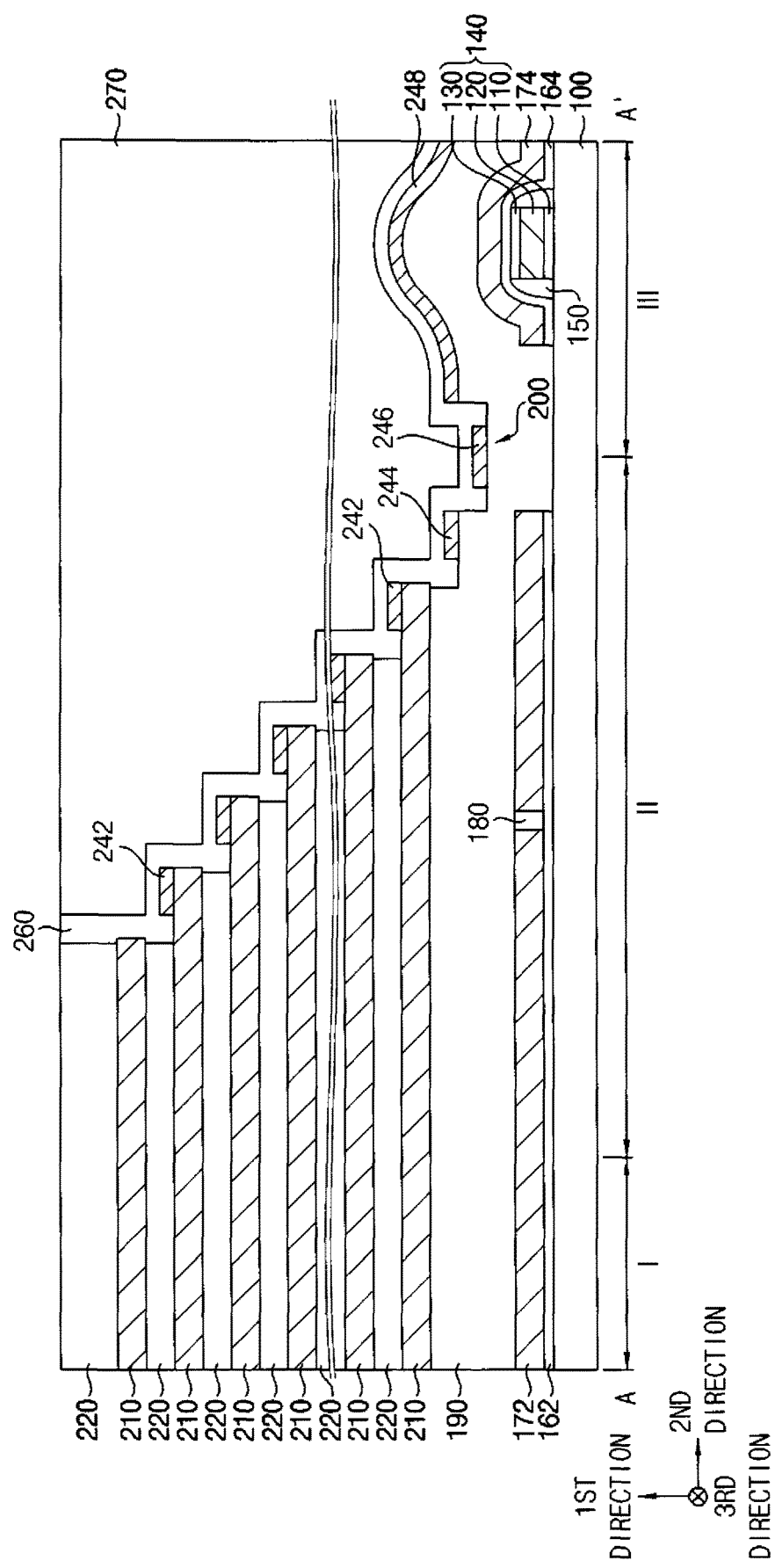

Referring to FIG. 13, a fourth insulation layer 260 may be formed on the first to third regions I, II and III of the substrate 100 having the mold, the second etch stop layer 230, the first insulating interlayer 190 and the insulation pads 242, 244, 246, 248 and 250 thereon, a second insulating interlayer 270 may be formed on the fourth insulation layer 260, and an upper portion of the second insulating interlayer 270 may be planarized until the uppermost, one of the third insulation layers 220 may be exposed. Thus, the second etch stop layer 230 and the fifth insulation pad 250 may be removed.

The fourth insulation layer 260 may be formed by, e.g., an atomic layer deposition (ALD) process.

Figure 14:
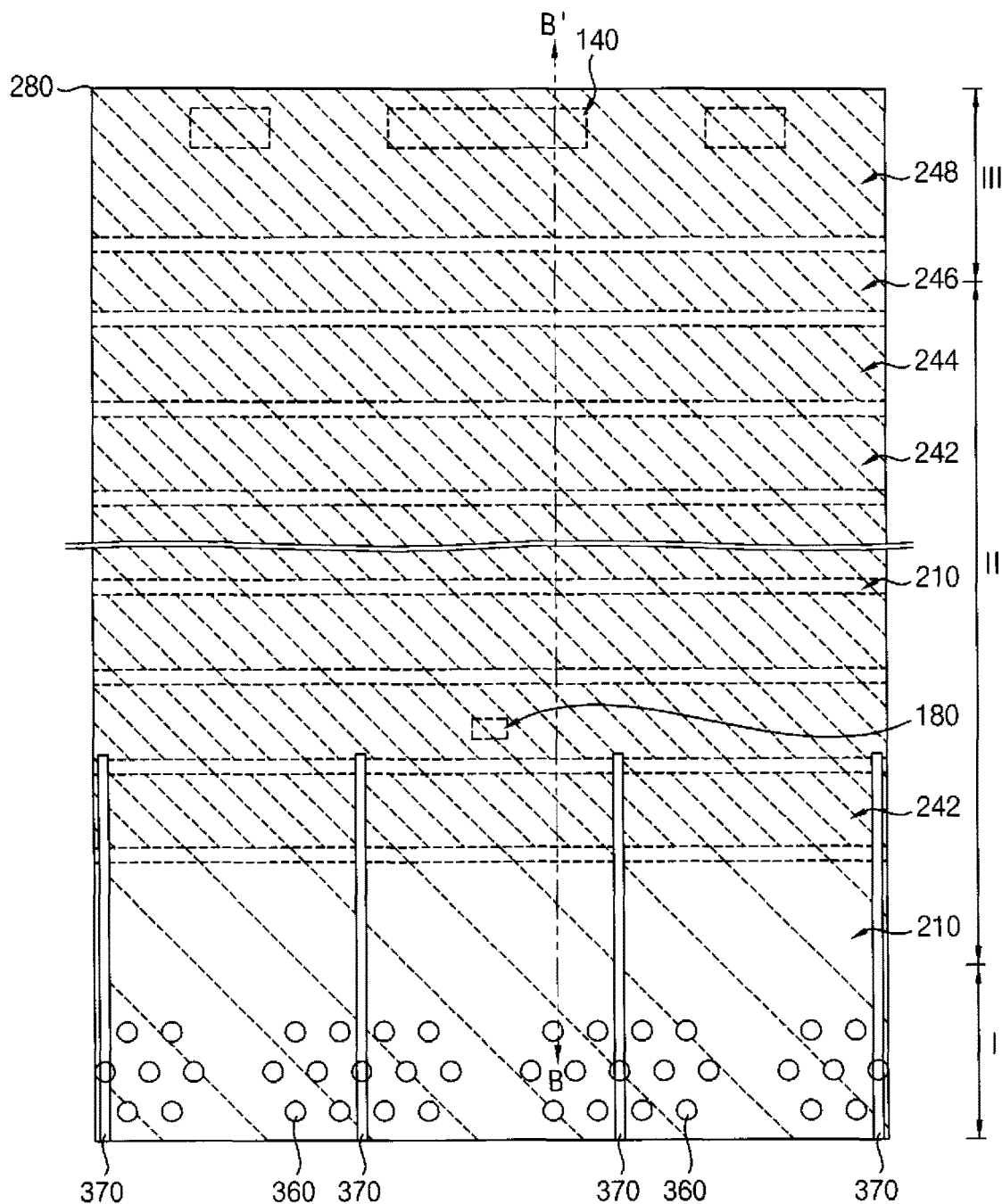

Referring to FIGS. 14 and 15, a third insulating interlayer 280 may be formed on the second insulating interlayer 270, and the third insulating interlayer 280, the third insulation layers 220 and the sacrificial layers 210 may be etched by an etching process to form a channel hole therethrough, which may expose an upper surface of the substrate 100, and a pillar structure filling the channel hole may be formed, as follows.

A selective epitaxial growth (SEG) process may be performed using the upper surface of the substrate 100 exposed by the channel hole as a seed to form a semiconductor pattern 290 partially filling the channel hole. An upper surface of the semiconductor pattern 290 may have a height between heights of upper and lower surfaces, respectively, of the first insulating interlayer 190. In some cases, the formation of the semiconductor pattern 290 may be skipped.

A first blocking layer, a charge storage layer, a tunnel insulation layer and a first spacer layer may be sequentially formed on sidewalls of the channel holes, the upper surface of the semiconductor pattern 290 and an upper surface of the third insulating interlayer 280, the first spacer layer may be anisotropically etched to form a first spacer on each of the sidewalls of the channel holes, and the tunnel insulation layer, the charge storage layer and the first blocking layer may be etched using the first spacer as an etching mask to form a tunnel insulation pattern 320, a charge storage pattern 310 and a first blocking pattern 300, respectively, having a cup-like shape of which a bottom is opened on the upper surface of the semiconductor pattern 200 and each of the sidewalls of the channel holes. An upper portion of the semiconductor pattern 290 may be also partially removed. The tunnel insulation pattern 320, the charge storage pattern 310 and the first blocking pattern 300 may form a charge storage structure 330.

The first spacer layer may include a nitride, e.g, silicon nitride.

After removing the first spacer, a channel layer may be formed on the exposed semiconductor pattern 290, the tunnel insulation pattern 320 and the third insulating interlayer 280, and a filling layer may be formed on the channel layer to fill remaining portions of the channel holes. The filling layer and the channel layer may be planarized until the upper surface of the third insulating interlayer 280 is exposed so that a filling pattern 350 may be formed in each of the channel holes and the channel layer may be transformed into a channel 340.

In exemplary embodiments of the inventive concept, a plurality of channels 340 disposed in the second direction may form a channel column, a plurality of channel columns disposed in the third direction may form a channel group, and a plurality of channel groups disposed in the third direction, e.g., two channel groups, may form a channel block.

An upper portion of a structure including the filling pattern 350, the channel 340 and the charge storage structure 330 may be removed to form a trench, and a capping pattern 360 may be formed in the trench so that the pillar structure may be formed.

A second division pattern 370 may be formed through one of the sacrificial layers 210 and one the third insulation layers 220 on the first region I and a portion of the second region II of the substrate 100.

The second division pattern 370 may be formed by partially etching the third insulating interlayer 280, the one of the third insulation layers 220 and the one of the sacrificial layers 210 to form a second opening therethrough, and filling the second opening with an insulating material.

In exemplary embodiments of the inventive concept, the second division pattern 370 may extend in the second direction at a central portion of one channel group in the third direction. Thus, the second division pattern 370 may extend through upper portions of the channels 340 of a channel column disposed at a central portion in each channel group.

In exemplary embodiments of the inventive concept, the second division pattern 370 may extend not only through the upper portions of the channels 340 but also through one of the sacrificial layers 210 at an upper two levels, respectively, and one of the third insulation layers 220 at the upper two levels, respectively, and further partially through one of the third insulation layers 220 at a level under the upper two levels. The second division pattern 370 may extend in the second direction on the first region I of the substrate 100, and may further extend in the second direction on the second region II of the substrate 100 through upper two step layers of the mold. Thus, each of the sacrificial layers 210 at the upper two levels, respectively, may be divided in the third direction by the second division pattern 370.

Figure 16:
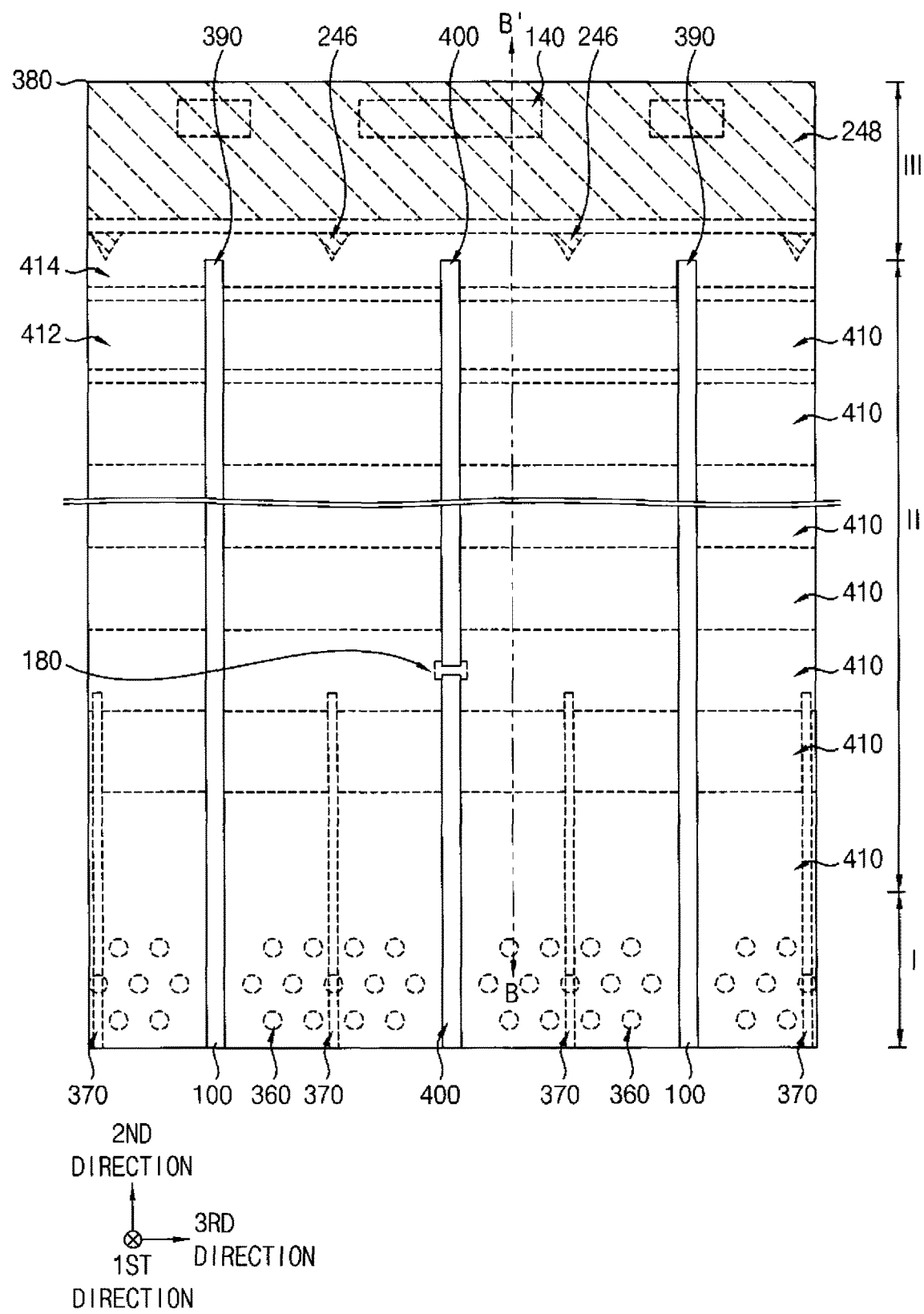

Referring to FIGS. 16 to 18, a fourth insulating interlayer 380 may be formed on the third insulating interlayer 280 and the capping pattern 360, and third and fourth openings 390 and 400 may be formed through the first to fourth insulating interlayers 190, 270, 280 and 380, the third insulation layers 220, the sacrificial layers 210, the first insulation pattern 162 and the first sacrificial pattern 172 to expose the upper surface of the substrate 100.

In exemplary embodiments of the inventive concept, each of the third and fourth openings 390 and 400 may extend in the second direction between neighboring ones of the channel groups on the first and second regions I and II of the substrate 100, and the third and fourth openings 390 and 400 may be alternately and repeatedly formed in the third direction. In other words, one channel group may be formed between the third and fourth openings 390 and 400, and two channel groups at opposite sides, respectively, of the fourth opening 400 may form one channel block. The second division pattern 370 may be disposed between the third and fourth openings 390 and 400 in the first region I and part of the second region II.

As the third and fourth openings 390 and 400 are formed, the sacrificial layer 210 may be divided into second sacrificial patterns each of which may extend in the second direction, and the third insulation layer 220 may be divided into third insulation patterns 225 each of which may extend in the second direction.

In exemplary embodiments of the inventive concept, the third opening 390 may continuously extend in the second direction on the first and second regions I and II of the substrate 100, while the fourth opening 400 may be partially cut on the second region II of the substrate 100. Thus, the second sacrificial patterns at opposite sides of the fourth opening 400, respectively, each of which may extend in the second direction may be partially connected with each other on the second region II of the substrate 100. In exemplary embodiments of the inventive concept, the cut portion of the fourth opening 400, in other words, a connecting portion for connecting the second sacrificial patterns with each other may overlap the first division pattern 180 in the first direction. In other words, the first division pattern 180 may be disposed between ends of the fourth opening 400 at the cut portion of the fourth opening 400.

The second sacrificial patterns exposed by the third and fourth openings 390 and 400 may be removed by, e.g., a wet etching process, to form a first gap 410 between the third insulation patterns 225 at respective levels and between the first insulation pattern 162 and the first insulting interlayer 190, and the first insulation pad 242 at an end portion of each of the second sacrificial patterns may be also removed. A portion of a sidewall of the second division pattern 370, a portion of an outer sidewall of the first blocking pattern 300, and a portion of a sidewall of the semiconductor pattern 290 may be exposed by the first gaps 410.

The second and third insulation pads 244 and 246 may be also removed to form second and third gaps 412 and 414, respectively. In exemplary embodiments of the inventive concept, the second gap 412 may have a linear shape extending in the third direction, and the third gap 414 may be spaced apart from the second gap 412 in the second direction and extend in the third direction. A portion of the third gap 414 may have a width in the second direction less than that of other portions thereof. For example, a portion of the third insulation pad 246 located farthest from an end of the lowermost gate electrode 432 in the second direction may not be removed and thus remain when the third insulation pad 246 is removed by the wet etching process having an isotropic etching characteristic.

Figure 19:
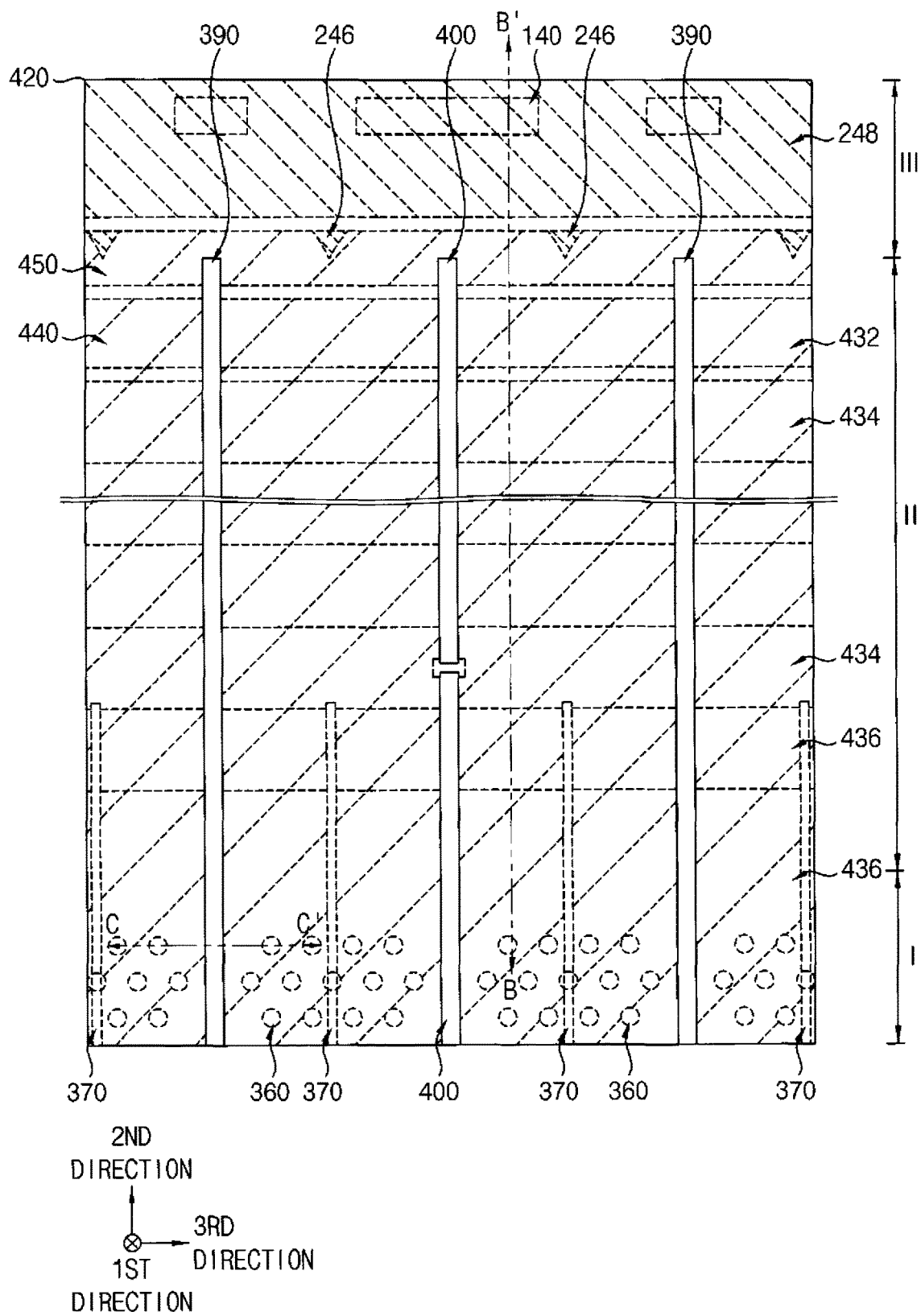

Referring to FIGS. 19 to 21, a second blocking layer 420 may be formed on the exposed sidewall of the second division pattern 370, the outer sidewall of the first blocking pattern 300, the sidewall of the semiconductor pattern 290, inner walls of the first to third gaps 410, 412 and 414, surfaces of the third insulation patterns 225, the upper surface of the substrate 100 and an upper surface of the fourth insulating interlayer 380, and a gate conductive layer may be formed to fill the first to third gaps 410, 412 and 414 on the second blocking layer 420. A gate barrier layer may be further formed between the second blocking layer 420 and the gate conductive layer.

The gate conductive layer may be partially removed to form a gate conductive pattern in the first gap 410, and if the gate barrier layer has been formed, the gate barrier layer may be also partially removed to form a gate barrier pattern. The gate conductive pattern and the gate barrier pattern may form a gate electrode. First and second conductive structures 440 and 450 may be formed in the second and third gaps 412 and 414, respectively. The first and second conductive structures 440 and 450 may extend lengthwise in the second direction.

In exemplary embodiments of the inventive concept, the gate electrode may extend in the second direction, and a plurality of gate electrodes may be formed to be spaced apart from each other in the first direction. Additionally, a plurality of gate electrodes may be formed to be spaced apart from each other in the third direction. In other words, the plurality of gate electrodes may be spaced apart from each other in the third direction by the third opening 390. Additionally, the plurality of gate electrodes may be spaced apart from each other in the third direction by the fourth opening 400; however, neighboring ones of the plurality of gate electrodes in the third direction at opposite sides of the fourth opening 400 may be connected with each other by a connecting portion overlapping the first division pattern 180 on the second region II of the substrate 100. An upper two gate electrodes among the gate electrodes extending in the second direction on the second region II of the substrate 100 may be additionally divided in the third direction by the second division pattern 370.

The gate electrode may include first, second and third gate electrodes 432, 434 and 436 sequentially stacked in the first direction. In exemplary embodiments of the inventive concept, the first gate electrode 432 may be formed at a lowermost level, the third gate electrode 436 may be formed at an upper two levels, and the second gate electrode 434 may be formed at a plurality of levels between the first and third gate electrodes 432 and 436.

The gate electrodes may be formed by replacing the second sacrificial patterns stacked having a staircase shape, and thus, may be also stacked to form a staircase structure. An end portion of each of the gate electrodes except for the first gate electrode 432 and an uppermost one of the third gate electrodes 436 may be formed by replacing both of the second sacrificial pattern and the first insulation pad 242, and thus, may have an upper surface higher than that of other portions of the gate electrodes and a thickness greater than that of other portions of the gate electrodes. Hereinafter, the end portion of each of the gate electrodes having a thickness greater than that of other portions of the gate electrodes may be referred to as a conductive pad.

In exemplary embodiments of the inventive concept, the first and second conductive structures 440 and 450 may be formed at different heights and be spaced apart from each other in the second direction. In this case, the first and second conductive structures 440 and 450 are electrically insulated from each other.

Referring to FIG. 22, impurities nay be implanted into an upper portion of the substrate 100 exposed by each of the third and fourth openings 390 and 400 to form a first impurity region 105.

A second spacer layer may be formed on the upper surfaces of the substrate 100 exposed by the third and fourth openings 390 and 400, sidewalls of the third and fourth openings 390 and 400, and an upper surface of the fourth insulating interlayer 380, and may be anisotropically etched to form a second spacer 460 on the sidewall of each of the third and fourth openings 390 and 400.

First and second common source lines (CSLs) 470 and 475 (refer to FIG. 2) may be formed on the first impurity region 105 to fill the third and fourth openings 390 and 400, respectively. A portion of the second blocking layer 420 on the upper surface of the fourth insulating interlayer 380 may be removed, and each of the first and second CSLs 470 and 475 may contact an upper surface of the first impurity region 105.

Referring to FIGS. 1 to 5 again, a fifth insulating interlayer 480 may be formed on the fourth insulating interlayer 380, the first and second CSLs 470 and 475, the second spacer 460, and the second blocking layer 420, and first to third contact plugs 492, 494 and 496 may be formed through the first to fifth insulating interlayers 190, 270, 280, 380 and 480, the third insulation patterns 225, the fourth insulation layer 260 and the second blocking layer 420 on the second region a of the substrate 100 to contact upper suffices of the first to third gate electrodes 432, 434 and 436, respectively. In addition, a fourth contact plug 500 may be formed through the first to fifth insulating interlayers 190, 270, 280, 380 and 480, the fourth insulation layer 260, the fourth insulation pad 248, the first etch stop pattern 174, the second insulation pattern 164 and the first gate mask 130 on the third region III of the substrate 100 to contact the first gate electrode pattern 120.

The second contact plug 494 may contact a conductive pad of each of the second gate electrodes 434, and the third contact plug 496 may contact a conductive pad of each of the third gate electrodes 436 except for the uppermost one. In exemplary embodiments of the inventive concept, the first contact plug 492 may extend through the first conductive structure 440 to contact the first gate electrode 432. The first and second conductive structures 440 and 450 may be electrically insulated from each other, and thus the first contact plugs 492 at opposite sides of the first and second CSLs 470 and 475 may not be electrical short with each other through the first and second conductive structures 440 and 450.

By the above processes, the vertical memory device may be fabricated. As illustrated above, the second to fourth insulation pads 244, 246 and 248 may not be removed so that cost and time for the removal thereof may not be generated. Additionally, even though the second and third insulation pads 244 and 246 are replaced with the first and second conductive structures 440 and 450, the first and second conductive structures 440 and 450 may be electrically insulated from each other so that the divided CSLs 470 and 475 may not be electrically short with each other due to the first contact plug 492.

Figure 23:
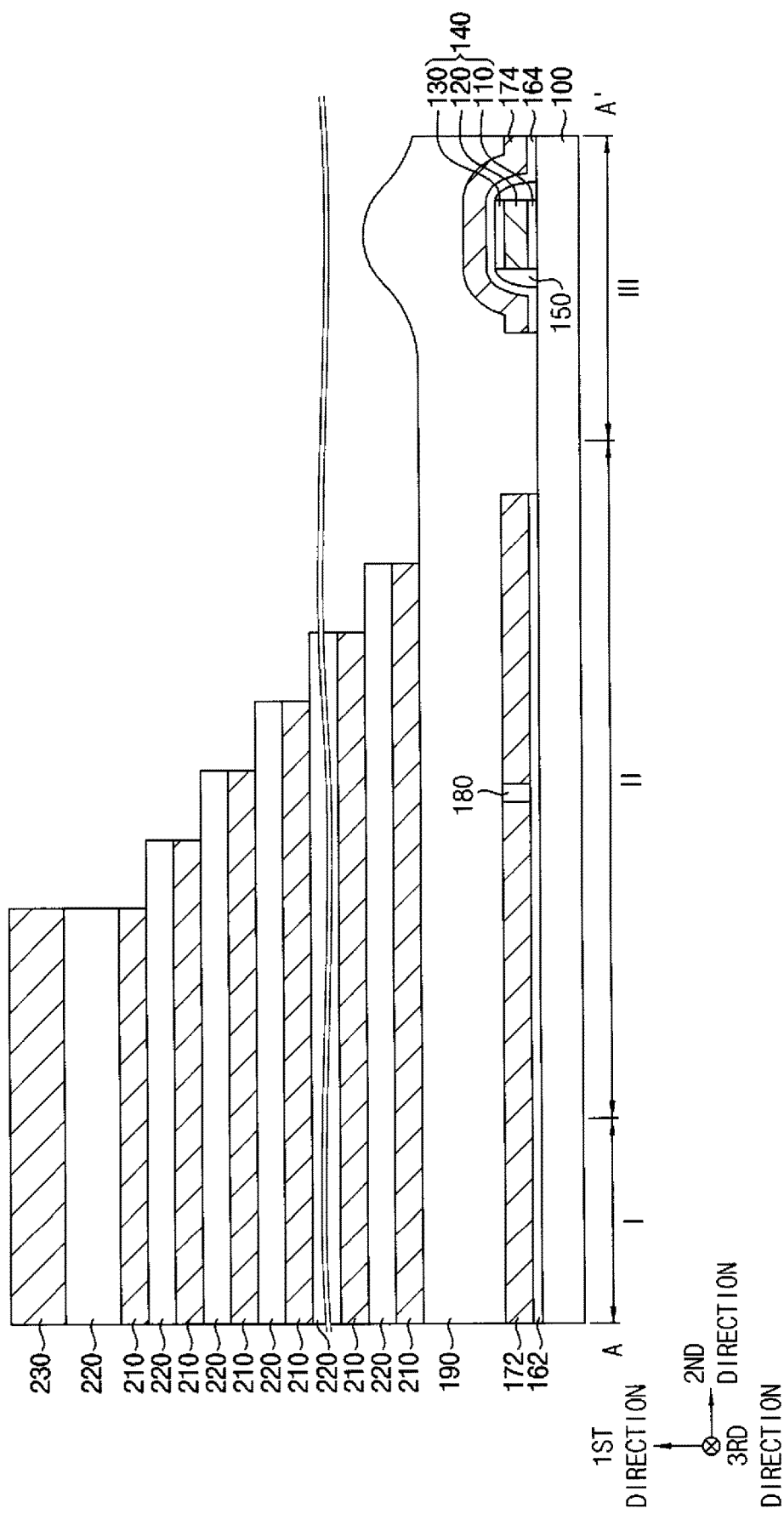
FIGS. 23, 24, 25, 26, 27 and 28 are plan views and cross-sectional views illustrating a method of manufacturing a vertical memory device in accordance with comparative examples.
Figure 24:
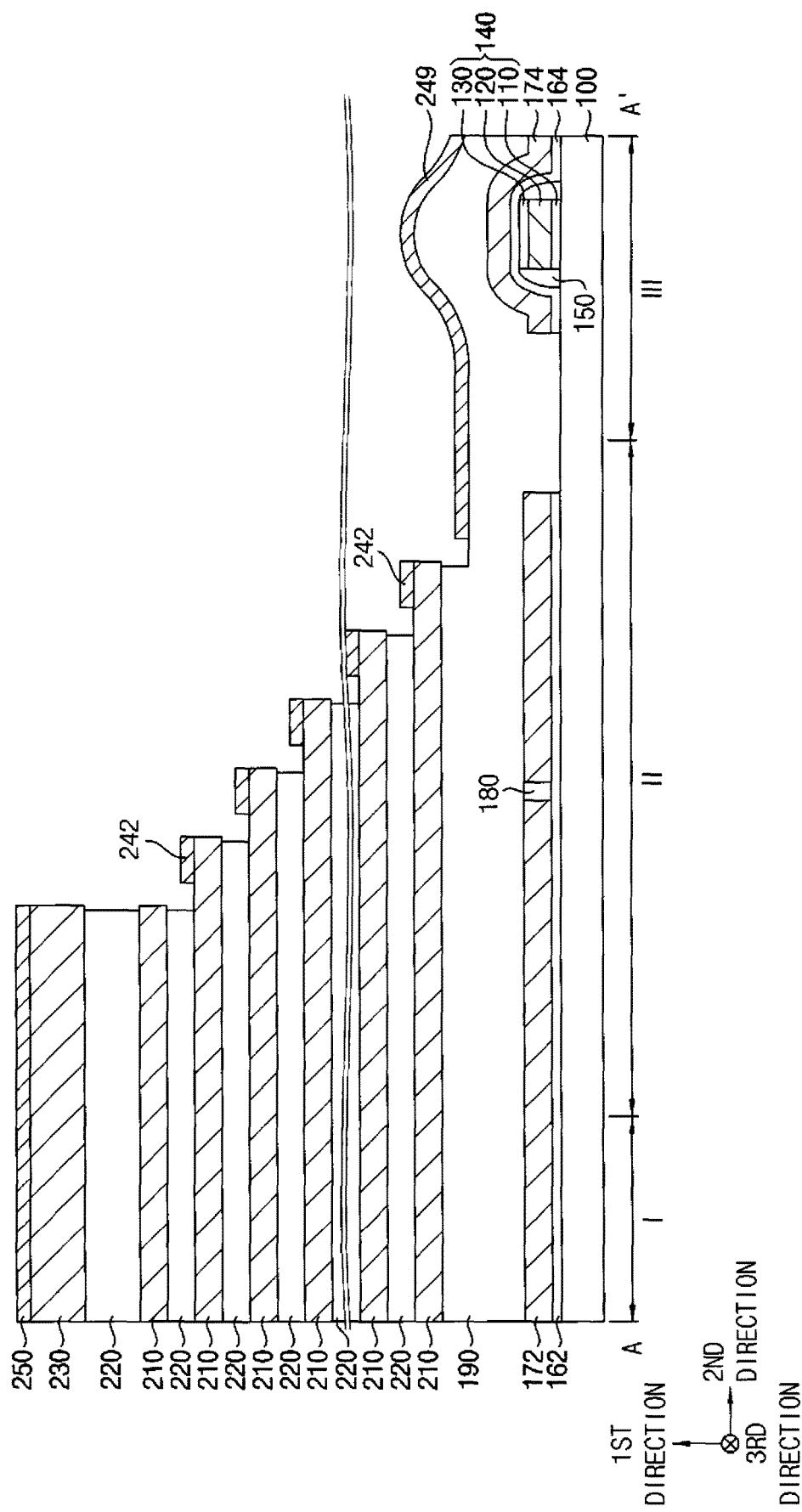
Figure 25:
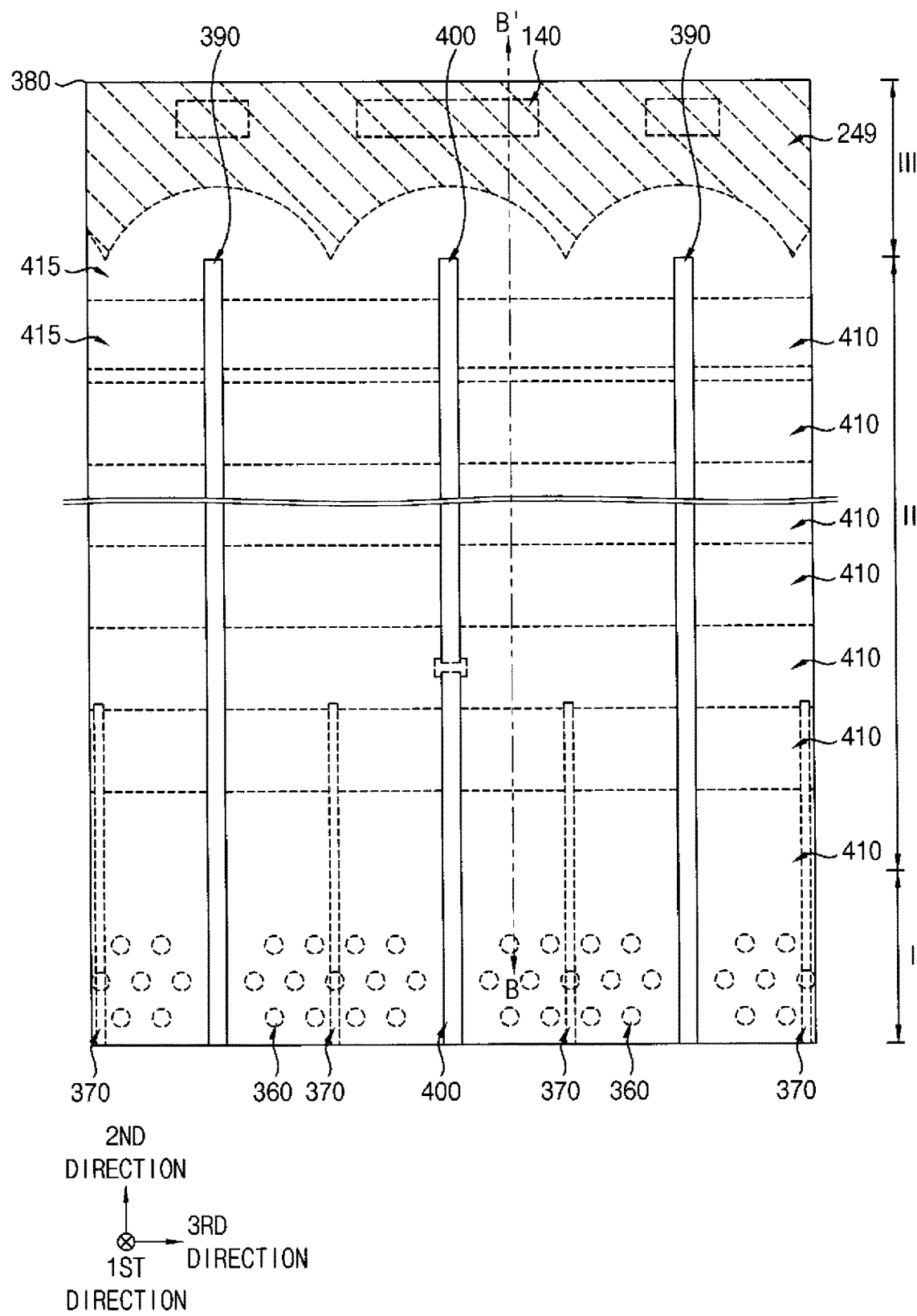
Figure 26:
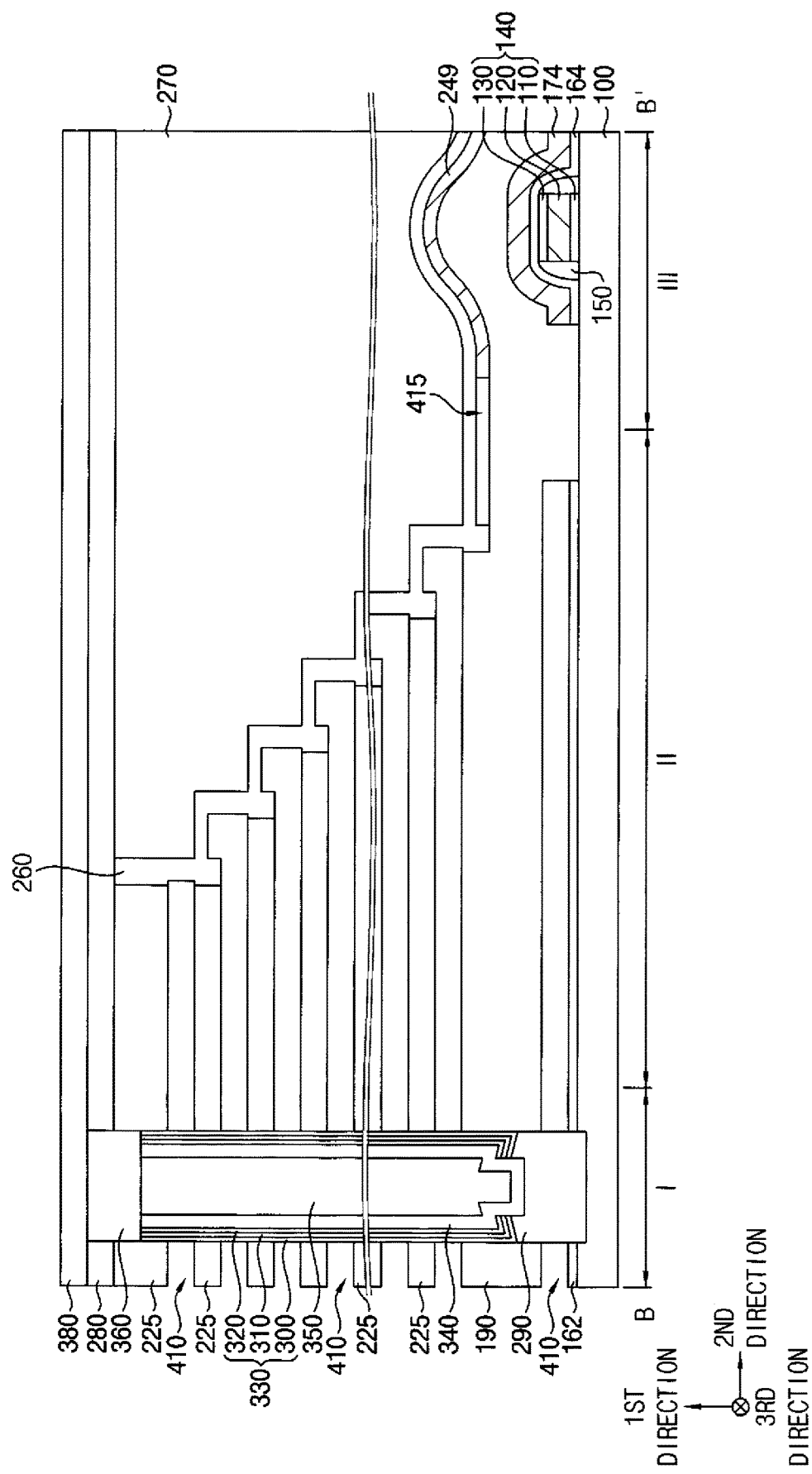
Figure 27:
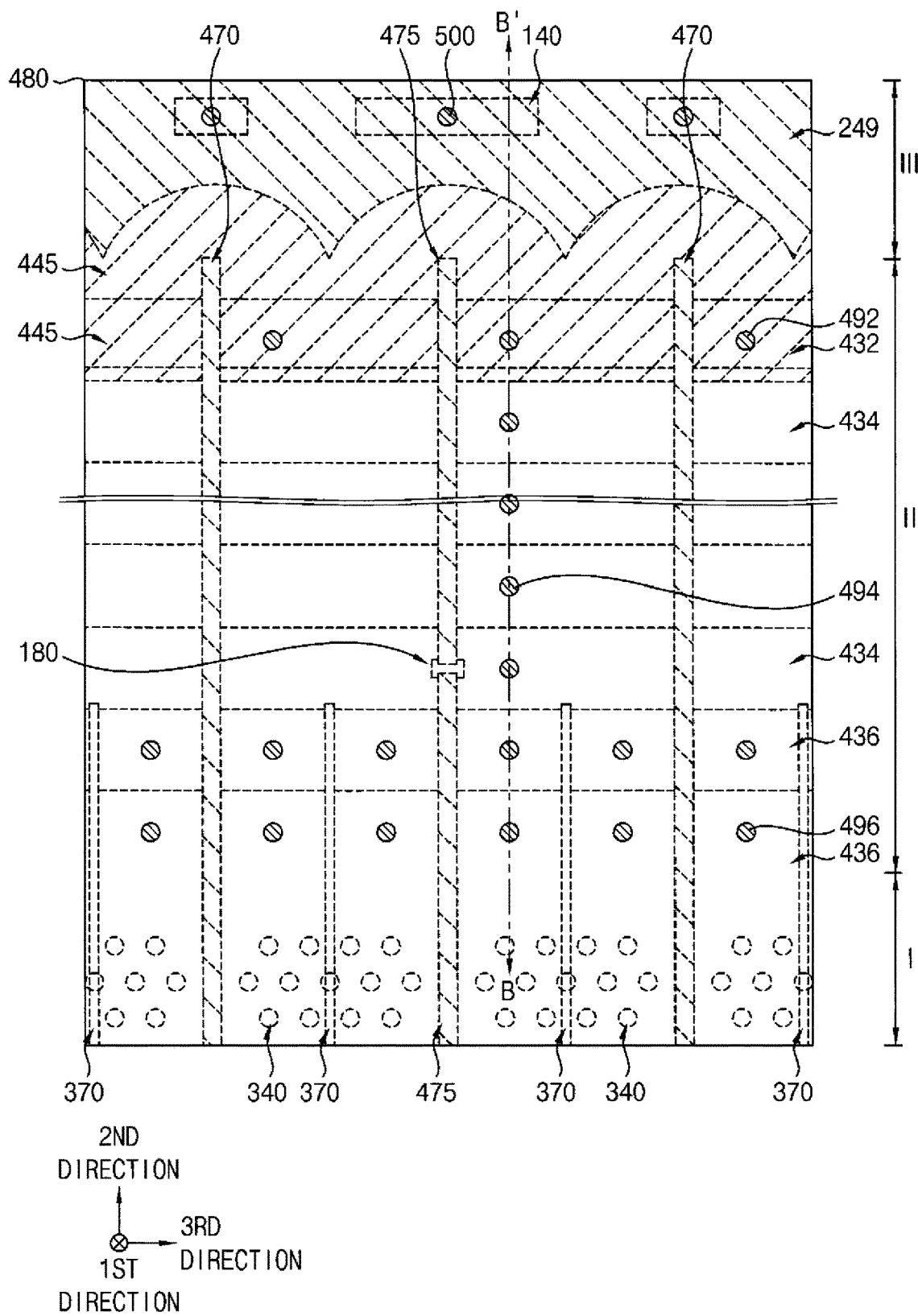
Figure 28:
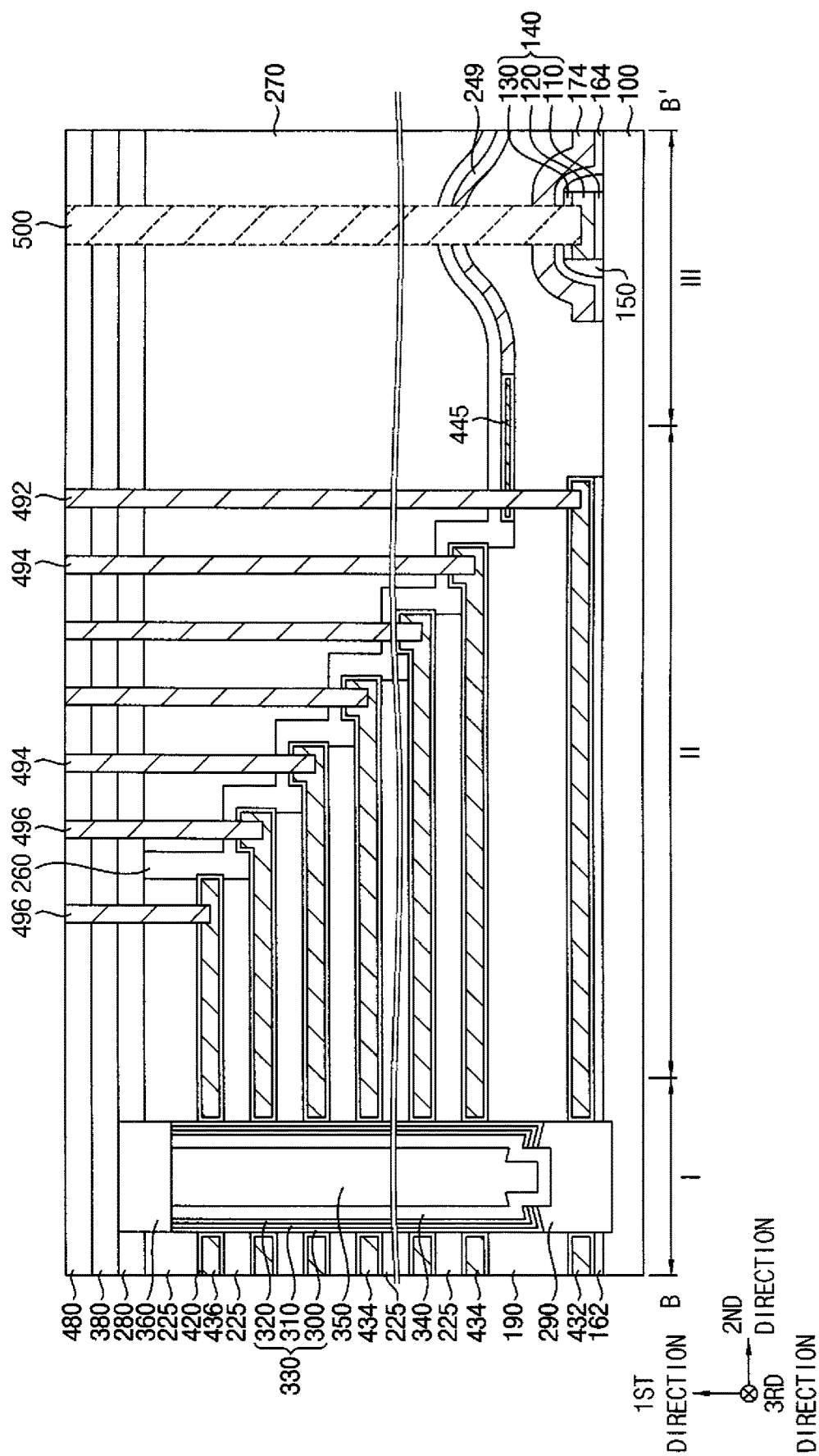

FIGS. 21 to 28 are plan views and cross-sectional views illustrating a method of manufacturing a vertical memory device in accordance with comparative examples. Particularly, FIGS. 25 and 27 are the plan views, FIGS. 23 and 24 are cross-sectional views taken along lines A-A' of corresponding plan views, respectively, and FIGS. 26 and 28 are cross-sectional views taken along lines B-B' of corresponding plan views, respectively. This method may include processes substantially the same as or similar to those illustrated with reference to FIGS. 6 to 22 and FIGS. 1 to 5, and thus repetitive explanations thereon are omitted herein.

Referring to FIG. 23, processes substantially the same as or similar to those illustrated with reference to FIGS. 6 to 9 may be performed. However, the recess 200 may not be formed on the first insulating interlayer 190.

Referring to FIG. 24, processes substantially the same as or similar to those illustrated with reference to FIGS. 10 to 12 may be performed. However, the second to fourth insulation pads 244, 246 and 248 are not divided but connected with each other so that a sixth insulation pad 249 may be formed on the second and third regions II and III of the substrate 100.

Referring to FIGS. 25 and 26, processes substantially the same as or similar to those illustrated with reference to FIGS. 13 to 17 may be performed. However, the second and third gaps 412 and 414, which may be formed at different heights to be separate from each other, may not be formed, but only a fourth gap 415 may be formed at a given height.

Referring to FIGS. 27 and 28, processes substantially the same as or similar to those illustrated with reference to FIGS. 18 to 22 and FIGS. 1 to 5 may be performed. However, the first and second conductive structures 440 and 450, which may be formed at different heights to be separate from each other, may not be formed, but a third conductive structure 445 may be formed at a given height.

Thus, the first contact plugs 492 extending through the third conductive structure 445 at opposite sides of the first CSL 470 or the second CSL 475 to contact the first gate electrodes 432 that are divided from each other may be electrical short because the first contact plugs 492 commonly contact the third conductive structure 445.

However, in the vertical memory device of FIGS. 1 to 5, the first and second conductive structures 440 and 450 may be divided from each other, and the first conductive structure 440 through which the first contact plugs 492 extend may be divided at opposite sides of the first CSL 470 or the second CSL 475, so that no electrical short may occur.

Figure 29:
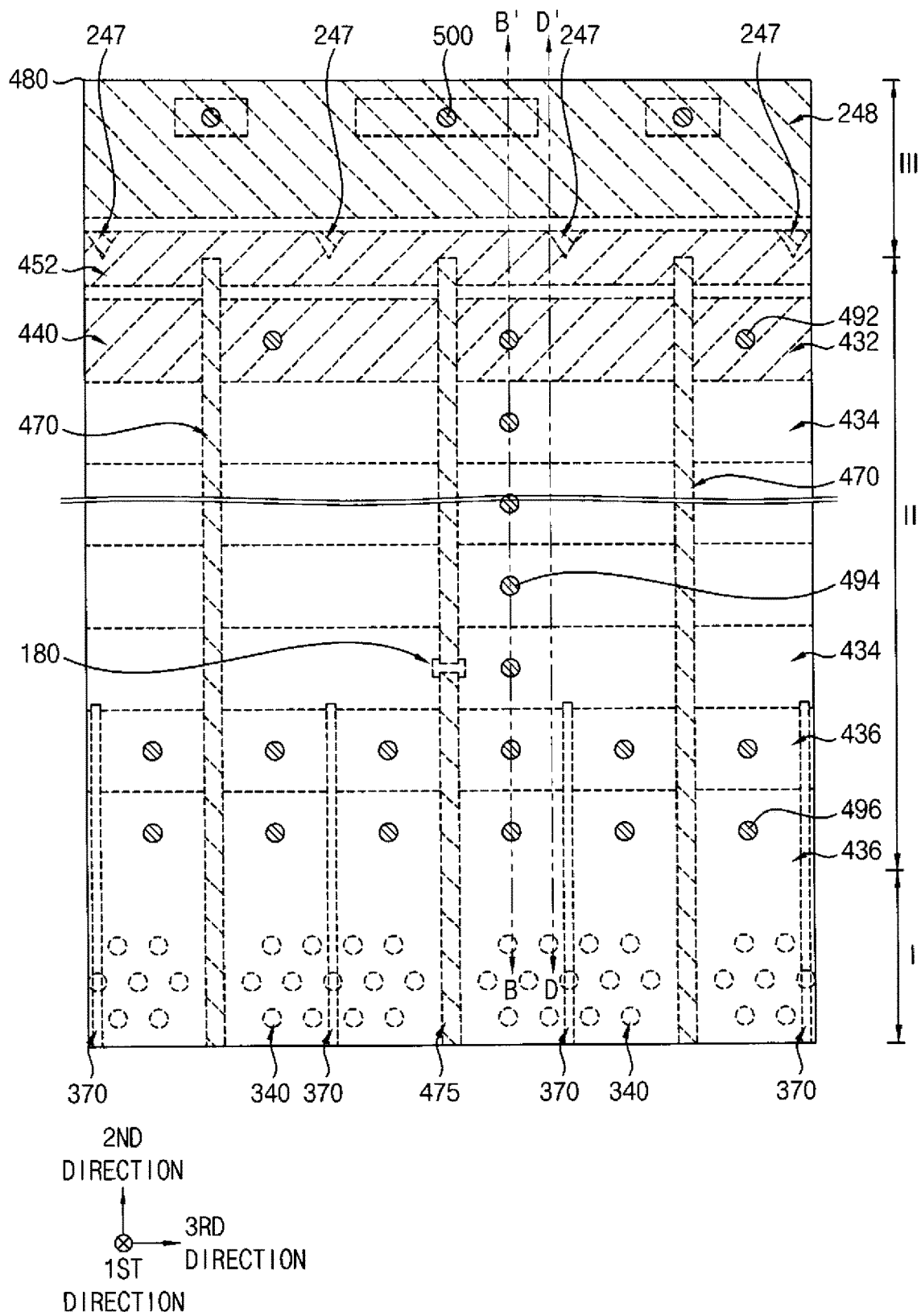
FIGS. 29, 30 and 31 are a plan view and cross-sectional views illustrating a vertical memory device in accordance with exemplary embodiments of the inventive concept.
Figure 30:
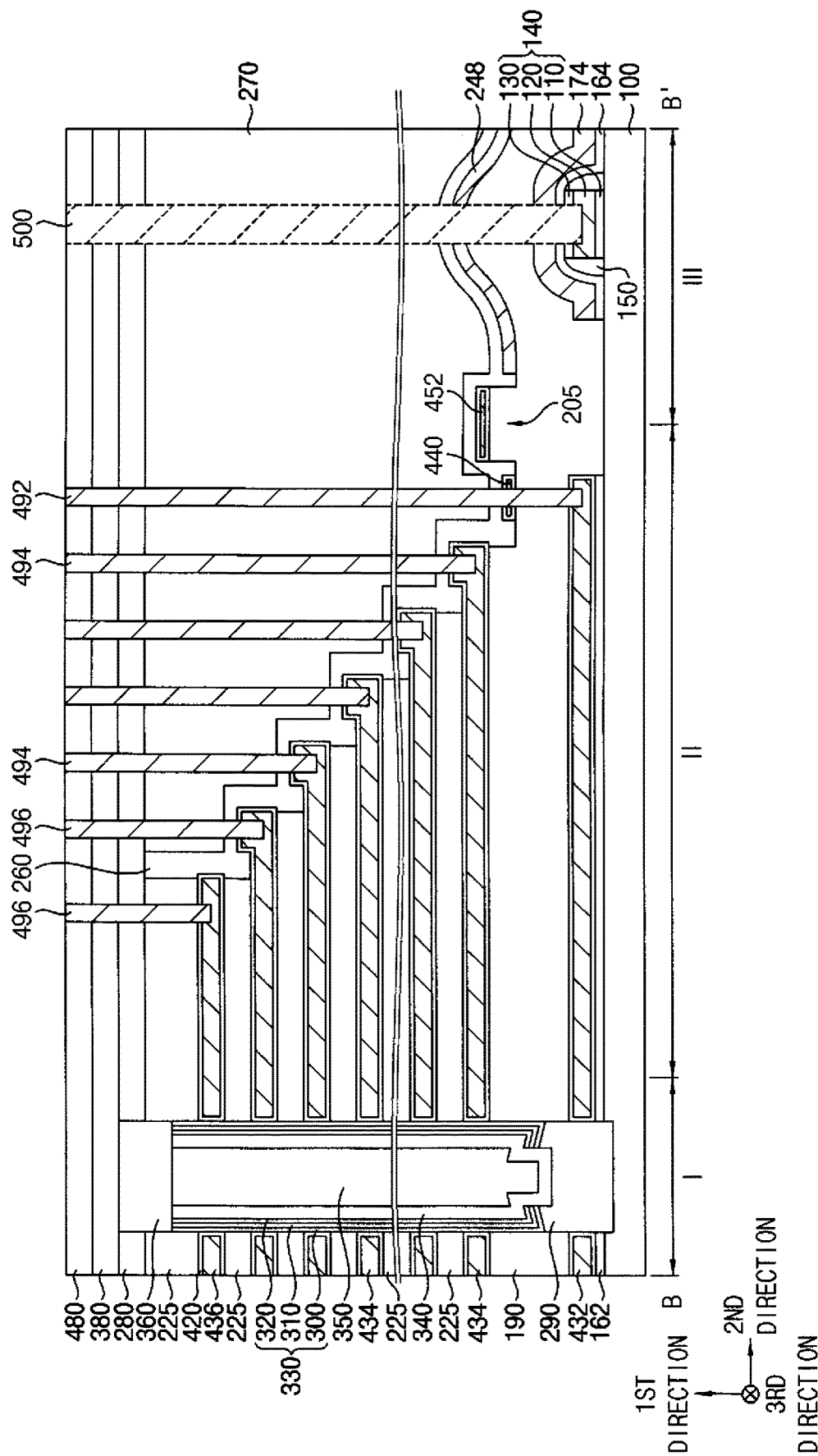
Figure 31:
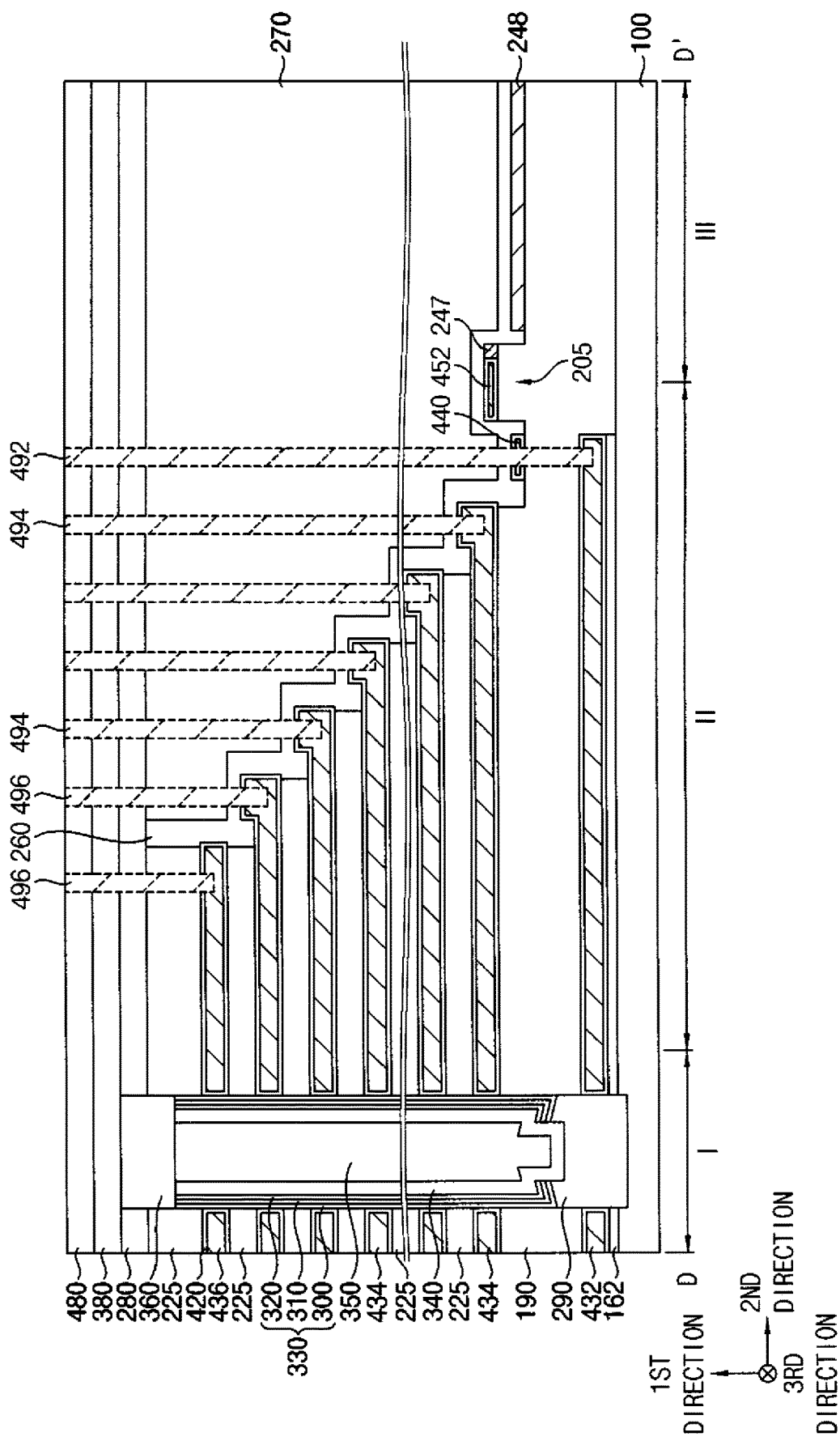

FIGS. 29 to 31 are a plan view and cross-sectional views illustrating a vertical memory device in accordance with exemplary embodiments of the inventive concept. Particularly, FIG. 29 is the plan view, FIG. 30 is a cross-sectional view taken along a line B-B' of FIG. 29, and FIG. 31 is a cross-sectional view taken along a line D-D' of FIG. 29. This vertical memory device may be substantially the same as or similar to that illustrated with reference to FIGS. 1 to 5 except for some elements, and thus repetitive explanations on the same or similar elements are omitted herein.

Referring to FIGS. 29 to 31, a protrusion 205 may be formed on an upper surface of the first insulating interlayer 190 at a boundary between the second and third regions II and III of the substrate 100, and a fourth conductive structure 452 having a linear shape extending in the third direction may be formed on the protrusion 205 to be spaced apart from the first conductive structure 440 in the second direction. However, a portion of the fourth conductive structure 452 may have a width in the second direction smaller than that of other portions thereof, and may contact a seventh insulation pad 247 on the protrusion 205.

In exemplary embodiments of the inventive concept, the first contact plug 492 may extend through the first conductive structure 440 to contact the first gate electrode 432. The first and fourth conductive structures 440 and 452 may be formed at different heights and spaced apart from each other to be electrically insulated from each other, and thus the first contact plugs 492 at opposite sides of the first and second CSLs 470 and 475 in the third direction may not be electrically short through the first and fourth conductive structures 440 and 452.

Figure 32:
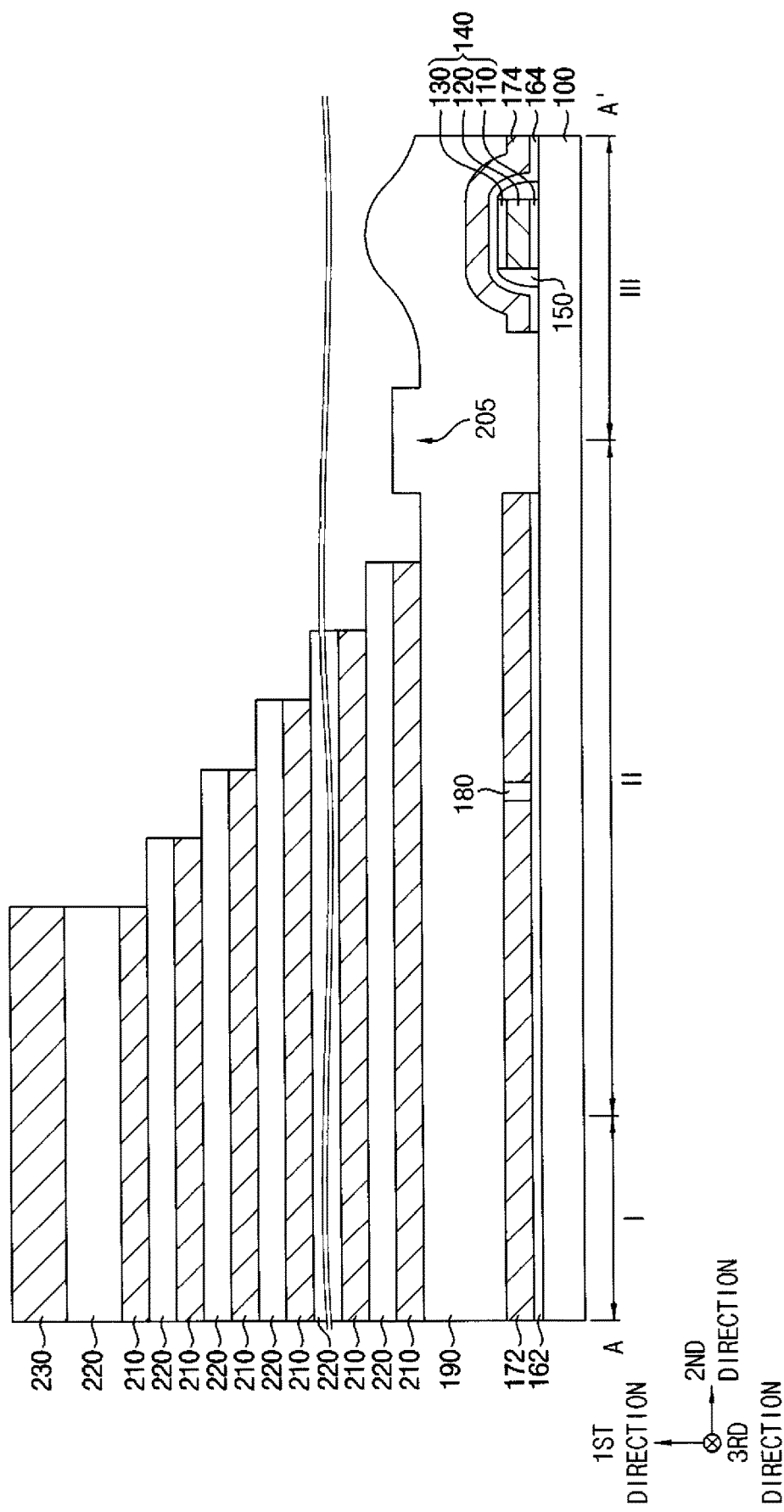
FIGS. 32, 33, 34 and 35 are a plan view and cross-sectional views illustrating a method of manufacturing a vertical memory device in accordance with exemplary embodiments of the inventive concept.
Figure 33:
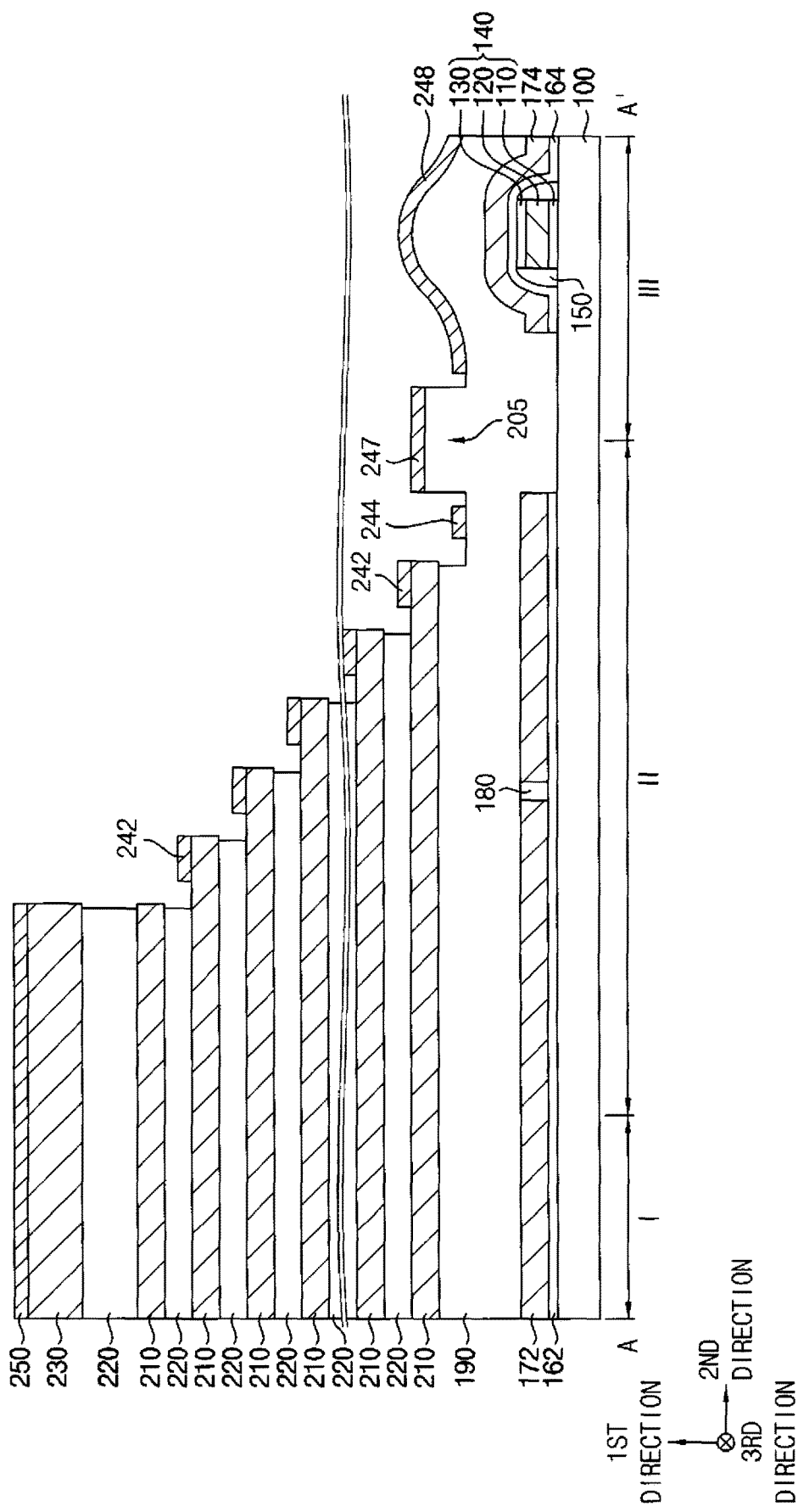
Figure 34:
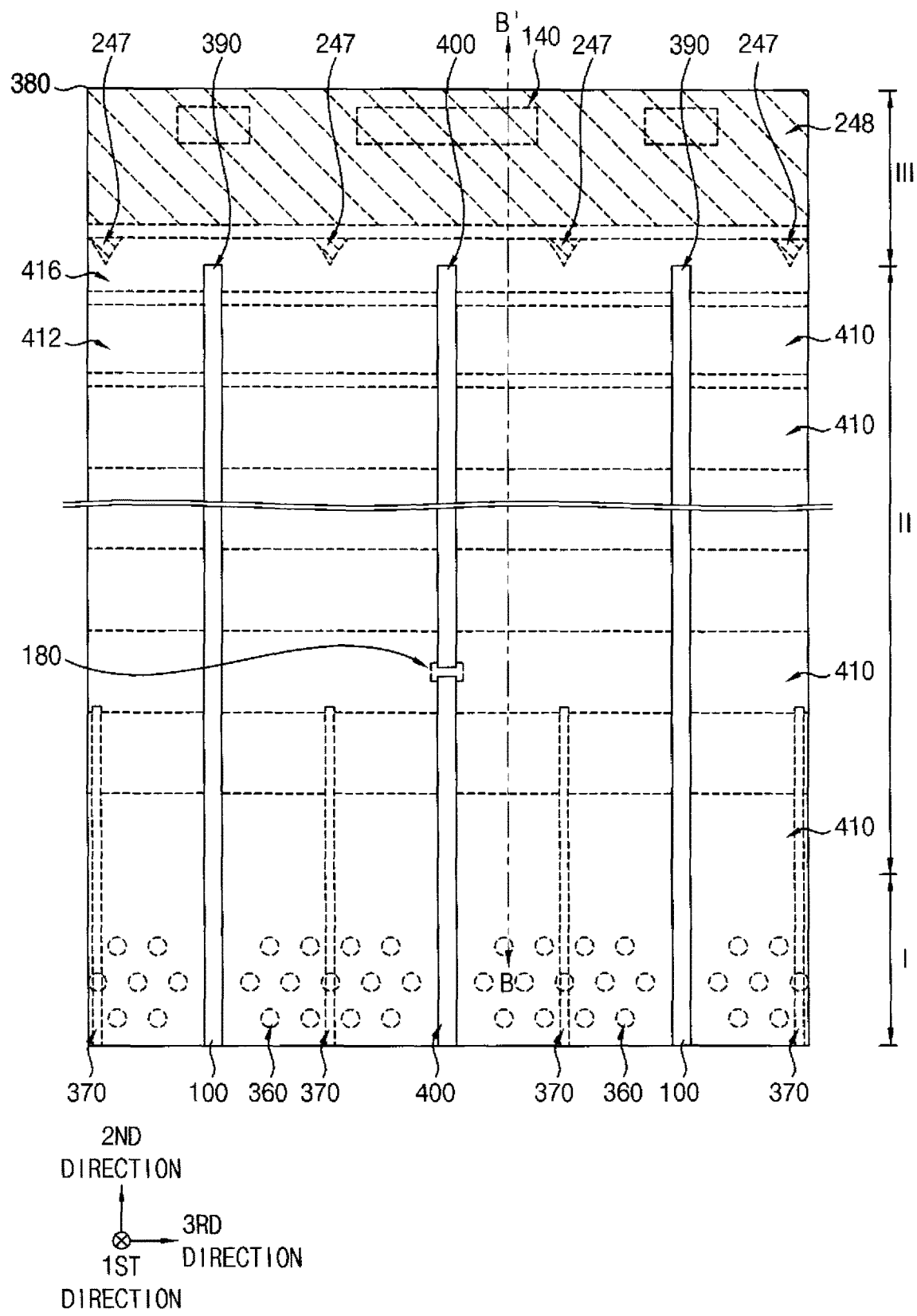
Figure 35:
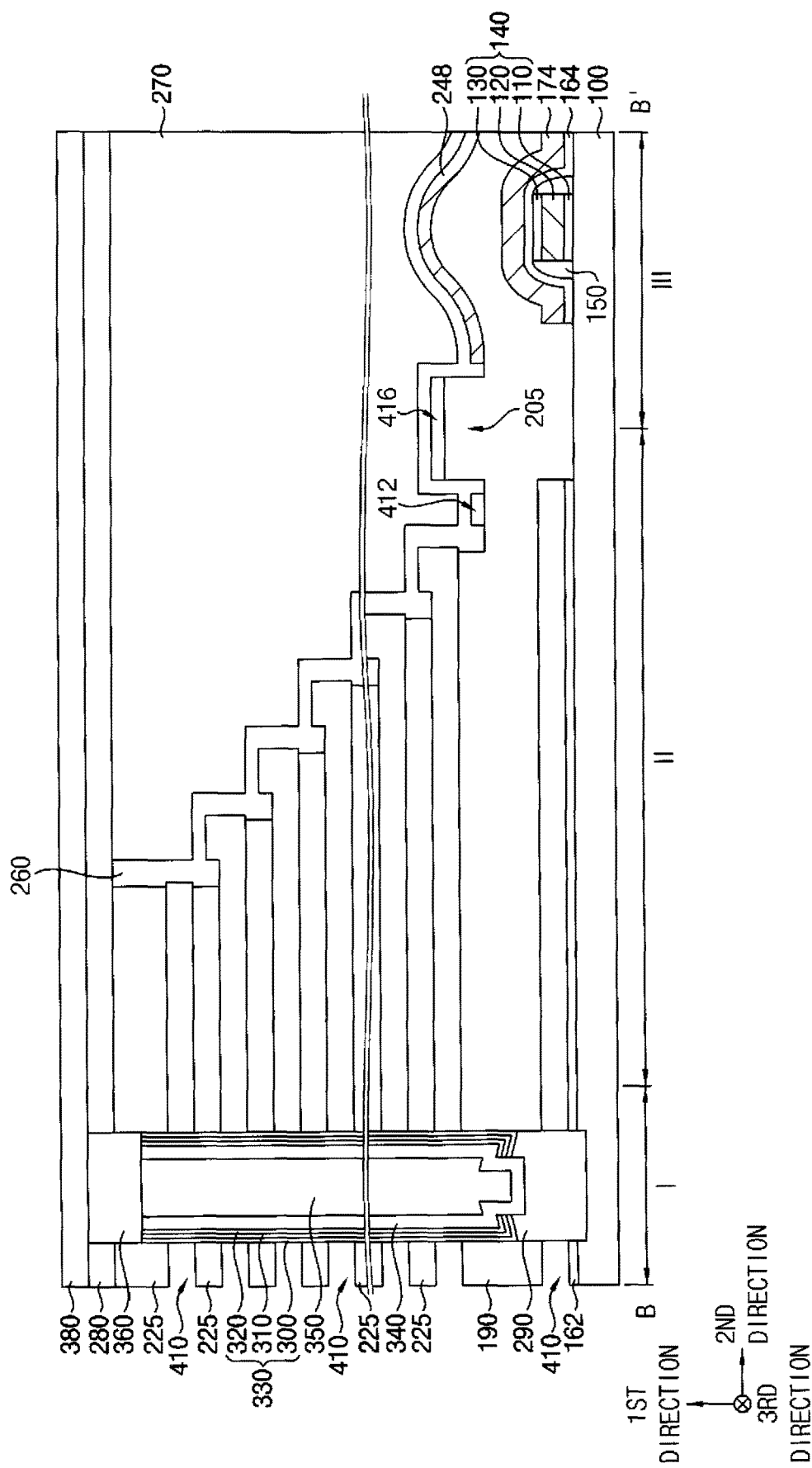

FIGS. 32 to 35 are a plan view and cross-sectional views illustrating a method of manufacturing a vertical memory device in accordance with exemplary embodiments of the inventive concept. Particularly, FIG. 34 is the plan view, FIGS. 32 and 33 are cross-sectional views taken along lines A-A' of corresponding plan views, respectively, and FIG. 35 is a cross-sectional view taken along a line B-B' of a corresponding plan view. This method may include processes substantially the same as or similar to those illustrated with reference to FIGS. 6 to 22 and FIGS. 11 to 5, and thus repetitive explanations thereon are omitted herein.

Referring to FIG. 32, processes substantially the same as or similar to FIGS. 6 to 9 may be performed. However, a protrusion 205 instead of the recess 200 may be formed at the boundary between the second and third regions II and III of the substrate 100. The protrusion 205 may extend lengthwise in the third direction.

Referring to FIG. 33, processes substantially the same as or similar to FIGS. 10 to 12 may be performed. However, a seventh insulation pad 247 instead of the third insulation pad 246 on the recess 200 may be formed on the protrusion 205. The seventh insulation pad 247 may be formed at a height different from, e.g., higher than that of the second insulation pad 244, and may be spaced apart from the second insulation pad 244 in the second direction.

Referring to FIGS. 34 and 35, processes substantially the same as or similar to FIGS. 13 to 18 may be performed. However, a fifth gap 416 instead of the third gap 414 on the recess 200 may be formed on the protrusion 205. The fifth gap 416 may be spaced apart from the second gap 412 in the second direction, and may extend in the third direction. A portion of the fifth gap 416 may have a width in the second direction less than that of other portions thereof, and the seventh insulation pad 247 may remain adjacent to the portion of the fifth gap 412.

Referring to FIGS. 29 to 31, processes substantially the same as or similar to FIGS. 19 to 22 and FIGS. 1 to 5 may be performed. However, a fourth conductive structure 452 instead of the second conductive structure 450 filling the second gap 412 may be formed to fill the fifth gap 416.

Figure 36:
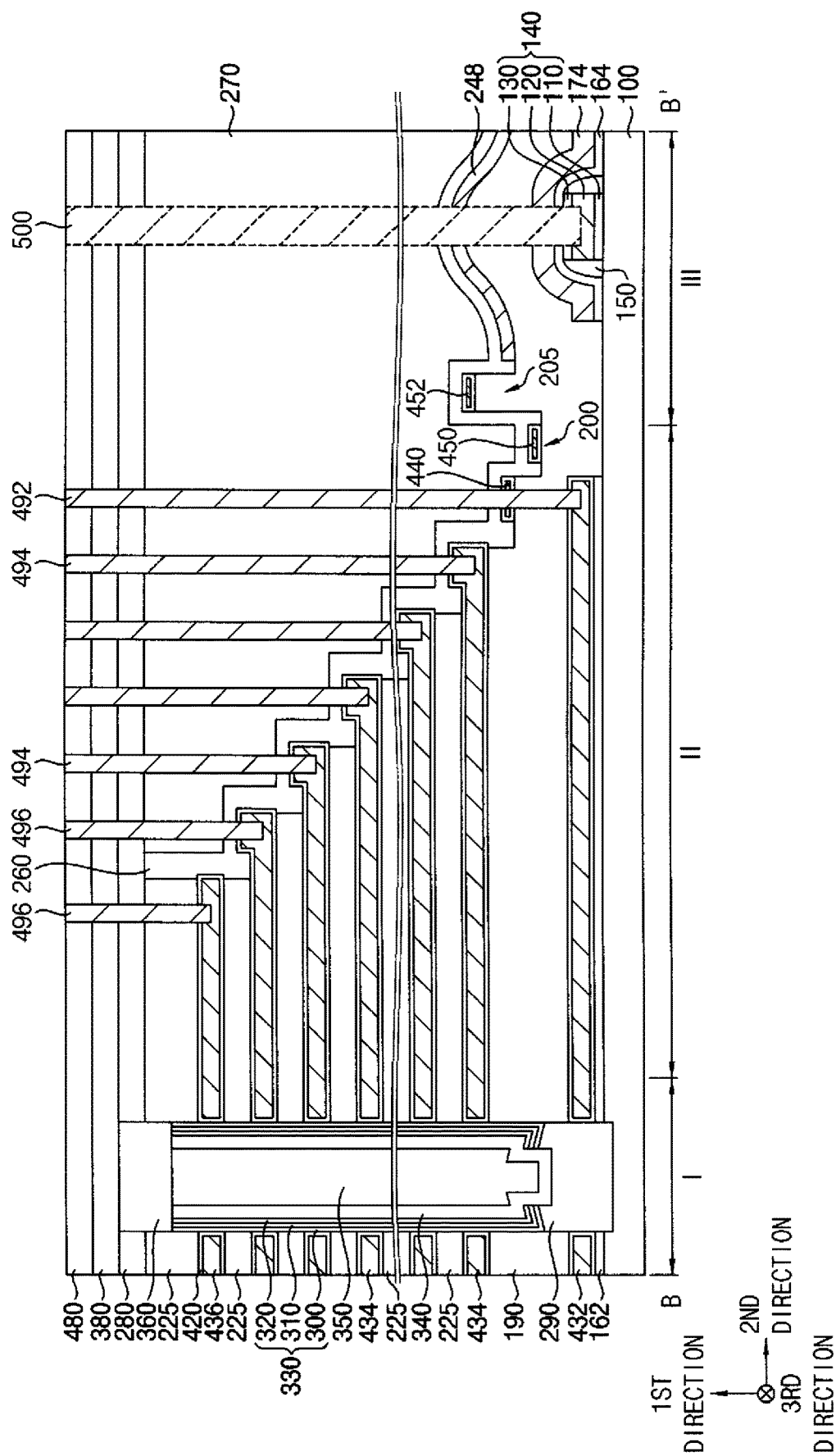
FIGS. 36 and 37 are cross-sectional views illustrating a vertical memory device in accordance with exemplary embodiments of the inventive concept.
Figure 37:
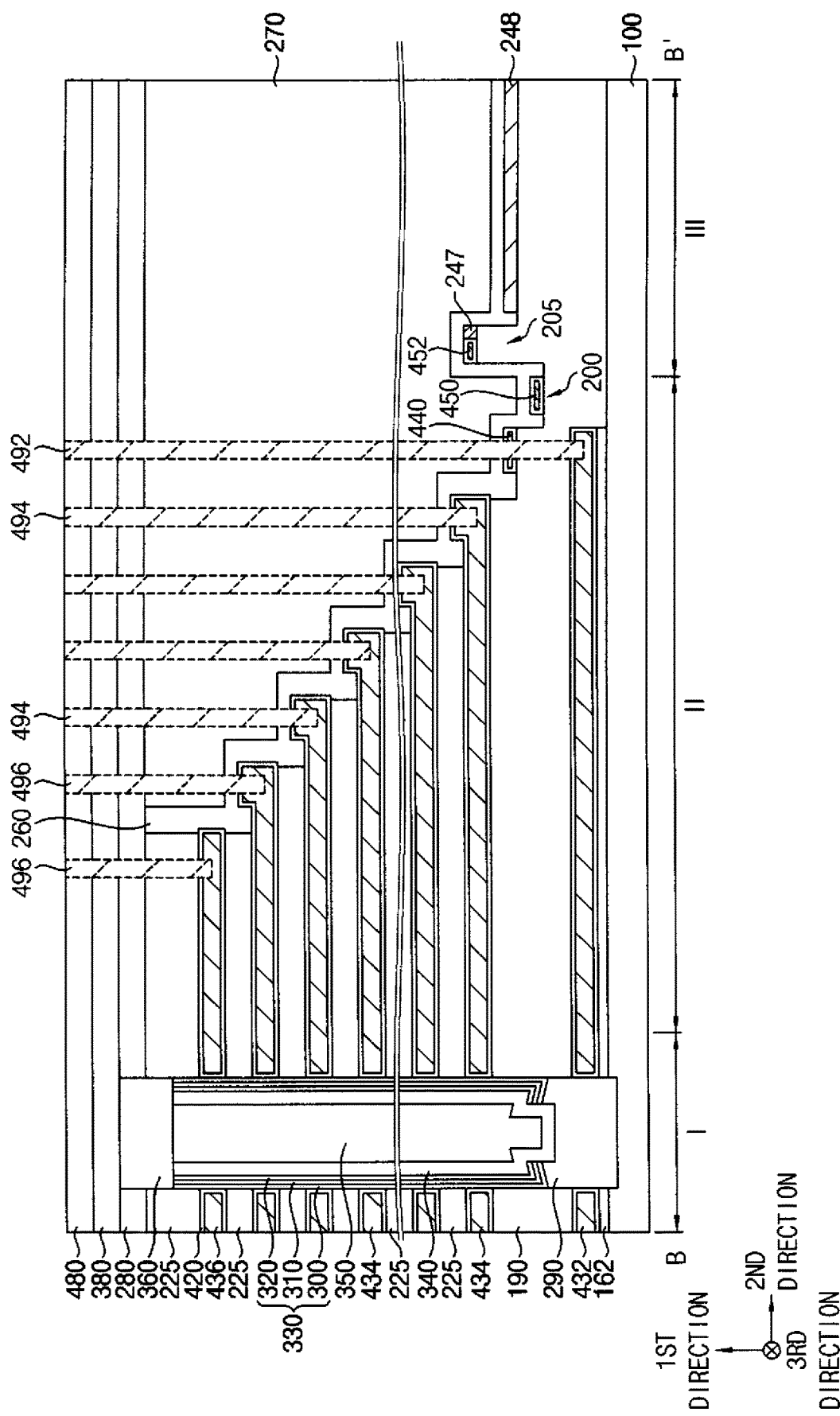

FIGS. 36 and 37 are cross-sectional views illustrating a vertical memory device in accordance with exemplary embodiments of the inventive concept. Particularly, FIG. 36 is a cross-sectional view taken along lines B-B' of corresponding plan views, respectively, and FIG. 37 is a cross-sectional view taken along line D-D' of a corresponding plan view. This vertical memory device may be substantially the same as or similar to that illustrated with reference to FIGS. 1 to 5, except for some elements. Thus, like reference numerals may refer to like elements, and repetitive descriptions thereon are omitted herein.

Referring to FIGS. 36 and 37, both of the recess 200 and the protrusion 205 may be formed at the boundary between the second and third regions II and III of the substrate 100 to be adjacent to each other, and the second and fourth conductive structures 450 and 452 may be formed on the recess 200 and the protrusion 205, respectively. A portion of the fourth conductive structure 452 may have a width in the second direction less than that of other portions thereof, and may contact the seventh insulation pad 247 on the protrusion 205.

In FIGS. 36 and 37, the recess 200 and the protrusion 205 are formed on the second and third regions II and III of the substrate 100, however, the inventive concept is not limited thereto. For example, the recess 200 and the protrusion 205 may be formed on the third and second regions III and II, respectively. Alternatively, one of the recess 200 and the protrusion 205 may be formed at the boundary between the second and third regions II and III of the substrate 100, and the other one of the recess 200 and the protrusion 205 may be formed on the second region II or the third region III of the substrate 100. For example, the recess 200 may be located in both of the second and third regions II and III and the protrusion 205 may be located in the third region III.

In exemplary embodiments of the inventive concept, the first contact plug 492 may extend through the first conductive structure 440 to contact the first gate electrode 432. The first and second conductive structures 440 and 450 are formed at different heights from each other and spaced apart from each other, and thus the first contact plugs 492 at opposite sides of the first and second CSLs 470 and 475 in the third direction may not be electrically short via the first and second conductive structures 440 and 450.

Figure 38:
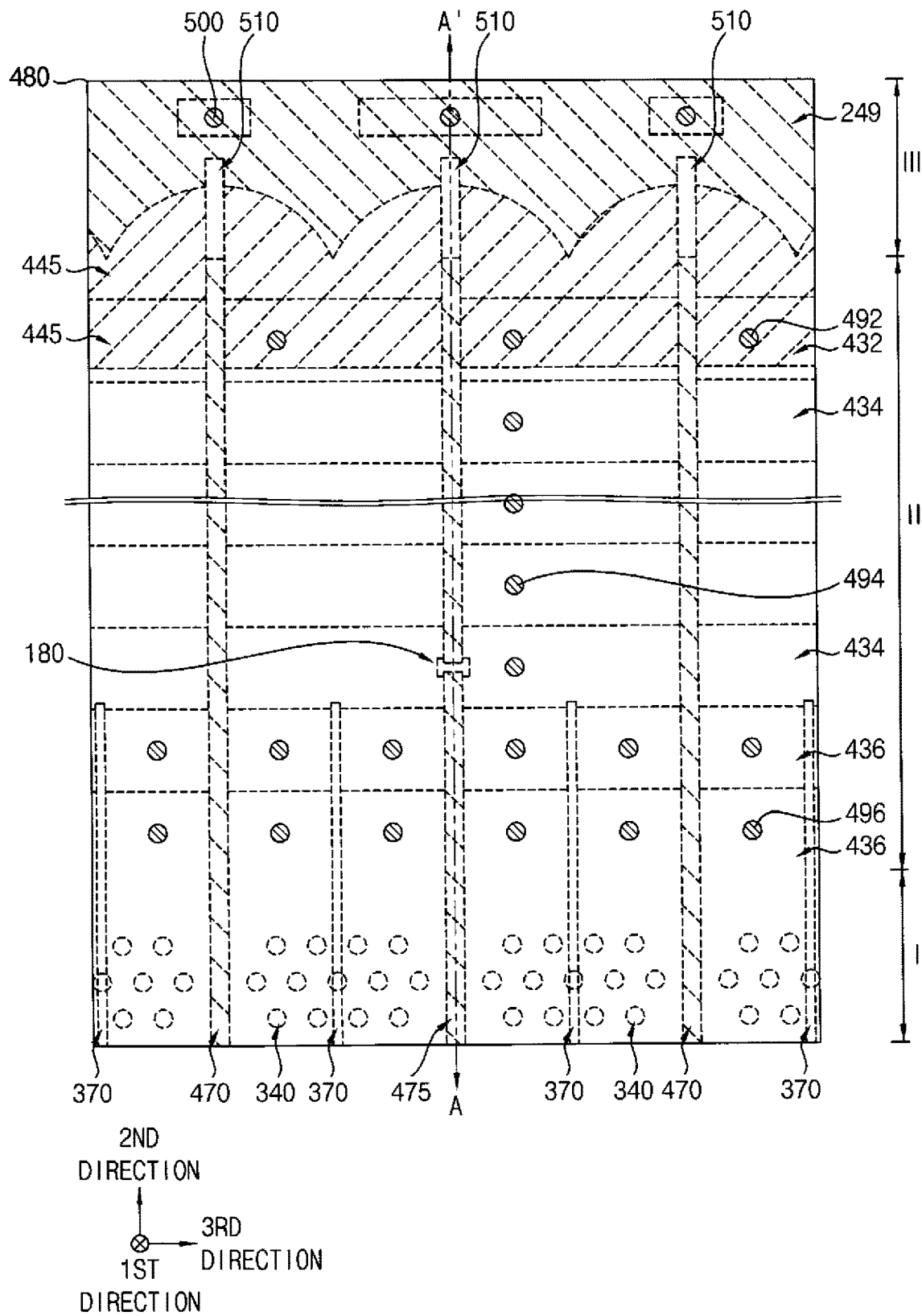
FIG. 38 is a plan view illustrating a vertical memory device in accordance with exemplary embodiments of the inventive concept.

FIG. 38 is a plan view illustrating a vertical memory device in accordance with exemplary embodiments of the inventive concept. This vertical memory device may be substantially the same as or similar to that illustrated with reference to FIGS. 27 and 28, except for some elements. Thus, like reference numerals may refer to like elements, and repetitive descriptions thereon are omitted herein.

Referring to FIG. 38, the third conductive structure 445 extending in the third direction on the second and third regions II and III of the substrate 100 may be divided in the third direction by the first and second CSLs 470 and 475 in the third and fourth openings 390 and 400, respectively, and the second spacer 460 on sidewalls thereof on the second region II of the substrate 100, and may be divided in the third direction by a first cut-off pattern 510 on the third region III of the substrate 100. Thus, the third conductive structures 445 at opposite sides of the first CSL 470 or the second CSL 475 may be separated apart from each other, and thus the first contact plugs 492 extending through the separated third conductive structures 445, respectively, may not be electrically shorted with each other.

In exemplary embodiments of the inventive concept, the first cut-off pattern 510 may contact an end portion of each of the first and second CSLs 470 and 475 in the second direction on the third region III of the substrate 100, and may extend in the second direction to a given length. Thus, a plurality of first cut-off patterns 510 may be formed to be spaced apart from each other in the second direction. The first cut-off pattern 510 may include an oxide, e.g., silicon oxide.

Figure 39:
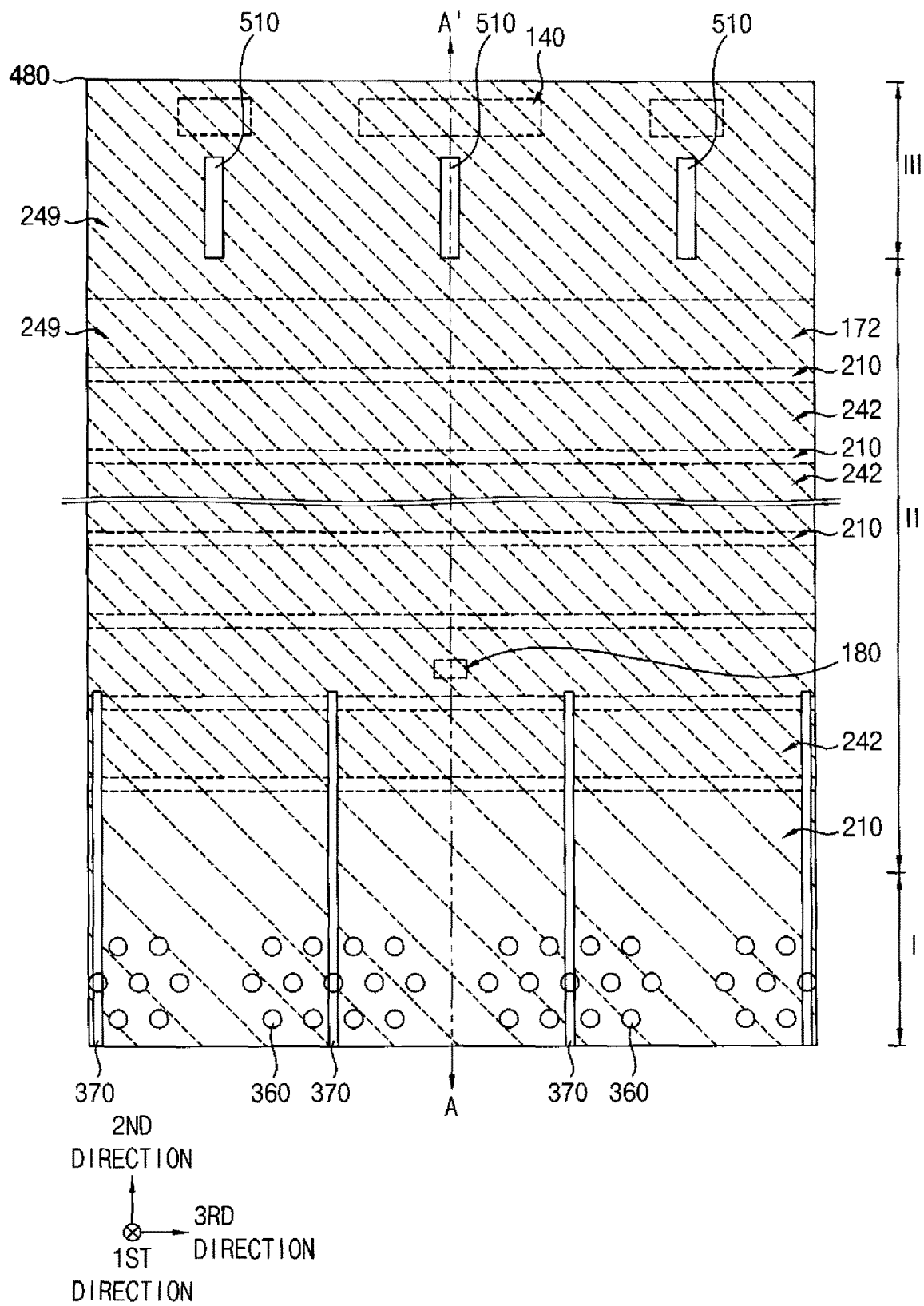
FIGS. 39 and 40 are a plan view and a cross-sectional view illustrating a method of manufacturing a vertical memory device in accordance with exemplary embodiments of the inventive concept.
Figure 40:
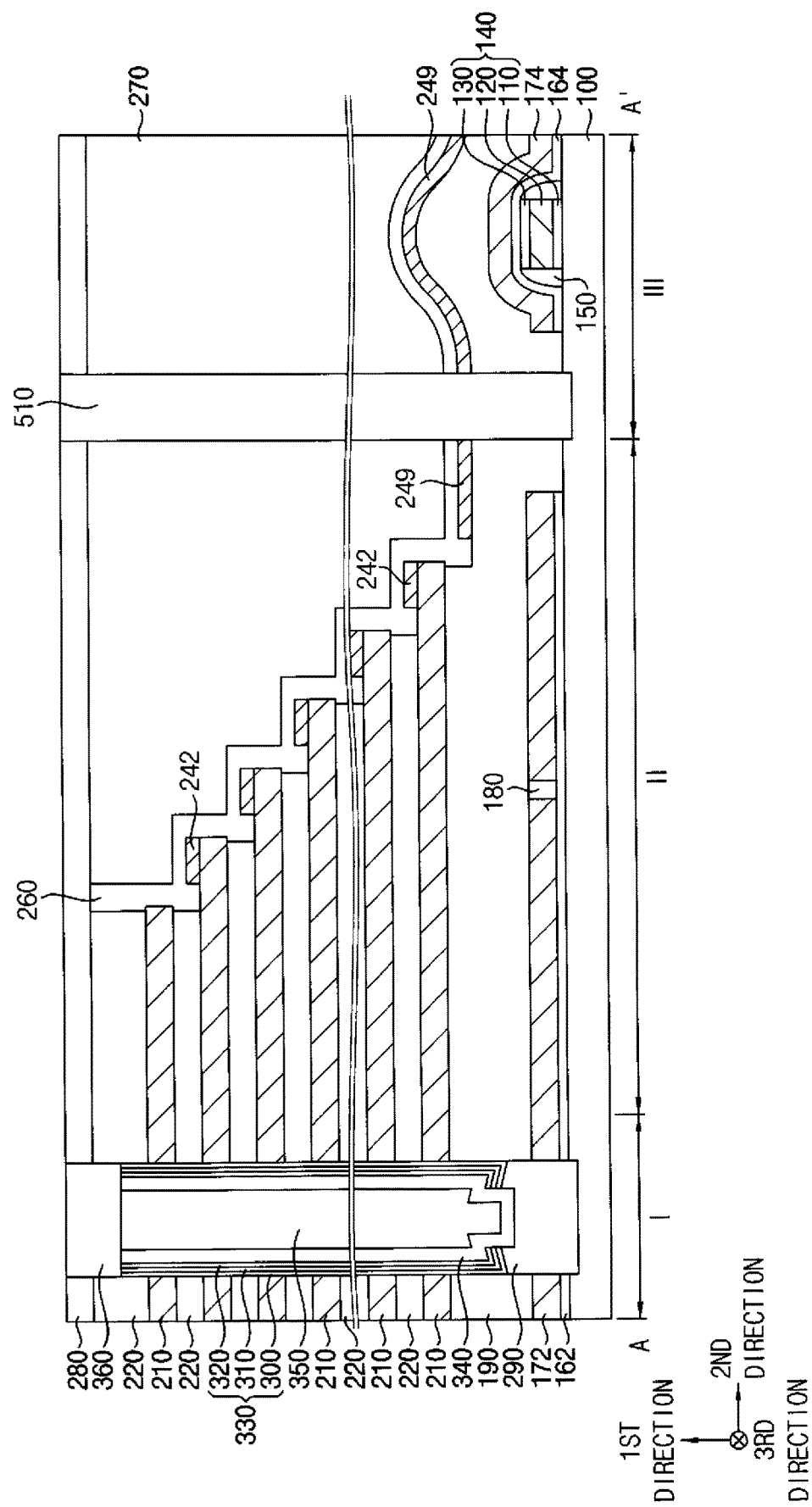

FIGS. 39 and 40 are a plan view and a cross-sectional view illustrating a method of manufacturing a vertical memory device in accordance with exemplary embodiments of the inventive concept. Particularly, FIG. 39 is the plan view, and FIG. 40 is a cross-sectional view taken along a line A-A' of FIG. 39. This method may include processes substantially the same as or similar to that illustrated with reference to FIGS. 23 to 28, and thus repetitive descriptions thereon are omitted herein.

Referring to FIGS. 39 and 40, processes substantially the same as or similar to FIGS. 23 and 24 may be performed, and processes substantially the same as or similar to FIGS. 13 to 15 may be performed.

A first cut-off pattern 510 may be formed through the first to third insulating interlayers 190, 270 and 280, the fourth insulation layer 260 and the sixth insulation pad 249 to contact an upper surface of the substrate 100 on the third region III of the substrate 100 adjacent the second region II of the substrate 100.

In exemplary embodiments of the inventive concept, the first cut-off pattern 510 may be formed at a position at least partially overlapping an end portion of each of the third and fourth openings 390 and 400 in the second direction that may be formed subsequently. Thus, a plurality of first cut-off patterns 510 may be formed to be spaced apart from each other in the third direction, and each of the first cut-off patterns 510 may extend in the second direction to a given length.

A portion of the sixth insulation pad 249 on the third region of the substrate, which may extend in the third direction on the second and third regions II and III of the substrate 100, may be removed by the first cut-off pattern 510. Therefore, the sixth insulation pad 249 may include an opening.

Referring to FIG. 38 again, processes substantially the same as or similar to FIGS. 25 to 28 may be performed to complete the fabrication of the vertical memory device. However, the sixth insulation pad 249 extending in the third direction on the second and third regions II and III of the substrate 100 may be, divided in the third direction by the third and fourth openings 390 and 400 and the first cut-off pattern 510.

Figure 41:
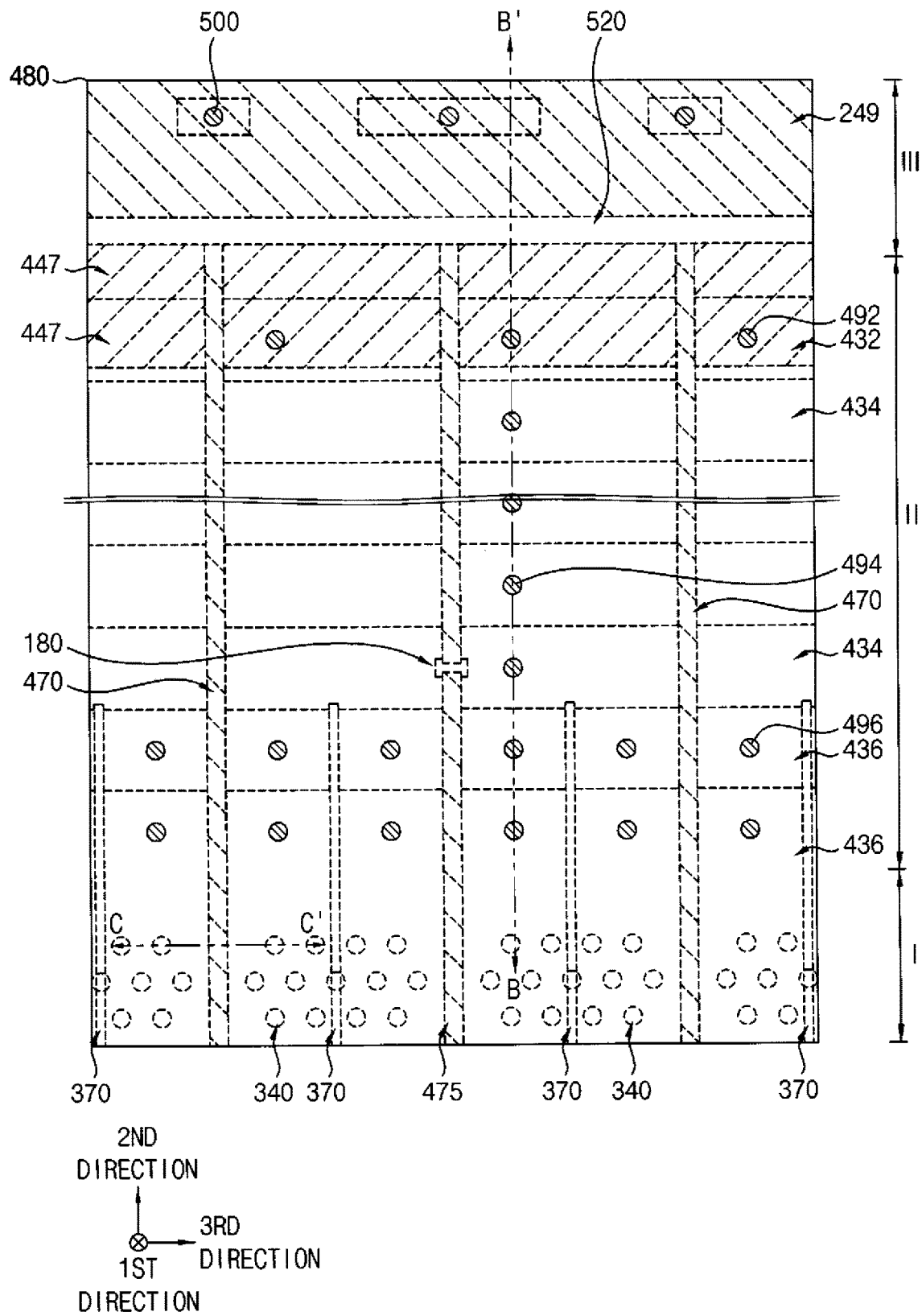
FIGS. 41 and 42 are a plan view and a cross-sectional view illustrating a vertical memory device in accordance with exemplary embodiments of the inventive concept.
Figure 42:
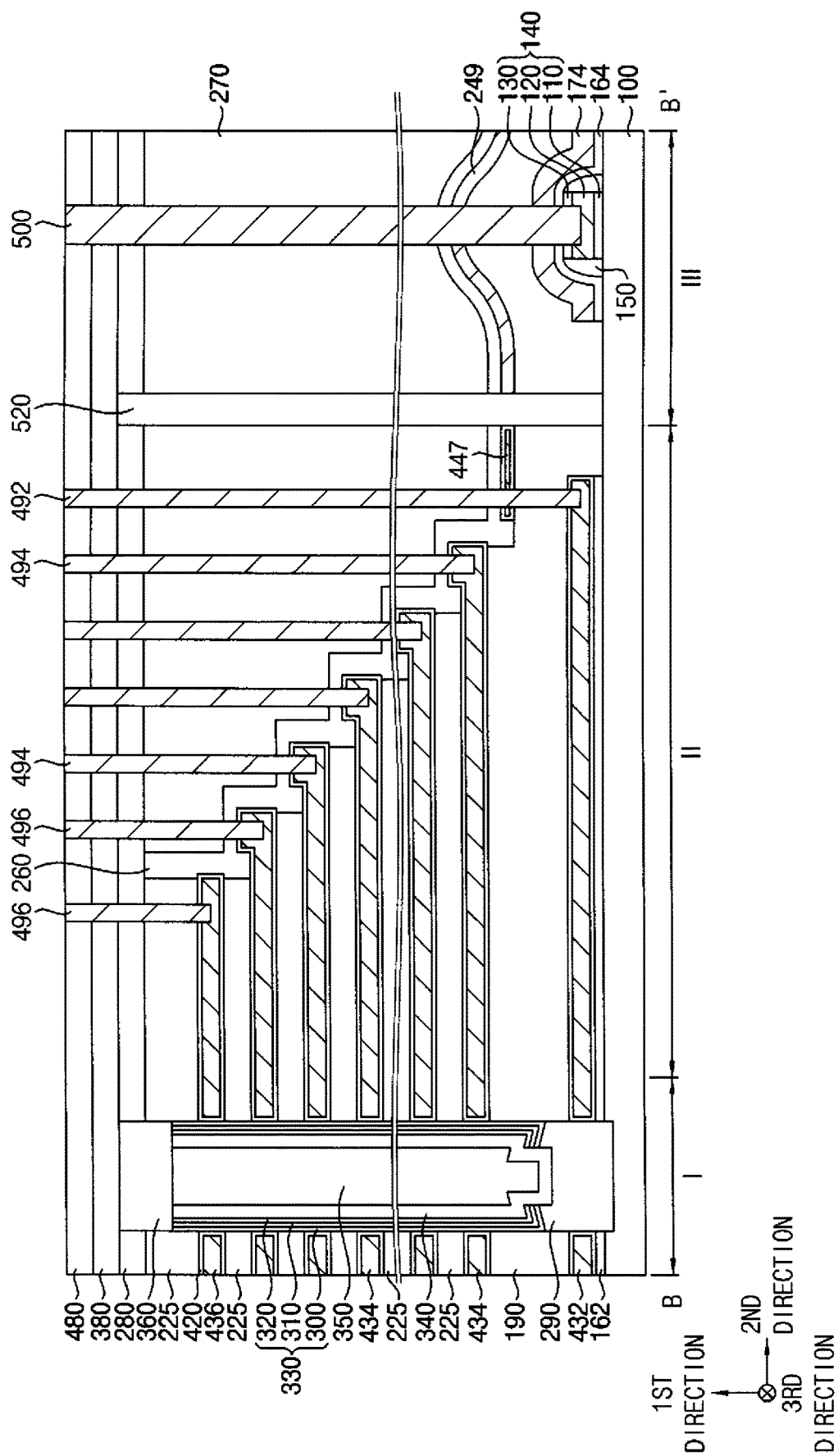

FIGS. 41 and 42 are a plan view and a cross-sectional view illustrating a vertical memory device in accordance with exemplary embodiments of the inventive concept. Particularly, FIG. 41 is the plan view, and FIG. 42 is a cross-sectional view taken along line B-B' of FIG. 41. This vertical memory device may be substantially the same as or similar to that illustrated with reference to FIG. 38, except for some elements. Thus, like reference numerals may refer to like elements, and repetitive descriptions thereon are omitted herein.

Referring to FIGS. 41 and 42, a fifth conductive structure 447 may be formed at the boundary between the second and third regions II and III of the substrate, instead of the third conductive structure 445 on the second region II of the substrate 100.

The fifth conductive structure 447 may be divided in the third direction by the first and second CSLs 470 and 475 and the second spacer 460 in the third and fourth openings 390 and 400, respectively, and may not be formed on the third region III of the substrate 100 due to a second cut-off pattern 520 on the third region III of the substrate 100. Thus, the fifth conductive structures 447 at opposite sides of the first CSL 470 or the second CSL 475 may be separated from each other. Therefore, the first contact plugs 492 extending through the separated fifth conductive structures 447 to contact the first gate electrodes 432 may not be electrically short.

In exemplary embodiments of the inventive concept, the second cut-off pattern 520 may extend in the third direction on the third region III of the substrate 100, and may commonly contact end portions of the first and second CSLs 470 and 475 in the second direction and sidewalk of the fifth conductive structures 447 in the second direction.

Figure 43:
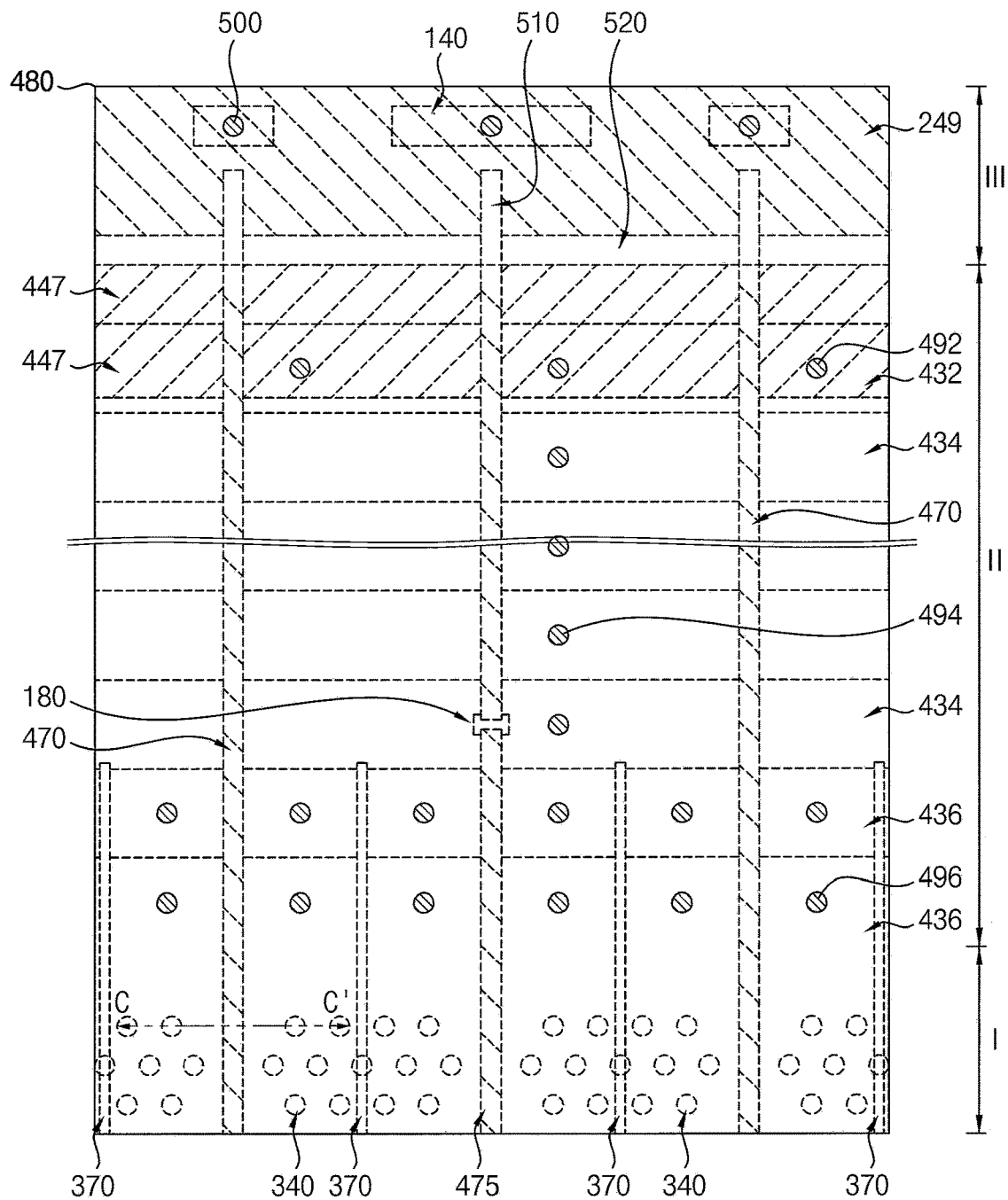
FIG. 43 is a plan view illustrating a vertical memory device in accordance with exemplary embodiments of the inventive concept.

FIG. 43 is a plan view illustrating a vertical memory device in accordance with exemplary embodiments of the inventive concept. This vertical memory device may include both of the first cut-off pattern 510 shown in FIG. 38 and the second cut-off pattern 520 shown in FIGS. 41 and 42. Thus, the fifth conductive structure 447 may be formed on the second region II of the substrate 100.

Figure 44:
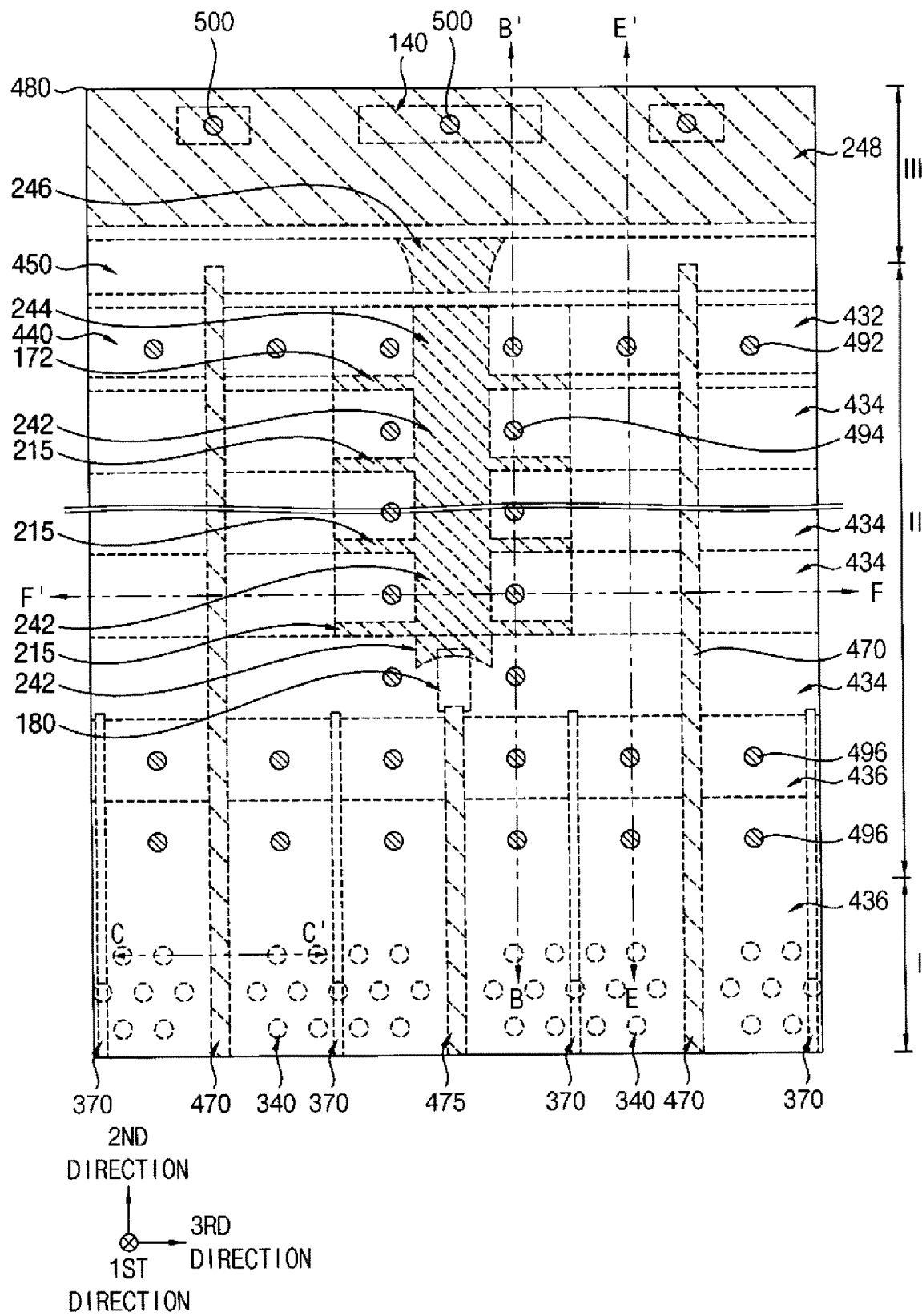
FIGS. 44, 45, 46 and 47 are a plan view and cross-sectional views illustrating a vertical memory device in accordance with exemplary embodiments of the inventive concept.
Figure 45:
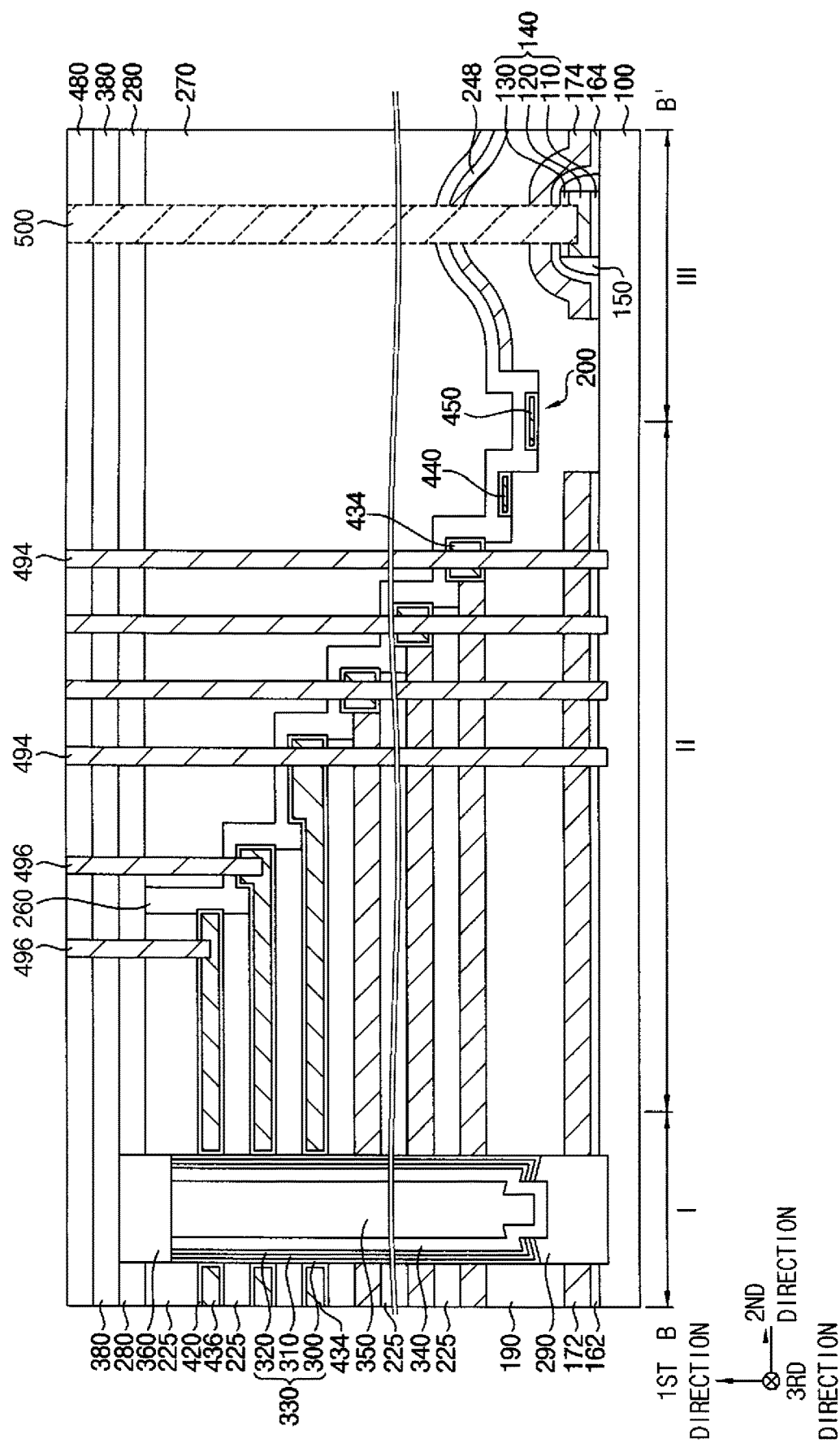
Figure 46:
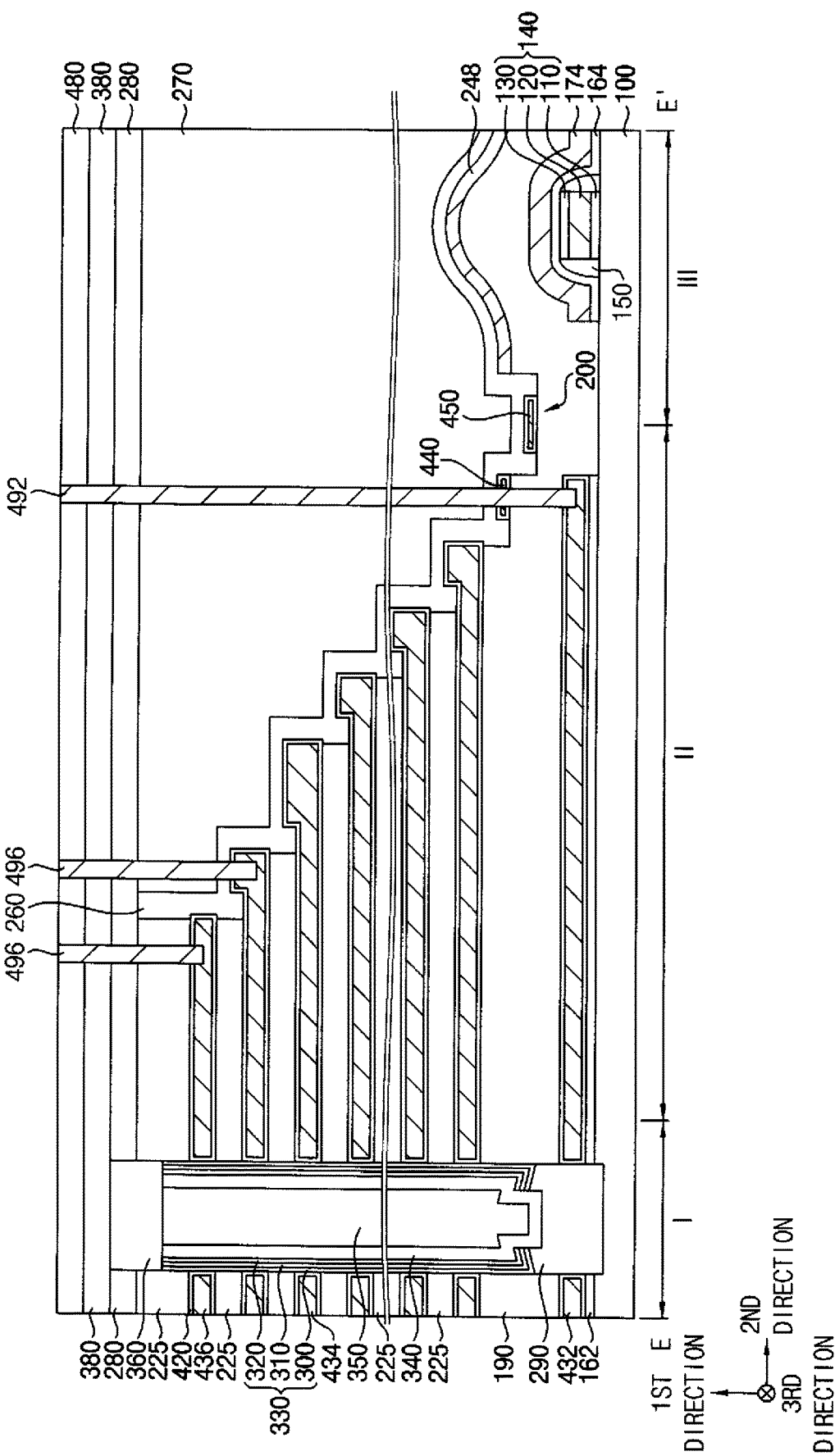
Figure 47:
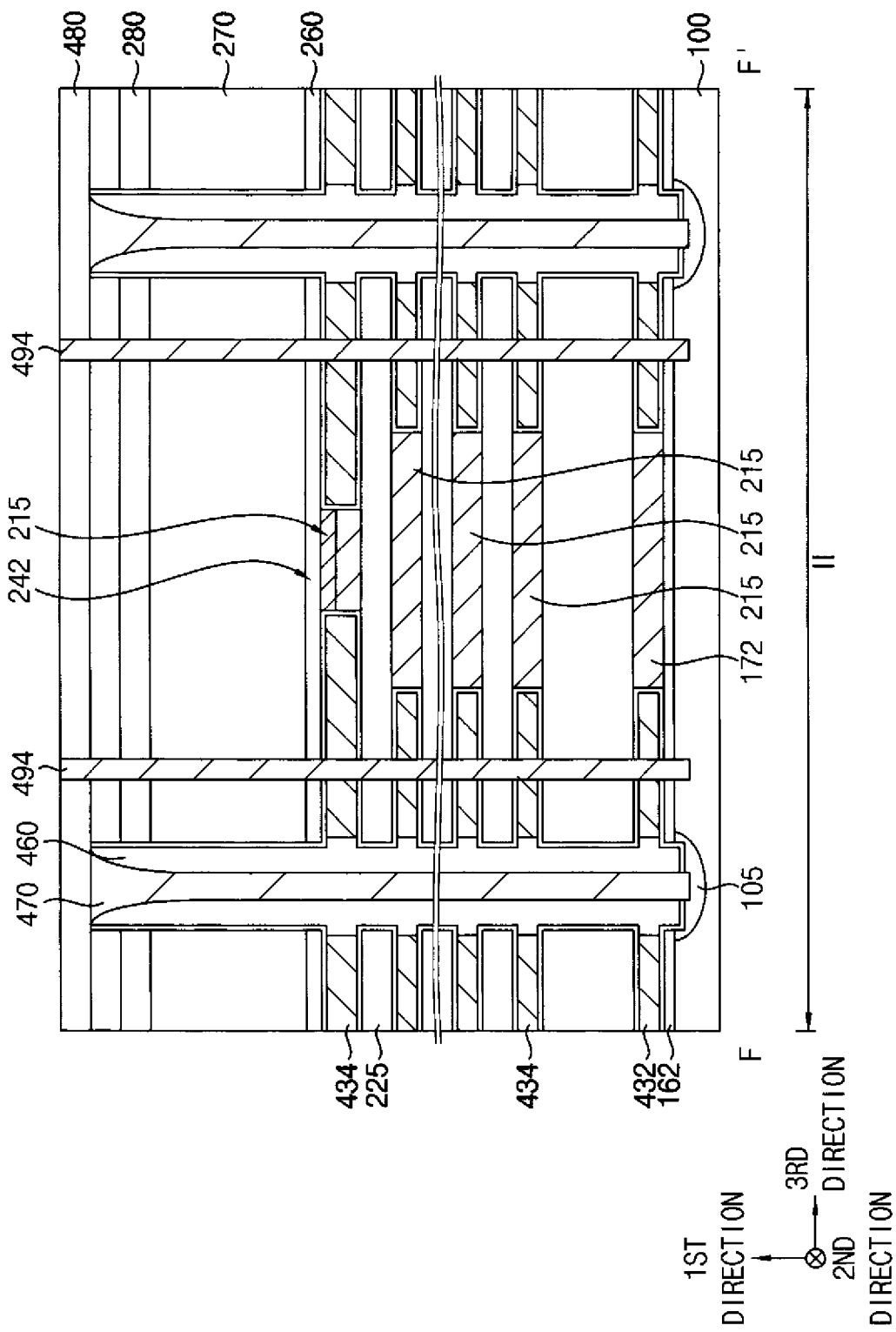

FIGS. 44 to 47 are a plan view and cross-sectional views illustrating a vertical memory device in accordance with exemplary embodiments of the inventive concept. Particularly, FIG. 44 is the plan view, FIG. 45 is a cross-sectional view taken along line B-B' of FIG. 44, FIG. 46 is a cross-sectional view taken along line E-E' of FIG. 44, and FIG. 47 is a cross-sectional view taken along line F-F' of FIG. 44. This vertical memory device may be substantially the same as or similar to that illustrated with reference to FIGS. 1 to 5, except for some elements. Thus, like reference numerals may refer to like elements, and repetitive descriptions thereon are omitted herein.

Referring to FIGS. 44 to 47, the second CSL 475 may extend on the first region I and a portion of the second region II of the substrate 100, and an end portion of the second CSL 475 in the second direction may overlap the first division pattern 180 in the first direction.

Thus, in a wet etching process for removing the first and second sacrificial patterns 172 and 215, which are illustrated later, a portion of the second sacrificial pattern 215 between neighboring ones of the first CSLs 470 in the third direction at an area where the second CSL 475 is not formed and the first to third insulation pads 242, 244 and 246 thereon may not be removed but remain.

Each conductive pad of each of the second gate electrodes 434 and the third gate electrodes 436 except for the uppermost one may have a thickness greater than that of other portions thereof, and may protrude in the third direction from the other portions thereof. Thus, the first and second sacrificial patterns 172 and 215 may be placed under the conductive pad of each gate electrode.

In exemplary embodiments of the inventive concept, each of the second contact plugs 494 may extend through the conductive pads of the second gate electrodes 434 to reach the upper surface of the substrate 100. For example, in FIGS. 45 and 47, each of the second contact plugs 494 also extends through the third insulation pattern 225 and the second sacrificial pattern 215 alternately stacked and the first sacrificial pattern 172. However, the inventive concept is not limited thereto, and each of the second contact plugs 494 may extend through the conductive pad of the corresponding second gate electrode 434 to a given height from the upper surface of the substrate 100.

Figure 48:
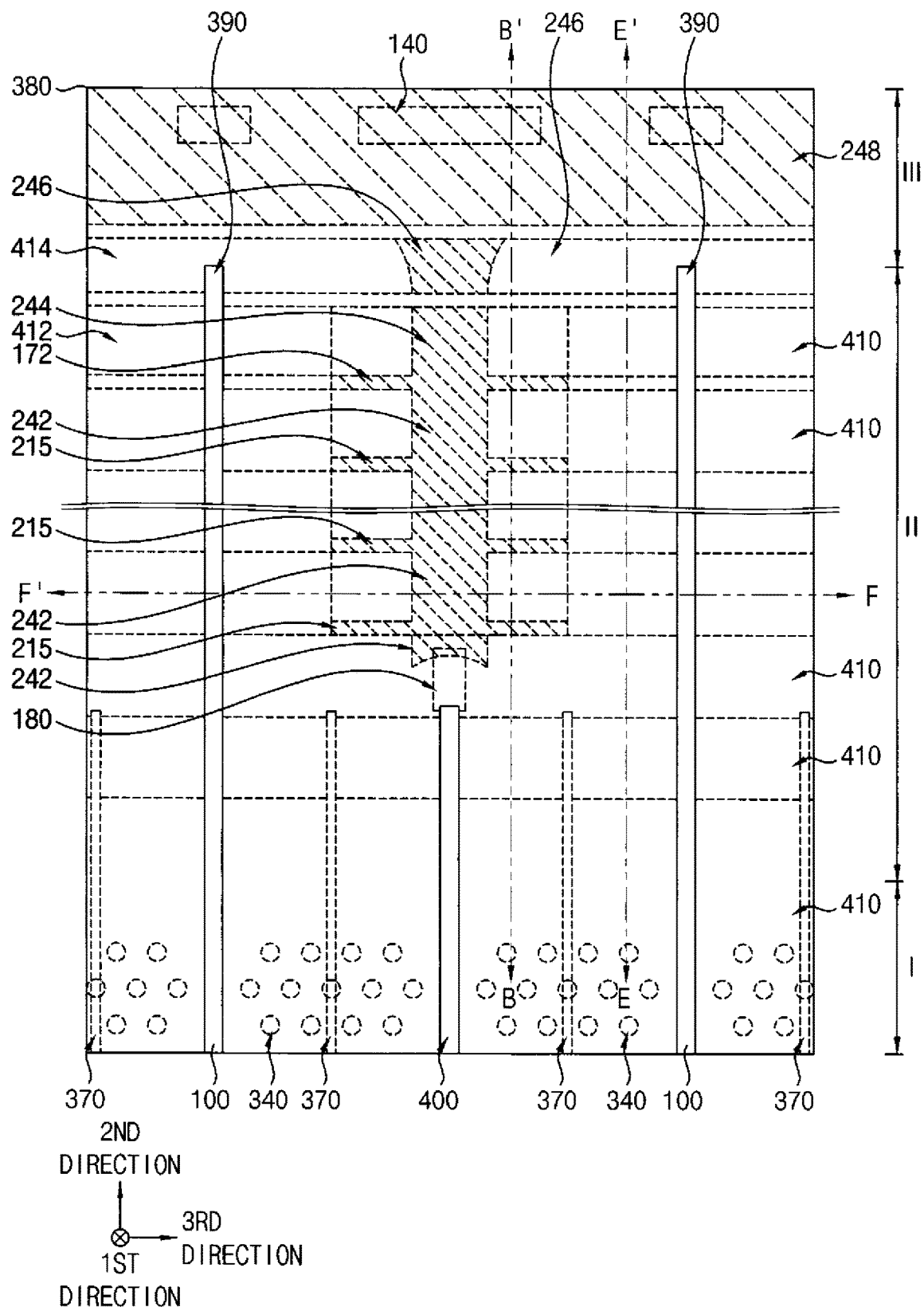
FIGS. 48, 49, 50, 51, 52, 53, 54 and 55 are plan views and cross-sectional views illustrating a method of manufacturing a vertical memory device in accordance with exemplary embodiments of the inventive concept.
Figure 49:
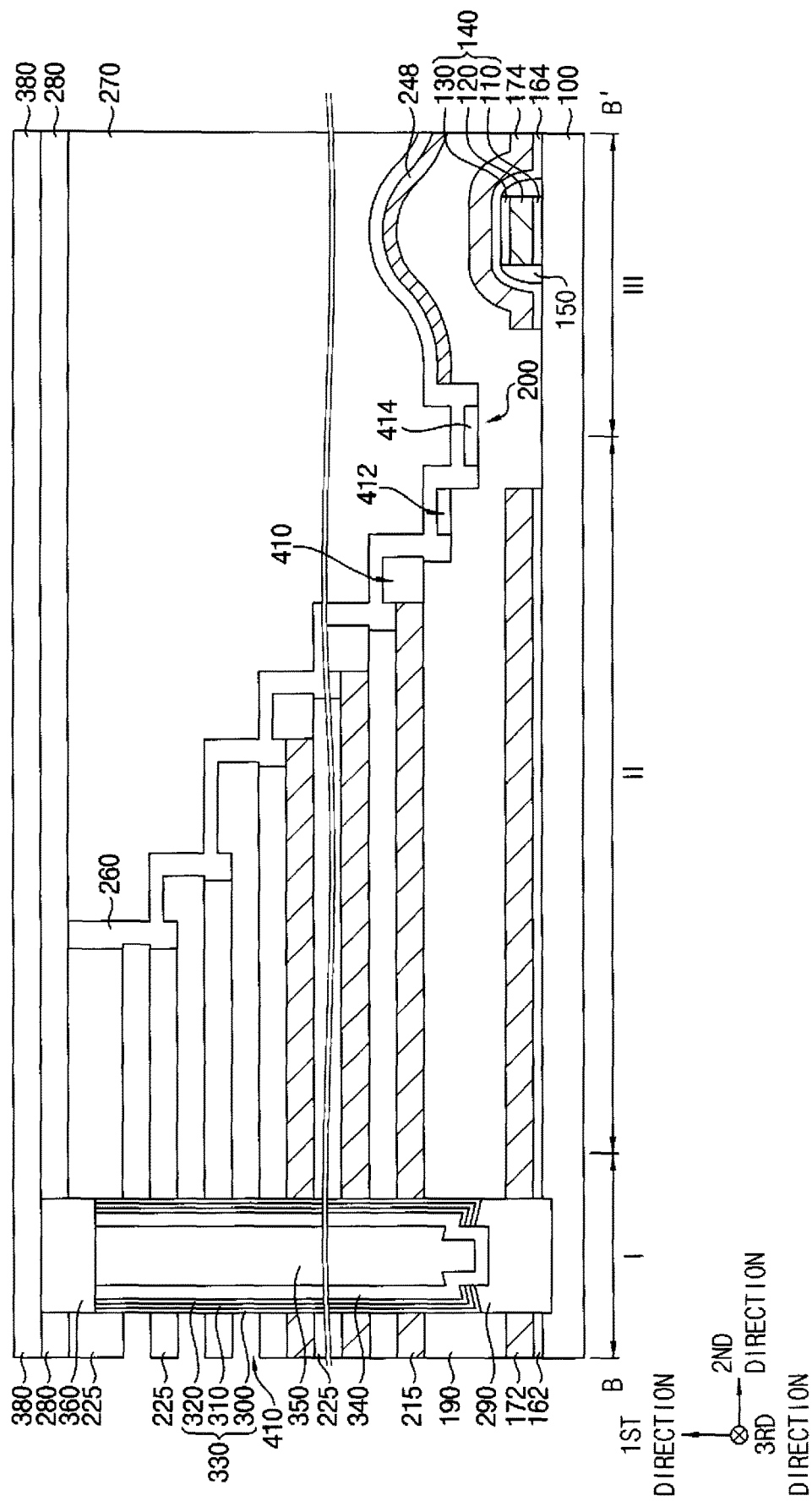
Figure 50:
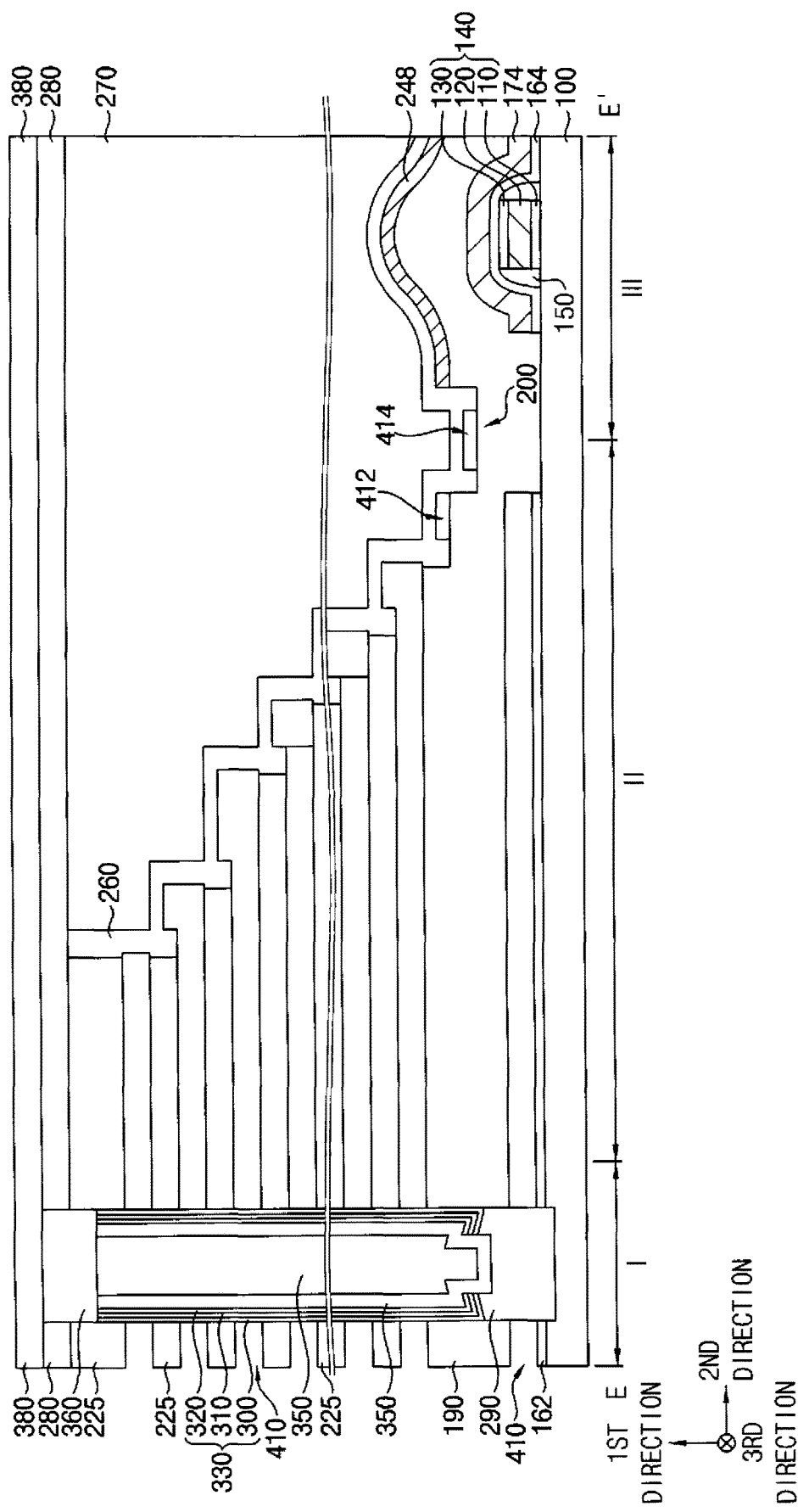
Figure 51:
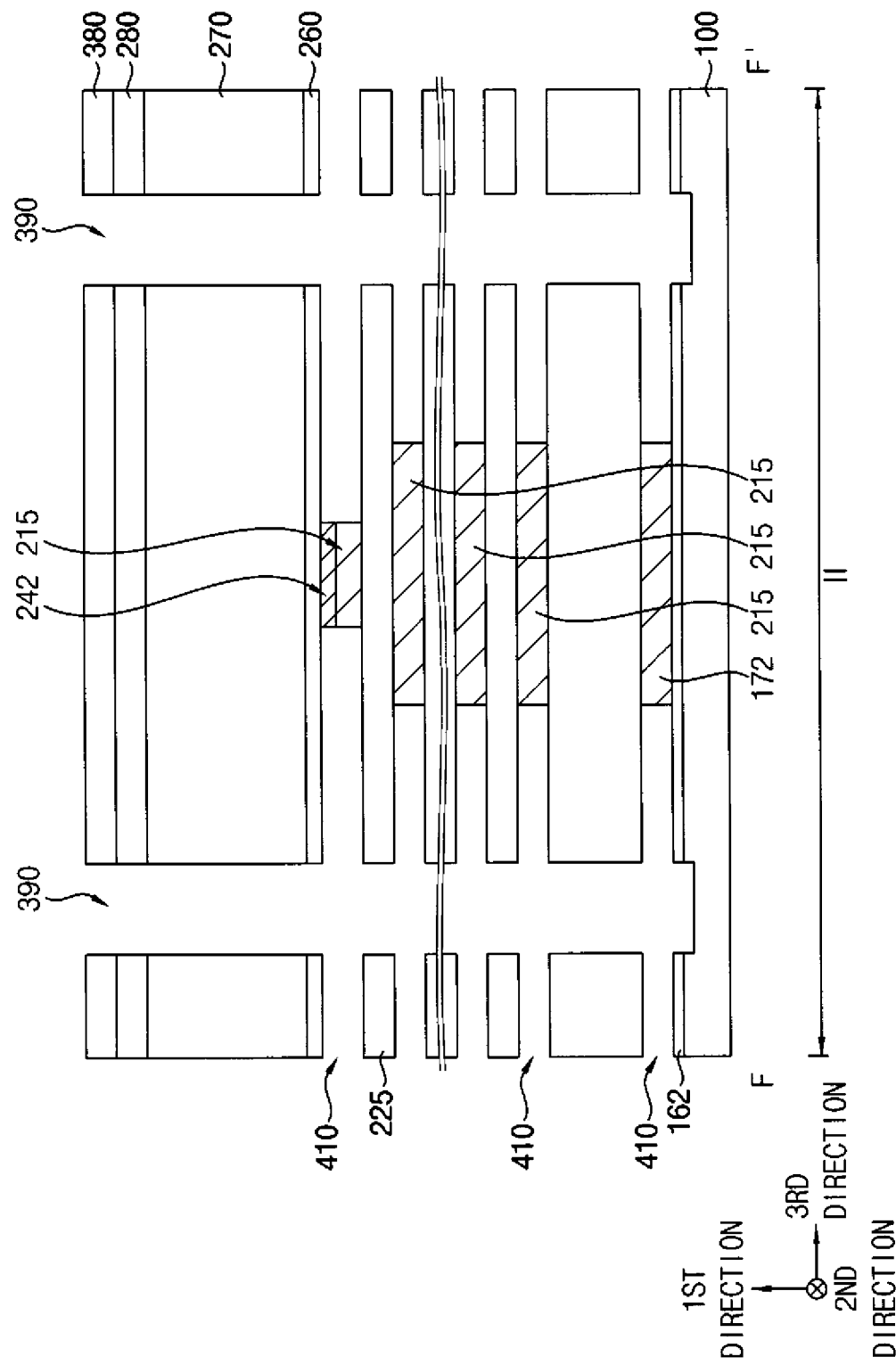
Figure 52:
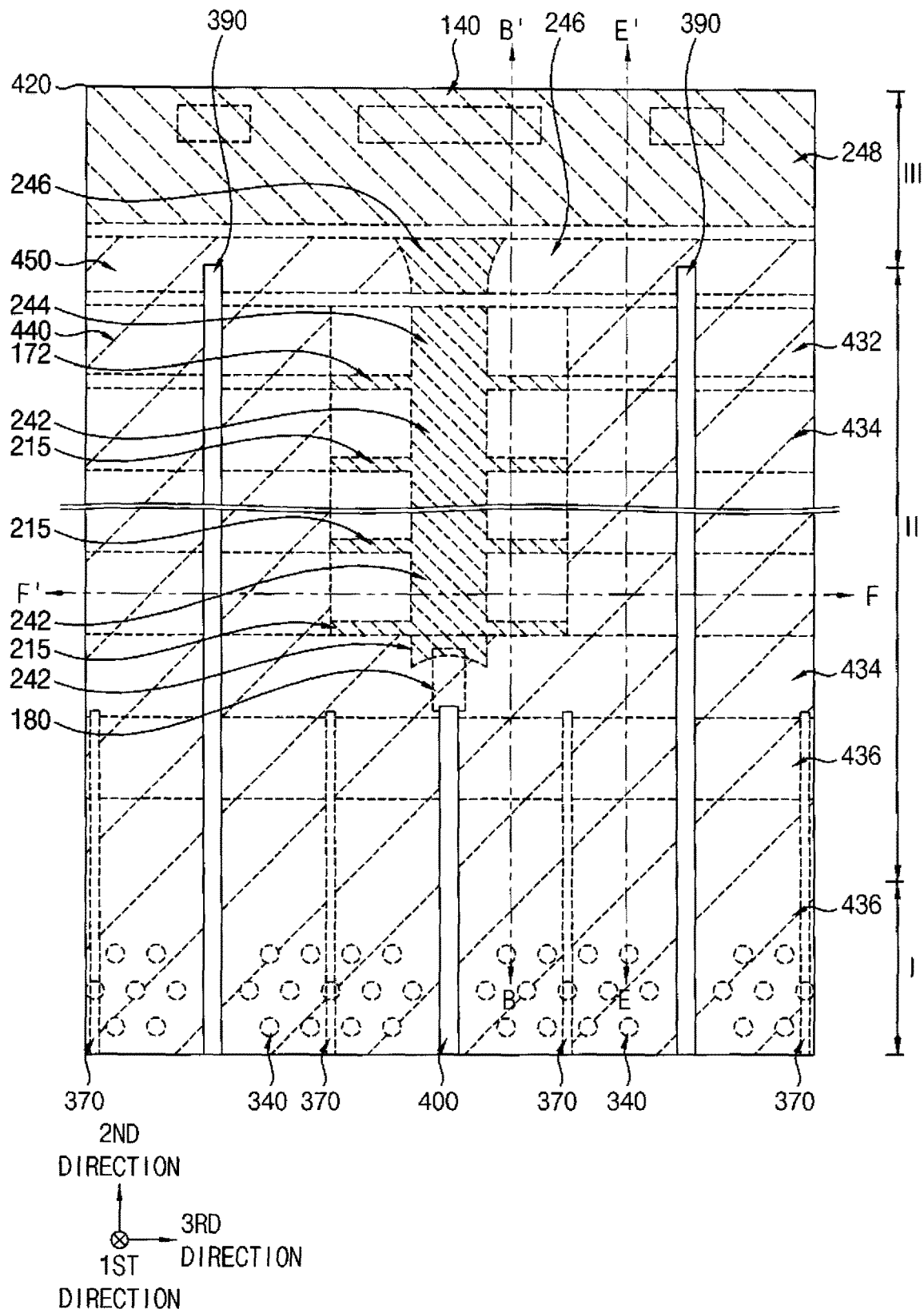
Figure 53:
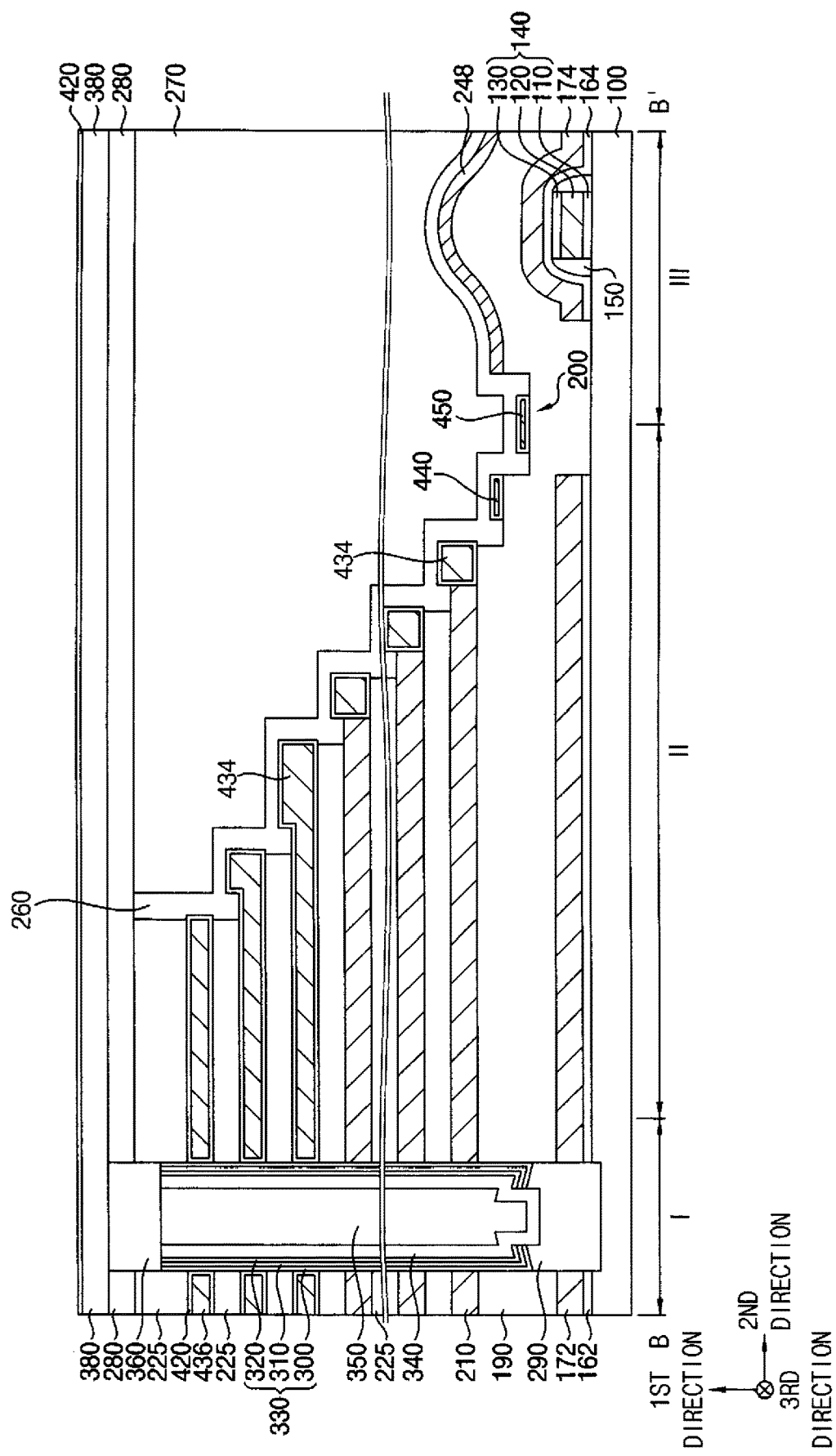
Figure 54:
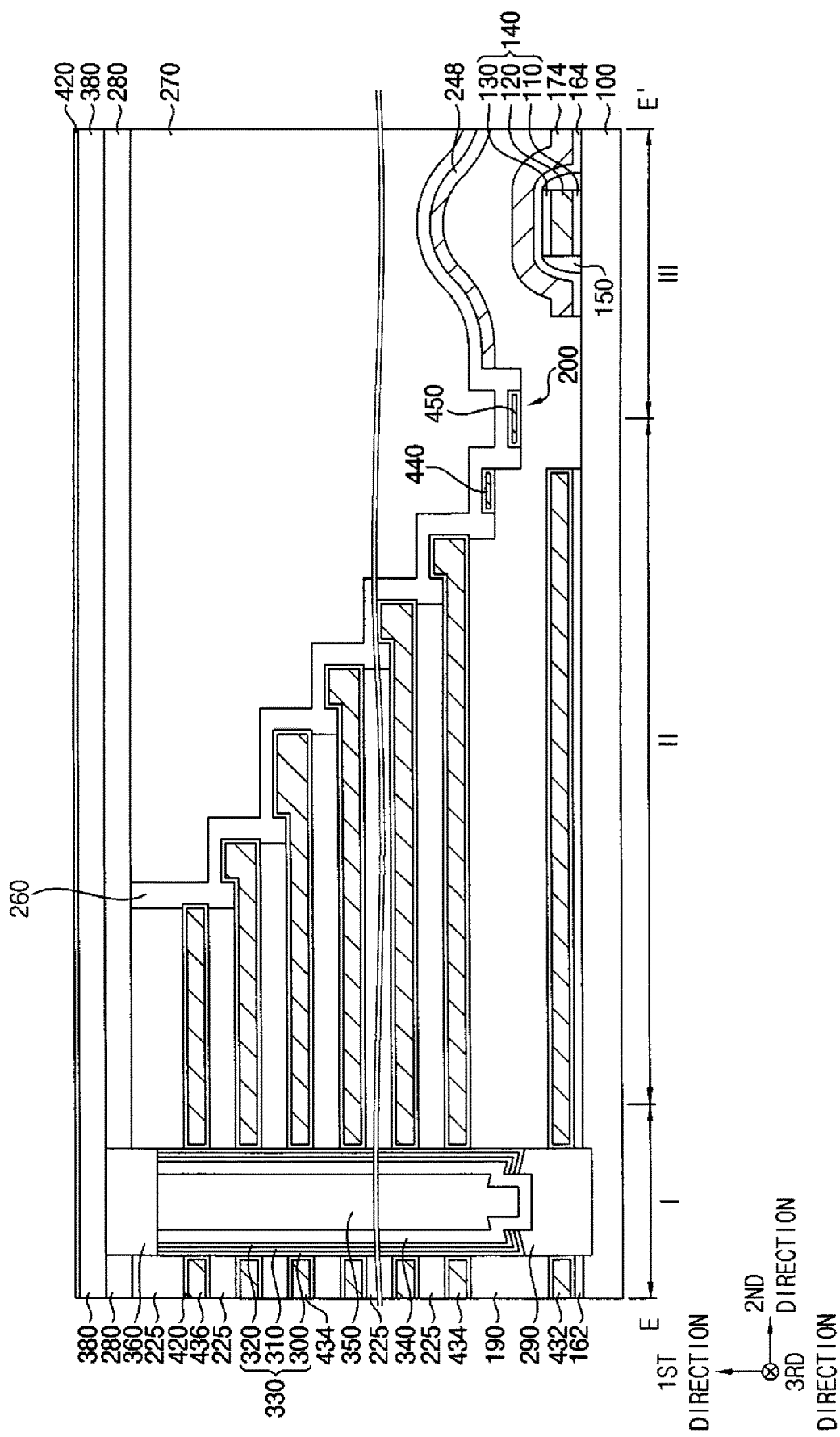
Figure 55:
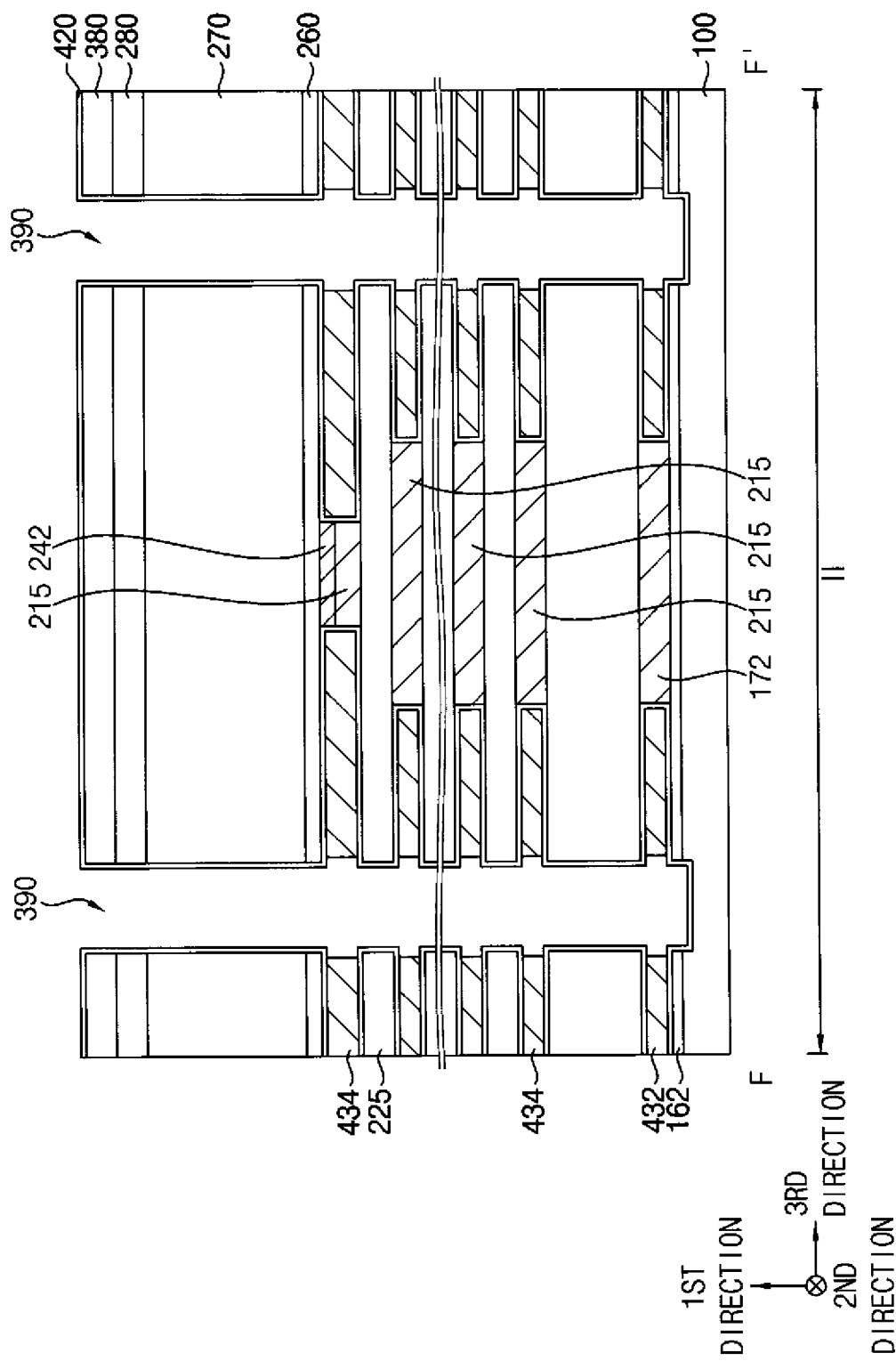

FIGS. 48 to 55 are plan views and cross-sectional views illustrating a method of manufacturing a vertical memory device in accordance with exemplary embodiments of the inventive concept. Particularly, FIGS. 48 and 52 are the plan views, and FIGS. 49-51 and 53-55 are the cross-sectional views. FIGS. 49 and 53 are cross-sectional views taken along lines B-B' of corresponding plan views, FIGS. 50 and 54 are cross-sectional views taken along lines E-E' of corresponding plan views, and FIGS. 51 and 55 are cross-sectional views taken along lines F-F' of corresponding plan views. This method may include processes substantially the same as or similar to that illustrated with reference to FIGS. 6 to 22 and FIGS. 1 to 5, and thus repetitive descriptions thereon are omitted herein.

Referring to FIGS. 48 to 51, processes substantially the same as or similar to FIGS. 6 to 18 may be performed. However, the fourth opening 400 may extend on the first region I and a portion of the second region II of the substrate 100, and an end portion of the fourth opening 400 in the second direction may overlap the first division pattern 180 in the first direction. For example, the first division pattern 180 may be overlapped by the end portion of the fourth opening 400 and, the first insulation pad 242.

Thus, for example, when a wet etching process for removing the second sacrificial pattern 215 and the first sacrificial pattern 172, which are formed by dividing the sacrificial layer 210 through the third and fourth openings 390 and 400, is performed, portions of the first and second sacrificial patterns 172 and 215 between neighboring ones of the third openings 390 in the third direction at an area where the fourth opening 400 is not formed and having the first to third insulation pads 242, 244 and 246 disposed thereon may not be entirely removed but partially remain. However, the first insulation pad 242 having a different etch rate, for example, a relatively high etch rate compared to other portions thereof may be formed on the end portion in the second direction of the second sacrificial pattern 215 at each level, and thus may be etched at a relatively fast rate so that the first gap 410 may protrude in the third direction as shown in FIG. 49.

Referring to FIGS. 52 to 55, processes substantially the same as or similar to FIGS. 19 to 21 may be performed. However, the conductive pad of each of the second gate electrodes 434 and the third gate electrodes 436 except for the uppermost one may have a thickness greater than that of other portions thereof, and may protrude from the other portions thereof in the third direction. Thus, the first and second sacrificial patterns 172 and 215 may be located under the conductive pad of each gate electrode.

Referring to FIGS. 44 to 47 again, processes substantially the same as or similar to FIG. 22 and FIGS. 1 to 5 may be performed to complete the fabrication of the vertical memory device.

The first contact plug 492 may extend through the first conductive structure 440 including a metal to contact the first gate electrode 432, and thus the process time for forming the first contact plug 492 may be long. Additionally, when the first contact plug 492 is formed together with the second contact plugs 494 at variable levels, respectively, some of the second contact plugs 494 may extend through a corresponding one of the second gate electrodes 434 to reach one of the second gate electrodes 434 thereunder.

However, in exemplary embodiments of the inventive concept, the third insulation pattern 225 and the second sacrificial pattern 215 are alternately stacked under the conductive pad of each of the second gate electrodes 434, and thus some of the second contact plugs 494 may extend through the corresponding one of the second, gate electrodes 434 to reach an area thereunder.

Figure 56:
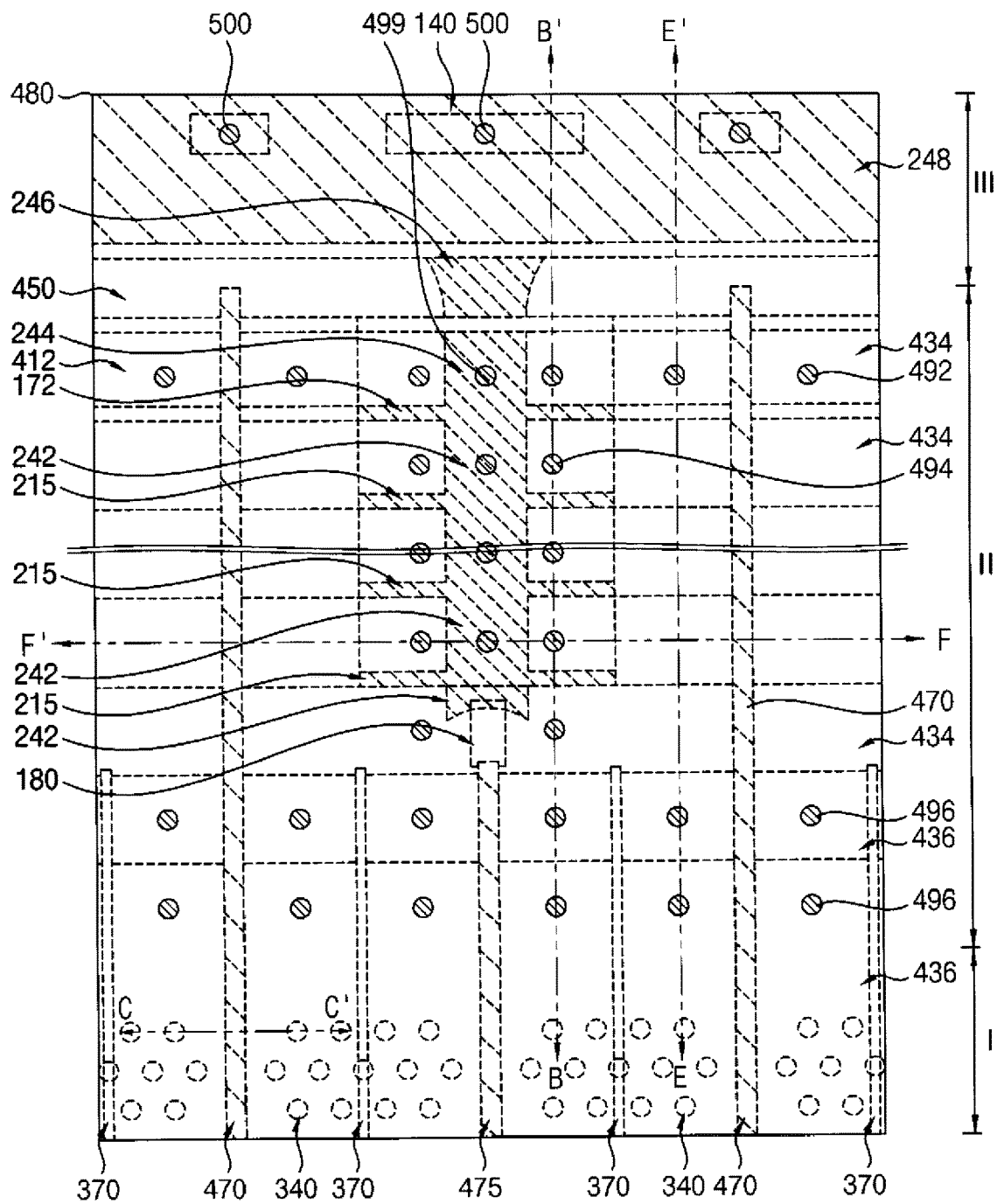
FIGS. 56, 57, 58 and 59 are a plan view and cross-sectional views illustrating a vertical memory device in accordance with exemplary embodiments of the inventive concept.
Figure 57:
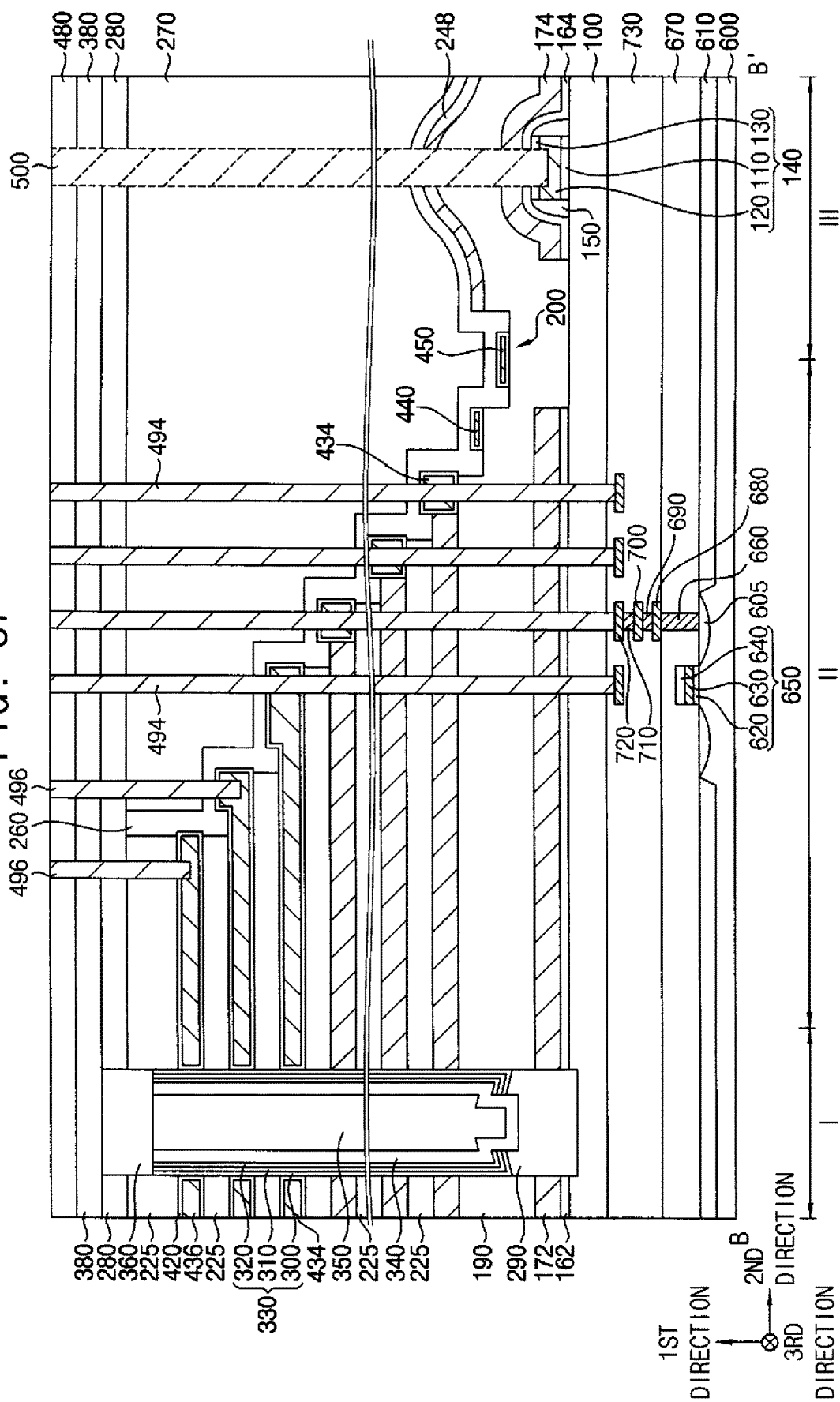
Figure 58:
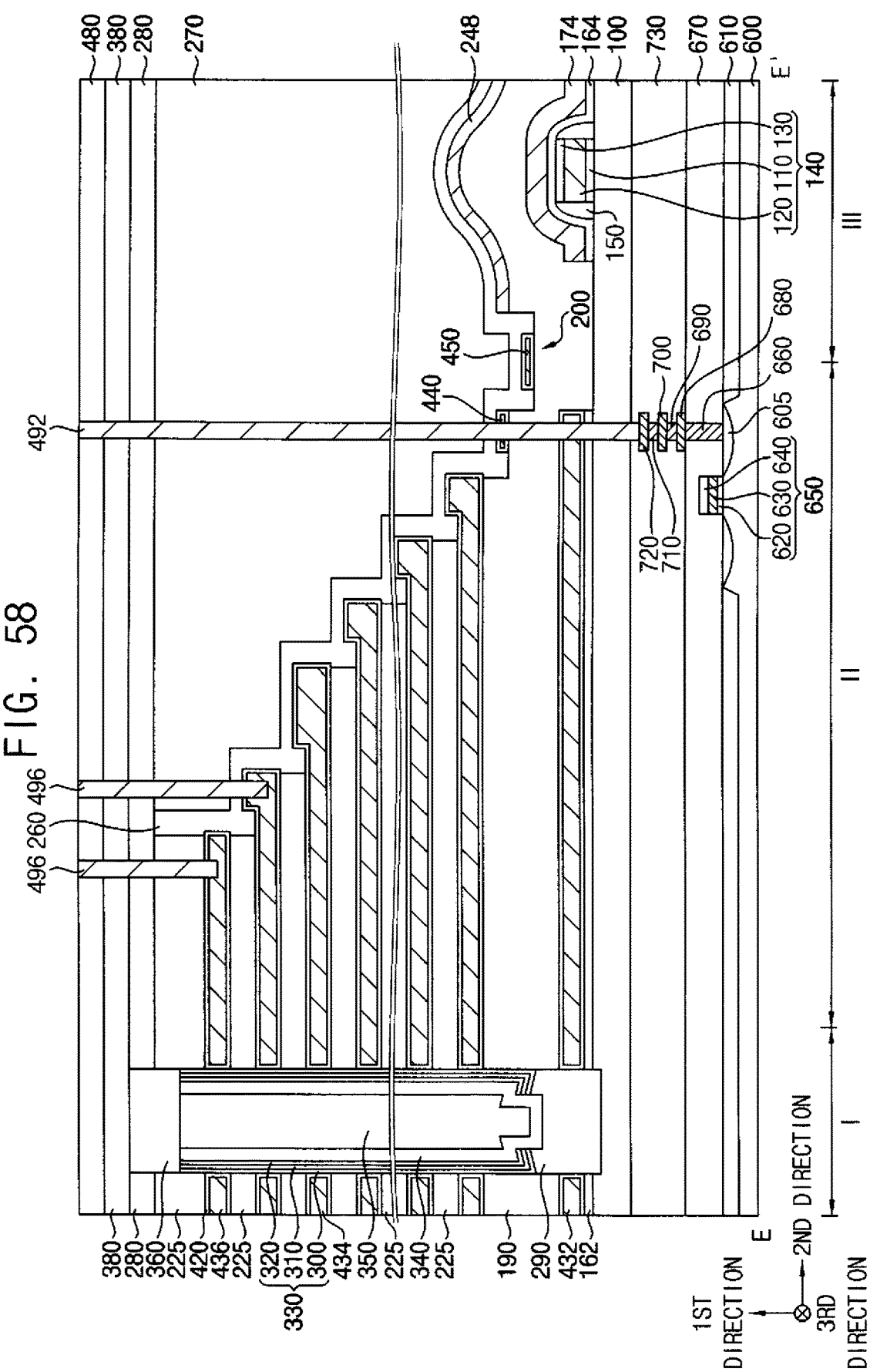
Figure 59:
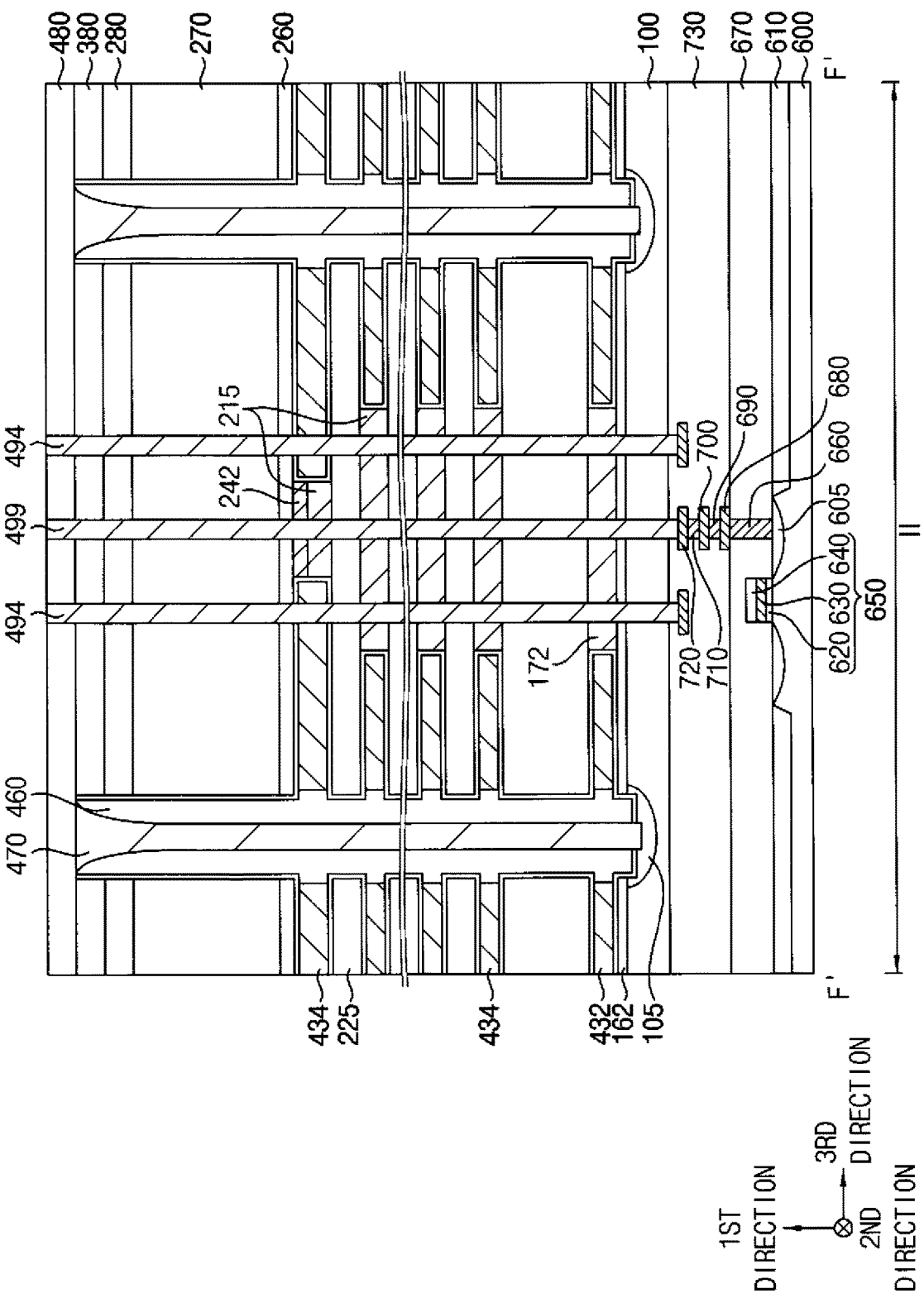

FIGS. 56 to 59 are a plan view and cross-sectional views illustrating a vertical memory device in accordance with exemplary embodiments of the inventive concept. Particularly, FIG. 56 is the plan view, FIG. 57 is a cross-sectional view taken along line B-B' of FIG. 56, FIG. 58 is a cross-sectional view taken along line E-E' of FIG. 56, and FIG. 59 is a cross-sectional view taken along F-F' of FIG. 56. This vertical memory device may be substantially the same as or similar to that illustrated with reference to FIGS. 44 to 47, except for some elements. Thus, like reference numerals may refer to like elements, and repetitive descriptions thereon are omitted herein.

This vertical memory device may have a cell over periphery (COP) structure. In other words, circuit patterns for driving memory cells may be formed not only on a peripheral circuit region, but also formed under the memory cells. Thus, a region in which lower circuit patterns may be formed may be referred to as a lower circuit region.

Referring to FIGS. 56 to 59, lower circuit patterns may be formed on a lower substrate 600, and first and second lower insulating interlayers 670 and 730 may be formed on the lower substrate 600 to cover the lower circuit patterns.

The lower substrate 600 may include a field region on which an isolation pattern 610 is formed and an active region. The lower circuit patterns may include, e.g., transistors, lower contact plugs, lower wirings, lower vias, etc. For example, a transistor may include a second gate structure 650 on the lower substrate 600 and a second impurity region 605 at an upper portion of the active region adjacent to the second gate structure 650. The second gate structure 650 may include a second gate insulation pattern 620, a second gate electrode pattern 630 and a second gate mask 640 sequentially stacked on the lower substrate 600.

The first lower insulating interlayer 670 may be formed on the lower substrate 600 to cover the transistor, and the lower contact plug 660 may extend through the first lower insulating interlayer 670 to contact the second impurity region 605 or the second gate electrode pattern 630. The first lower wiring 680 may be formed on the first lower insulating interlayer 670 to contact an upper surface of the lower contact plug 660. A first lower via 690, a second lower wiring 700, a second lower via 710 and a third lower wiring 720 may be sequentially stacked on the first lower wiring 680. In exemplary embodiments of the inventive concept, a plurality of third lower wirings 720 may be formed in the third direction. The plurality of third lower wirings 720 may be spaced apart from each other along the third direction. The second lower insulating interlayer 730 may be formed on the first lower insulating interlayer 670 to cover the first to third lower wirings 680, 700 and 720 and the first and second lower vias 690 and 710.

In exemplary embodiments of the inventive concept, each of the first to second contact plugs 492 and 494 may extend from above to contact each of the third lower wirings 720, and thus may be electrically connected to the lower circuit patterns.

The vertical memory device may further include a fifth contact plug 499 extending through the first to fifth insulating interlayers 190, 270, 280, 360 and 480, the fourth insulation, layer 260, the first insulation pad 242, the first and second sacrificial patterns 172 and 215, the first and third insulation patterns 162 and 225 and the substrate 100 to contact the third lower wiring 720. In exemplary embodiments of the inventive concept, the fifth contact plug 499 may be formed at an area where the second sacrificial pattern 215 remains between neighboring ones of the first CSLs 470 in the third direction. The fifth contact plug 499 may be disposed between a pair of second contact plugs 494 along the third direction.

Figure 60:
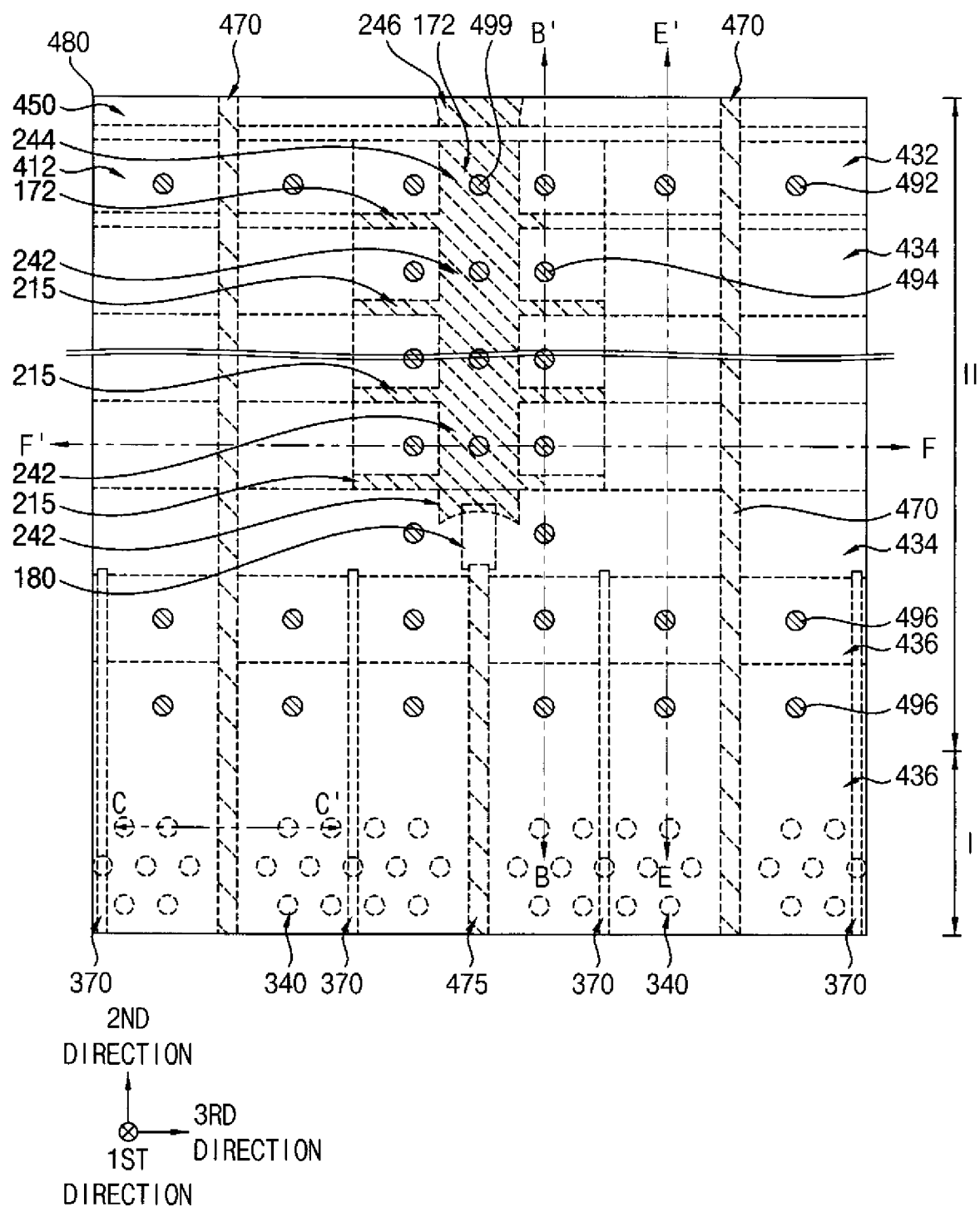
FIGS. 60, 61 and 62 are a plan view and cross-sectional views illustrating a vertical memory device in accordance with exemplary embodiments of the inventive concept.
Figure 61:
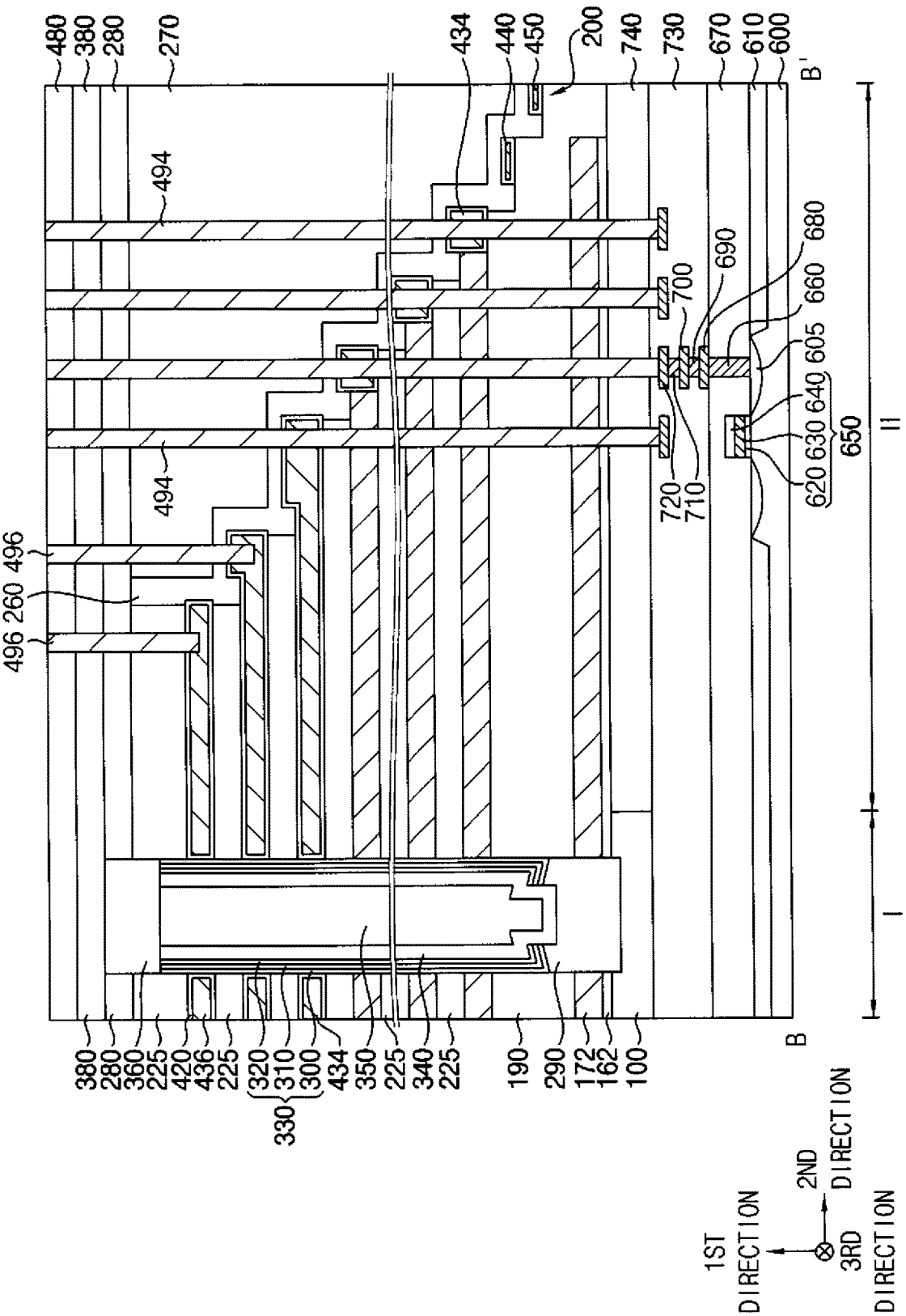
Figure 62:
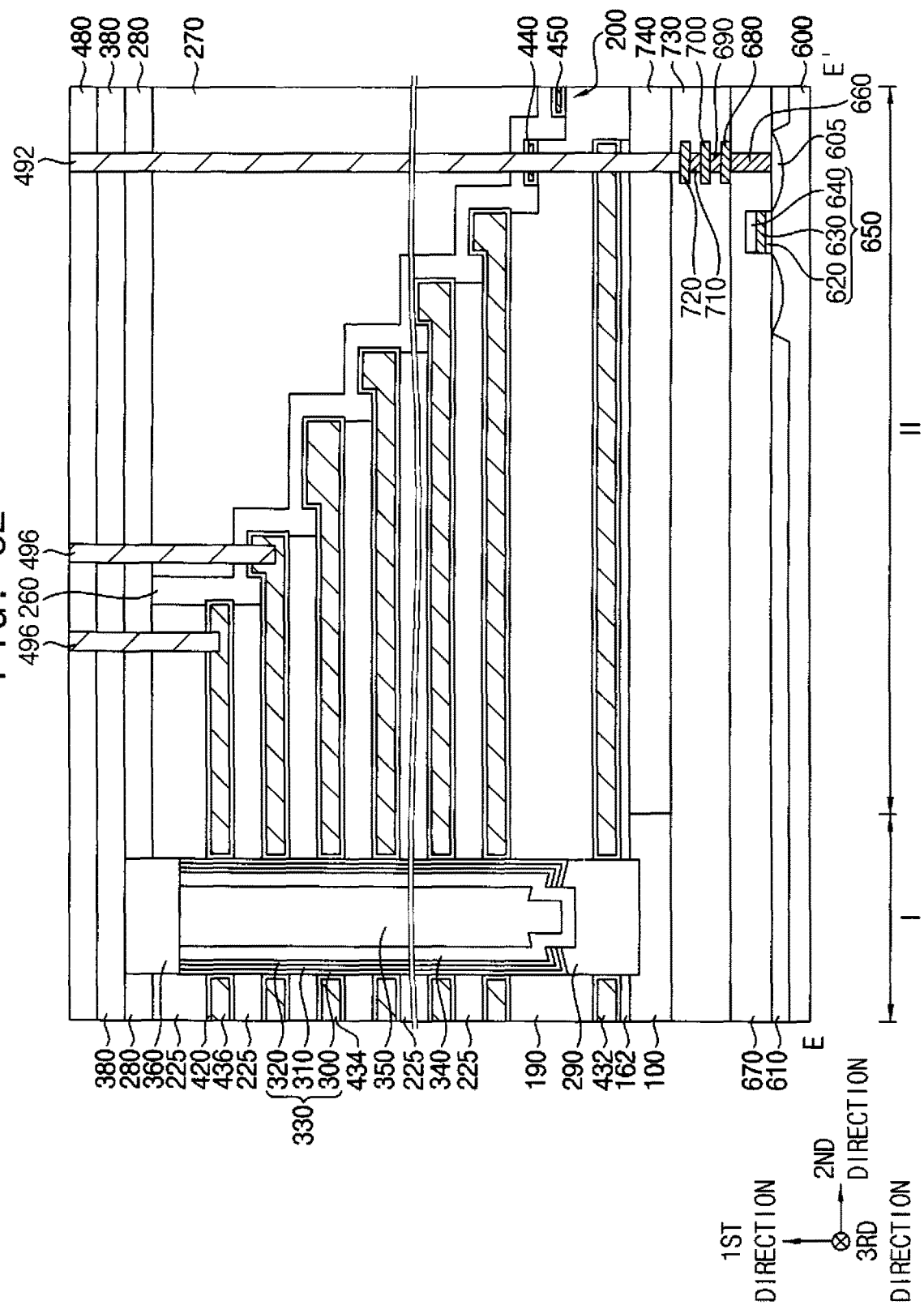

FIGS. 60 to 62 are a plan view and cross-sectional views illustrating a vertical memory device in accordance with exemplary embodiments of the inventive concept. Particularly, FIG. 60 is the plan view, FIG. 61 is a cross-sectional view taken along line B-B' of FIG. 60, and FIG. 62 is a cross-sectional view taken along line E-E' of FIG. 60.

Referring to FIGS. 60 to 62, circuit patterns for driving memory cells may not be formed on a peripheral circuit region, but formed under the memory cells only.

Unlike the lower substrate 600, the substrate 100 may be formed only on the first region I, and a fifth insulation layer 740 may be substituted for the substrate 100 on the second and third regions II and IIII.

Figure 81:
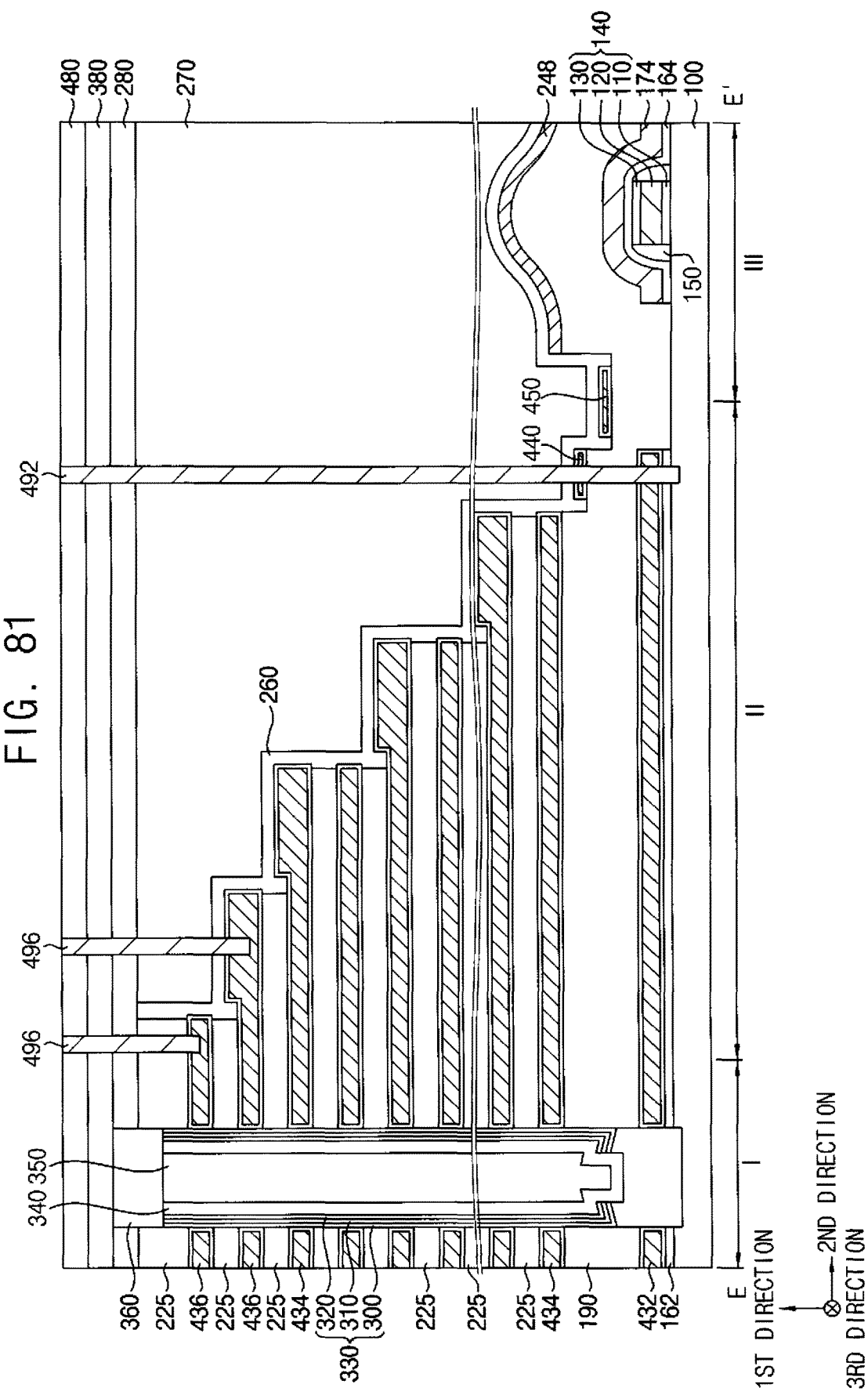
Figure 82:
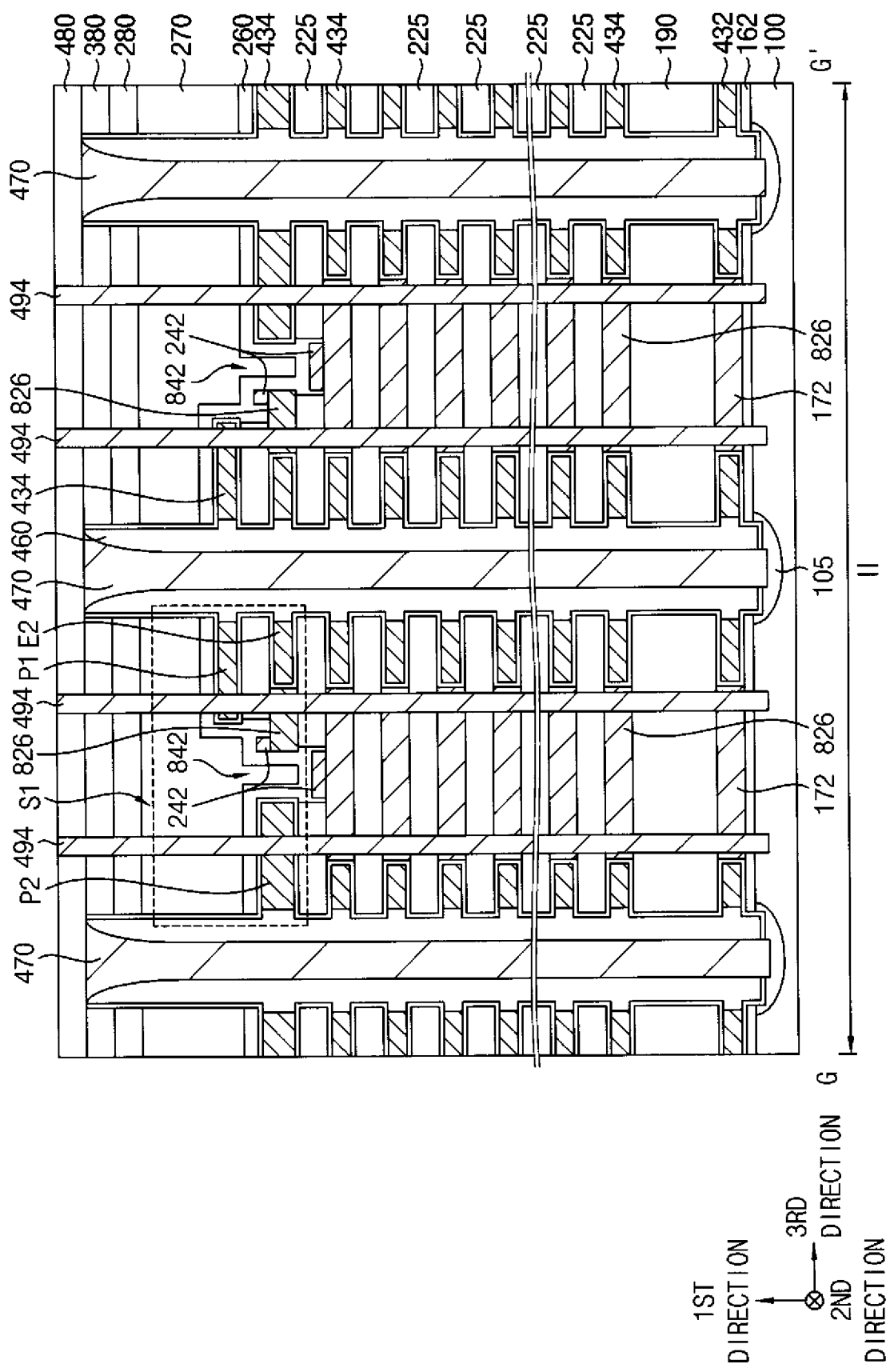

FIGS. 63 to 82 are a plan view, cross-sectional views, and perspective views illustrating a method of manufacturing a vertical memory device in accordance with exemplary embodiments of the inventive concept. Particularly, FIG. 79 is the plan view, FIGS. 72-78 and 80-82 are the cross-sectional views, and FIGS. 63-71 are the perspective views. Each of these drawings corresponds to the region Y of FIG. 1; however, the perspective views do not show the third region of the region Y. FIGS. 72, 74, 76 and 80 are cross-sectional views taken along line B-B' of FIG. 1, FIGS. 77 and 81 are cross-sectional views taken along line E-E' of FIG. 1, and FIGS. 73, 75, 78 and 82 are cross-sectional views taken along line G-G' of FIG. 1.

The perspective views do not show insulation layers and a second etch stop layer 210, and show only sacrificial layers 210 and a first insulating interlayer 190. Etching processes of the sacrificial layers 210, which will be illustrated later, may be performed on each sacrificial layer 210 and a third insulation layer 220 directly on each sacrificial layer 210 that form a pair. For the convenience of explanation, when the etching processes are illustrated with reference to the perspective views, the third insulation layers 220 are not explained.

This method may include processes substantially the same as or similar to FIGS. 48 to 55 and FIGS. 44 to 47, and thus repetitive descriptions thereon are omitted herein.

Figure 63:
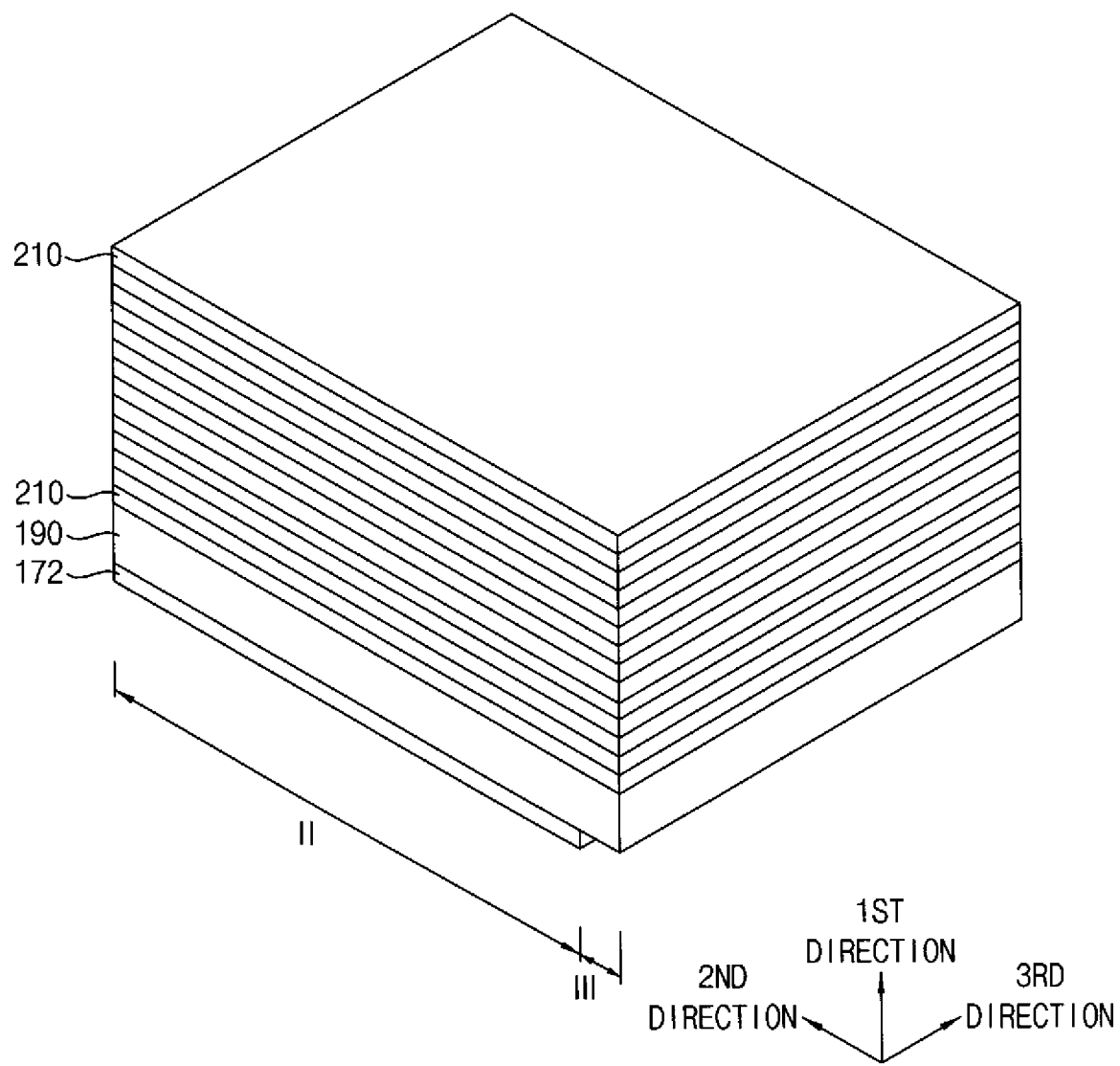
FIGS. 63, 64, 65, 66, 67, 68, 69, 70, 71, 72, 73, 74, 75, 76, 77, 78, 79, 80, 81 and 82 are a plan view, cross-sectional views, and perspective views illustrating a method of manufacturing a vertical memory device in accordance with exemplary embodiments of the inventive concept.

Referring to FIG. 63, processes substantially the same as or similar to FIGS. 6 and 7 may be performed, and the sacrificial layer 210 and the third insulation layer 220 may be alternately and repeatedly stacked on the first insulating interlayer 190. Thus, a plurality of sacrificial layers 210 and a plurality of third insulation layers 220 may be alternately stacked in the first direction. A second etch stop layer 230 (refer to FIG. 72) may be further formed on an uppermost one of the third insulation layers 220.

Figure 64:
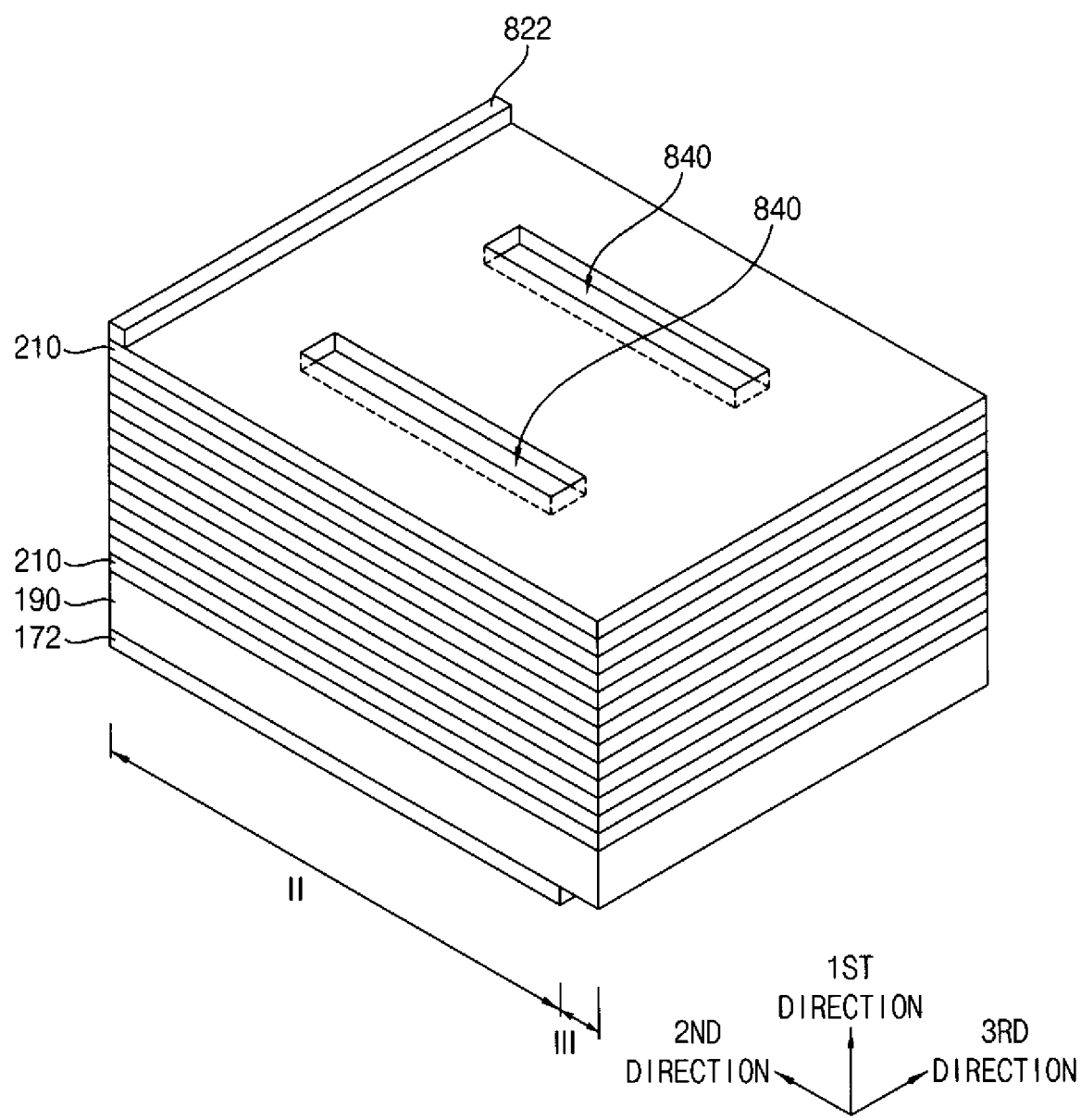

Referring to FIG. 64, a first photoresist pattern covering the first region I and an edge portion of the second region II adjacent thereto may be formed on the second etch stop layer 230. Here, the second etch stop layer 230 and an uppermost one of the sacrificial layers 210 may be etched using the first photoresist pattern as an etching mask to form a third sacrificial pattern 822 having a rectangular ring shape surrounding a portion of the uppermost one of the sacrificial layers 210 on the first region I of the substrate 100.

However, FIG. 64 shows only a portion of the second region II of the substrate 100, in other words, a portion of the region Y, and thus a portion of the rectangular ring shape of the third sacrificial pattern 822, in other words, a bar shape is shown. Hereinafter, instead of the whole shape of various sacrificial patterns that may be formed by etching the sacrificial layers 210 on the second region II, only shapes of the sacrificial patterns in the region Y will be illustrated. Additionally, when a process of forming a mold illustrated with reference to the perspective views is performed, the portion of the sacrificial layer 210 on the first region I of the substrate 100 may be always covered by photoresist patterns, and thus no additional explanation about the sacrificial patterns on the first region I of the substrate 100 will be provided.

After forming the third sacrificial pattern 822, the first photoresist pattern may be removed by, e.g., an ashing and/or a stripping process.

One of the sacrificial layers 210 at a second level from the uppermost level (hereinafter, art n-th level from the uppermost level will be referred to as an n-th level) may be partially removed to form a fifth opening 840 exposing one of the sacrificial layers 210 at a third level. In an exemplary embodiment of the inventive concept, the fifth opening 840 may extend in the second direction on the second region II of the substrate 100, and a plurality of fifth openings 840 may be formed to be spaced apart from each other in the third direction. Additionally, a plurality of fifth openings 840 may be also formed to be spaced apart from each other in the second direction.

Figure 65:
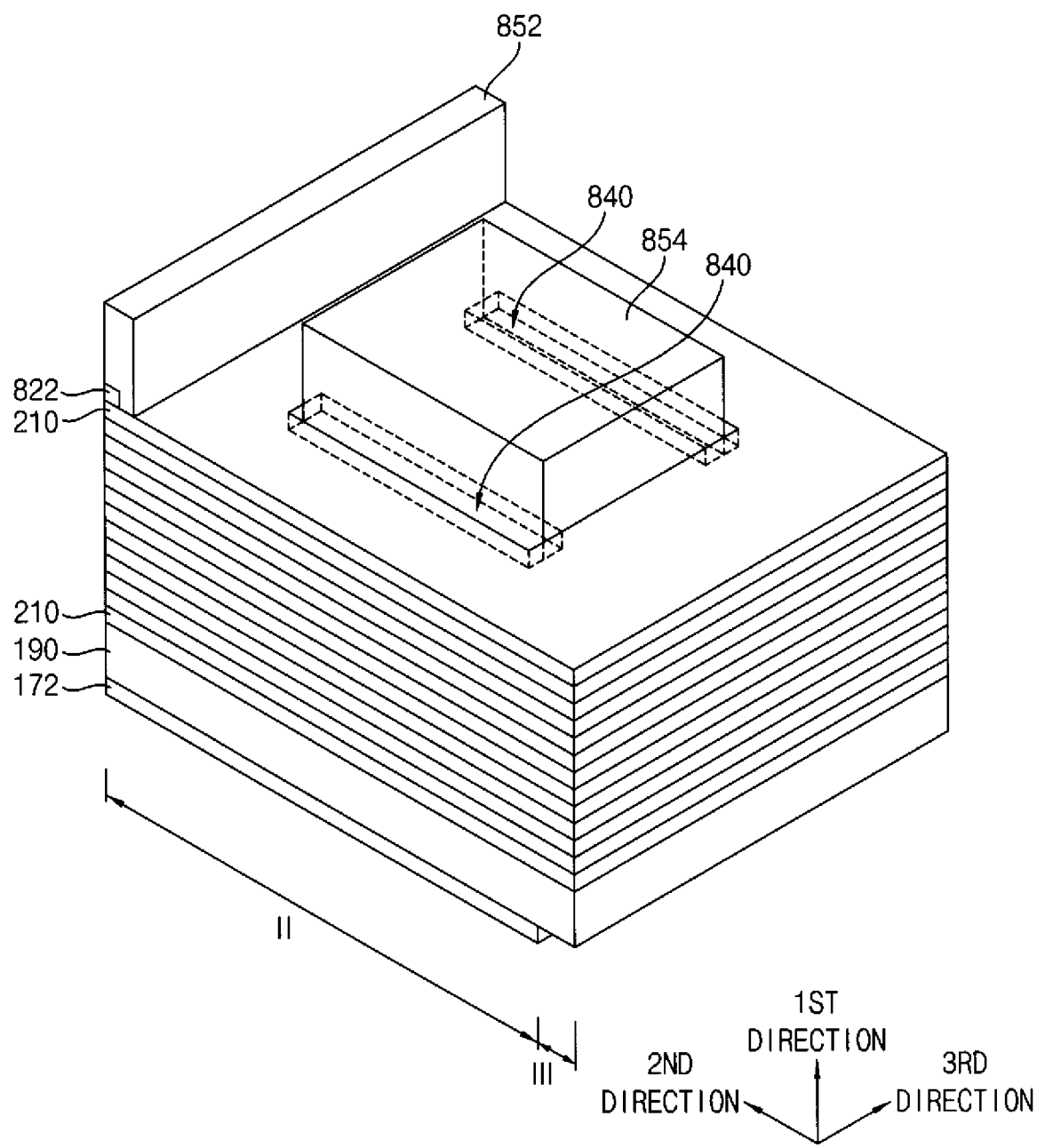

Referring to FIG. 65, a second photoresist pattern 852 covering the third sacrificial pattern 822 and having a length greater than that of the third sacrificial pattern 822 in the second direction and a third photoresist pattern 854 covering a portion of the sacrificial layer 210 in the region Y and having a rectangular shape in a plan view spaced apart from the second, photoresist pattern 852 in the second direction may be formed on the second etch stop layer 230 and the one of the sacrificial layers 120 at the second level.

In exemplary embodiments of the inventive concept, the third photoresist pattern 854 may partially cover each of the fifth openings 840 spaced apart from each other in the third direction. Thus, for example, each end of the third photoresist pattern 854 in the third direction may overlap a central portion of each of the fifth openings 840 in the third direction, and each end of the third photoresist pattern 854 in the second direction may overlap each end of the fifth openings 840 in the second direction.

When a plurality of fifth openings 840 is formed in the second direction, a plurality of third photoresist patterns 854 may be formed to be spaced apart from each other in the second direction.

Figure 66:
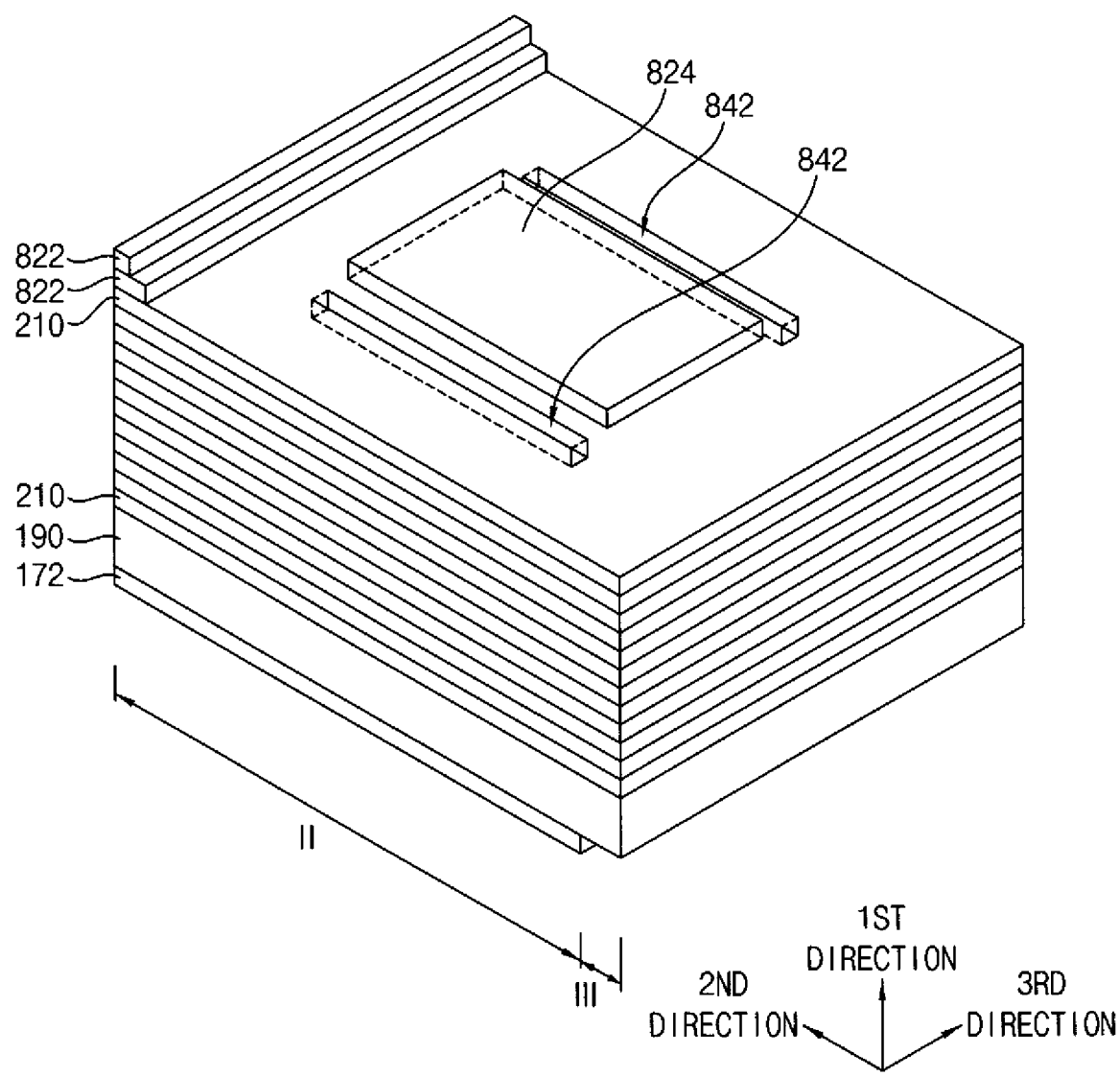

Referring to FIG. 66, the one of the sacrificial layers 210 at the second level may be etched using the second and third photoresist patterns 852 and 854 as an etching mask.

Thus, the third sacrificial pattern 822 may be further formed under the third sacrificial pattern 822 at a first level, in other words, at the second level to have a length greater than that of the third sacrificial pattern 822 at the first level, and a fourth sacrificial pattern 824, which may have a rectangular shape in a plan view, may be formed at the second level.

A portion of the fifth opening 840 at the second level, in other words, a portion of the fifth opening 840 not covered by the third photoresist pattern 854 may be transferred to the third level to form a sixth opening 842. Thus, the fourth sacrificial pattern 824 at the second level and the sixth opening 842 at the third level may be spaced apart from each other in the third direction.

Figure 67:
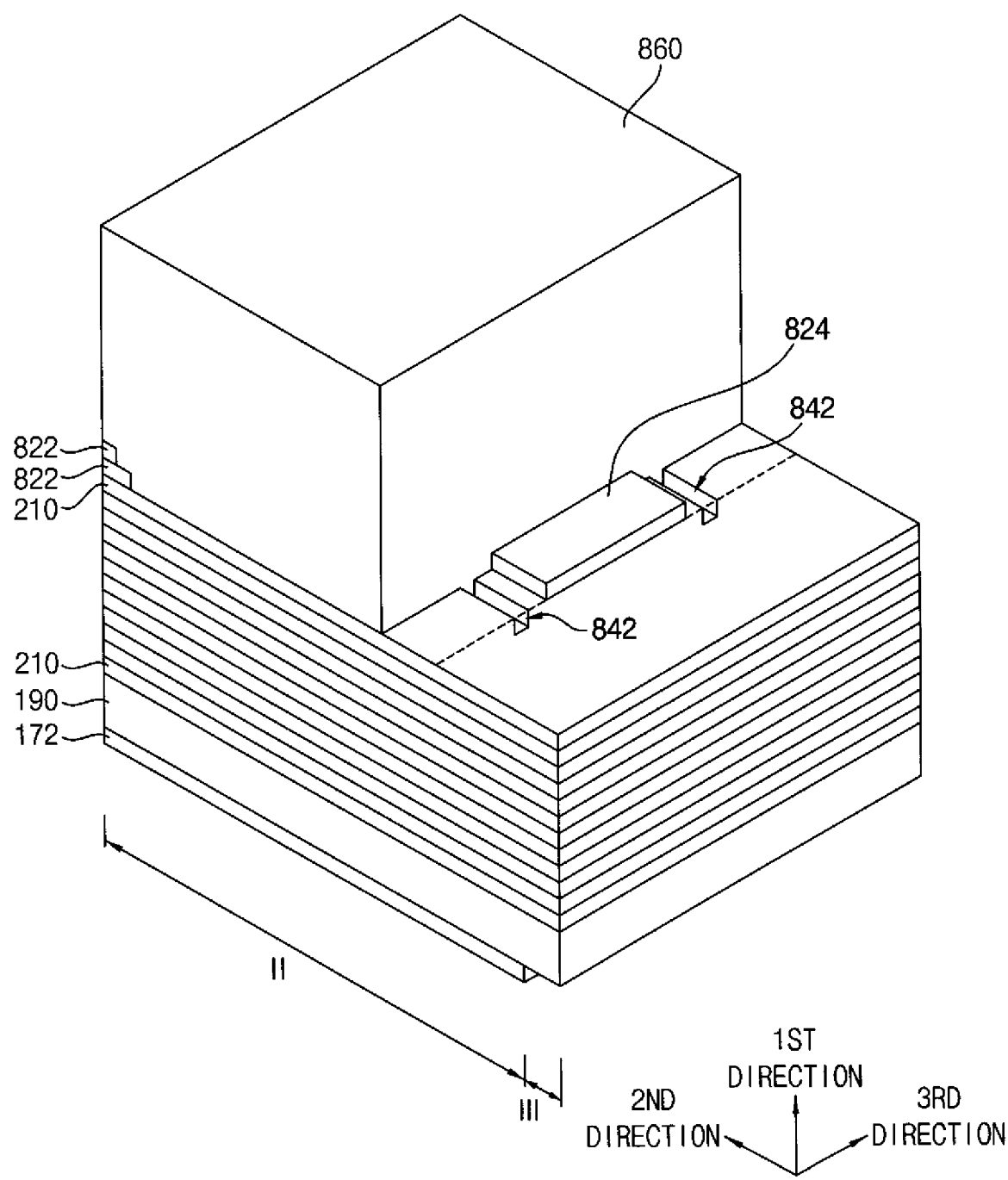

Referring to FIG. 67, after removing the second and third photoresist patterns 852 and 854, a fourth photoresist pattern 860 covering a portion of the fourth sacrificial pattern 824 may be formed on the second etch stop layer 230 and the one of the sacrificial layers at the third level.

In exemplary embodiments of the inventive concept, in a plan view, the fourth photoresist pattern 860 may have a bar shape extending in the third direction, and may expose an end portion of the fourth sacrificial pattern 824 in the second direction.

Figure 68:
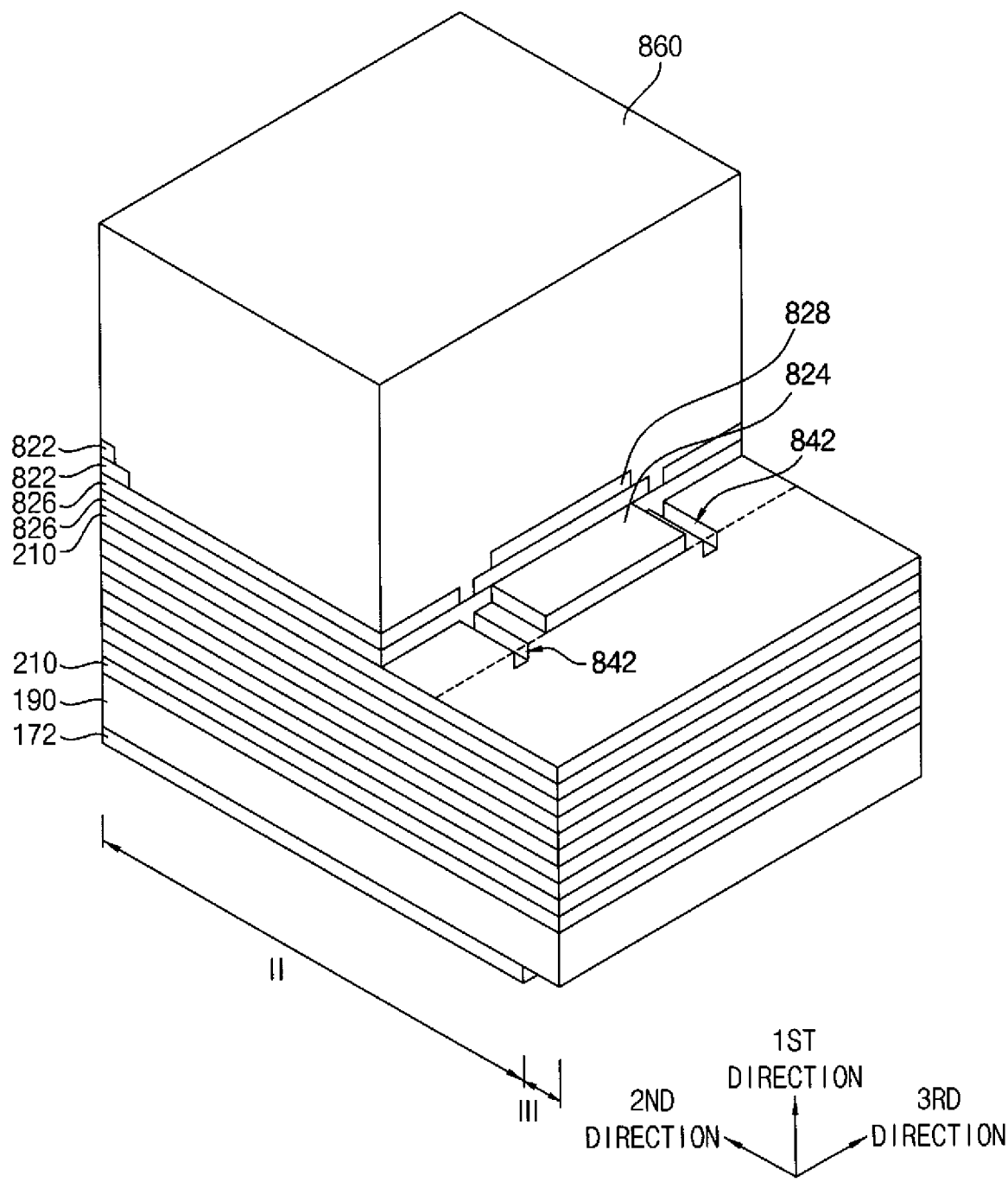

Referring to FIG. 68, the fourth sacrificial pattern 824 and ones of the sacrificial layers 210 at the third level and a fourth level may be etched using the fourth photoresist pattern 860 as an etching mask.

Thus, fifth sacrificial patterns 826 having a length in the second direction greater than those of the third sacrificial patterns 822 may be formed at the third and fourth levels, respectively, the portion of the fourth sacrificial pattern 824 not covered by the fourth photoresist pattern 860 may be moved from the second level to the fourth level, and the sixth opening 842 at the third level may be moved to a fifth level. A portion of the fourth sacrificial pattern 824 covered by the fourth photoresist pattern 860 not to be removed may be transformed into a sixth sacrificial pattern 828, and may remain on the one of the fifth sacrificial patterns 826 at the third level.

The sacrificial layers 210 at respective two levels have been etched using the fourth photoresist pattern 860 as an etching mask by the etching process, however, the inventive concept is not limited thereto, and the sacrificial layers 210 at more than two levels may be etched.

Figure 69:
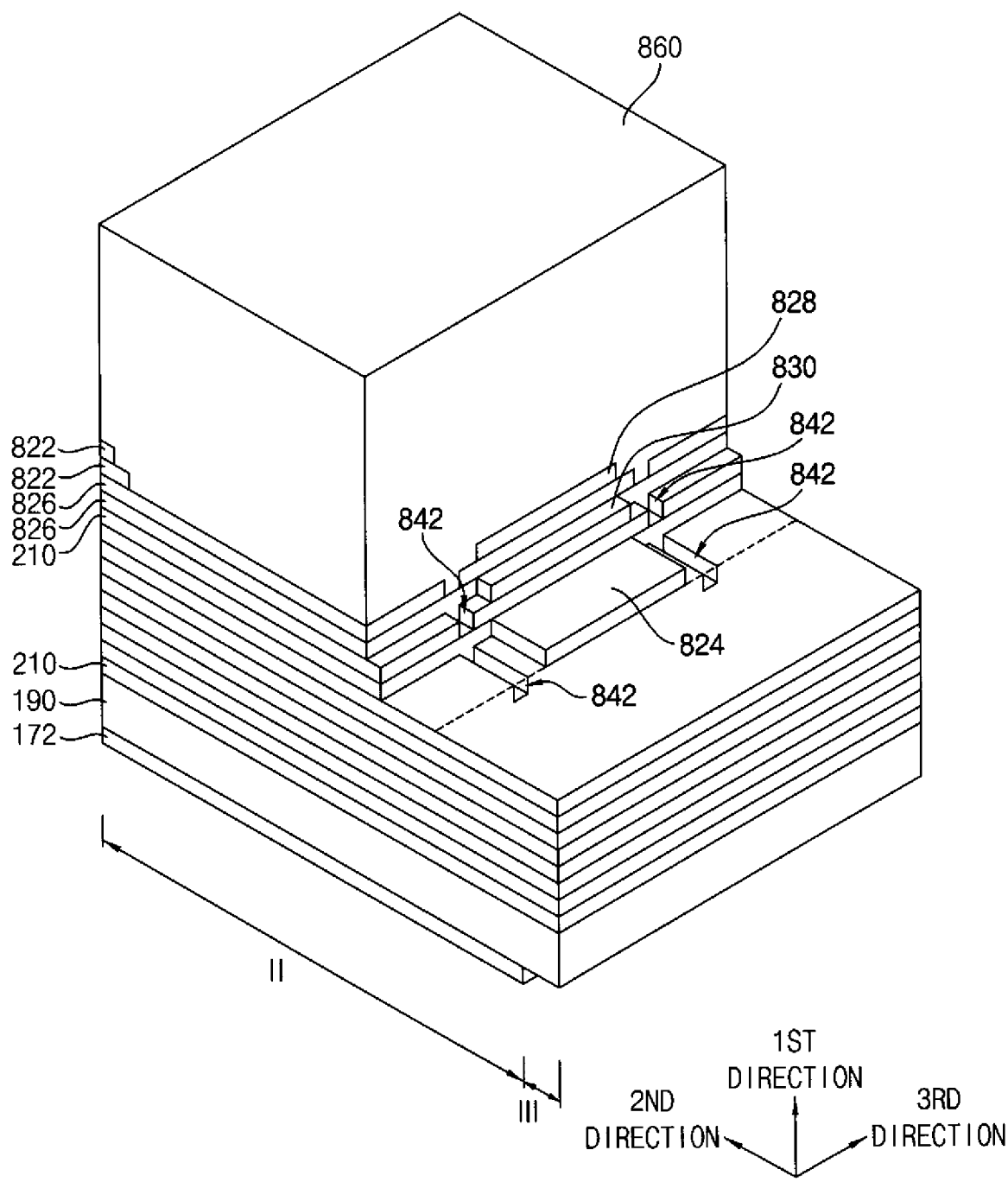

Referring to FIG. 69, a trimming process in which an area of the fourth photoresist pattern 860 is reduced may be performed to partially expose the fifth and sixth sacrificial patterns 826 and 828, and the fourth to sixth sacrificial patterns 824, 826 and 828 and the sacrificial layers 120 at the fifth level and a sixth level, respectively, may be etched using the reduced fourth photoresist pattern 860 as an etching mask.

Thus, lengths in the second direction of the fifth sacrificial patterns 826 at the third and fourth levels may be reduced to be the same as each other, and the fifth sacrificial patterns 826 having a length greater than that of the fifth sacrificial patterns 826 at the third and fourth levels, respectively, may be further formed at the fifth and sixth levels, respectively. The exposed portion of the sixth sacrificial pattern 828 may be moved from the first level to the third level, which may be referred to as a seventh sacrificial pattern 830 hereinafter. The portion of the fourth sacrificial pattern 824 not covered by the fourth photoresist pattern 860 may be moved from the third level to the fifth level, and the sixth opening 842 at the fifth level may be moved to a seventh level.

Figure 70:
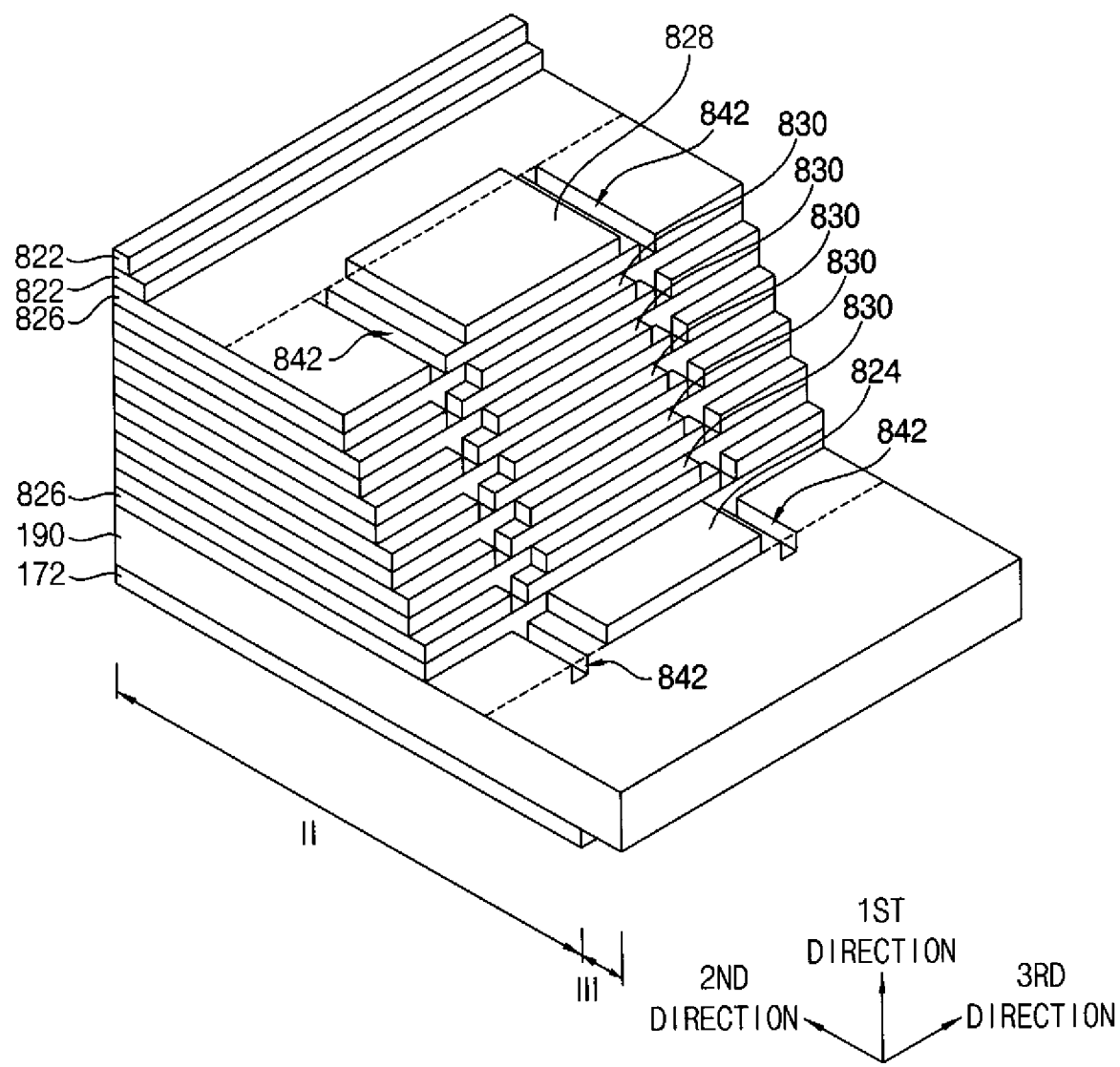

Referring to FIG. 70, processes substantially the same as or similar to FIGS. 68 and 69 may be repeatedly performed to form a mold having a staircase shape on the second region II of the substrate 100.

The mold may have steps disposed in the second direction. Further, in the mold, the fourth, fifth and seventh sacrificial patterns 824, 826 and 830 at an end portion of each level may be disposed in the third direction to form steps.

In some exemplary embodiments of the inventive concept, after removing the fourth photoresist pattern 860, a photoresist pattern may be further formed, and a trimming process and an etching process may be further performed so that a mold having more steps may be formed.

Figure 71:
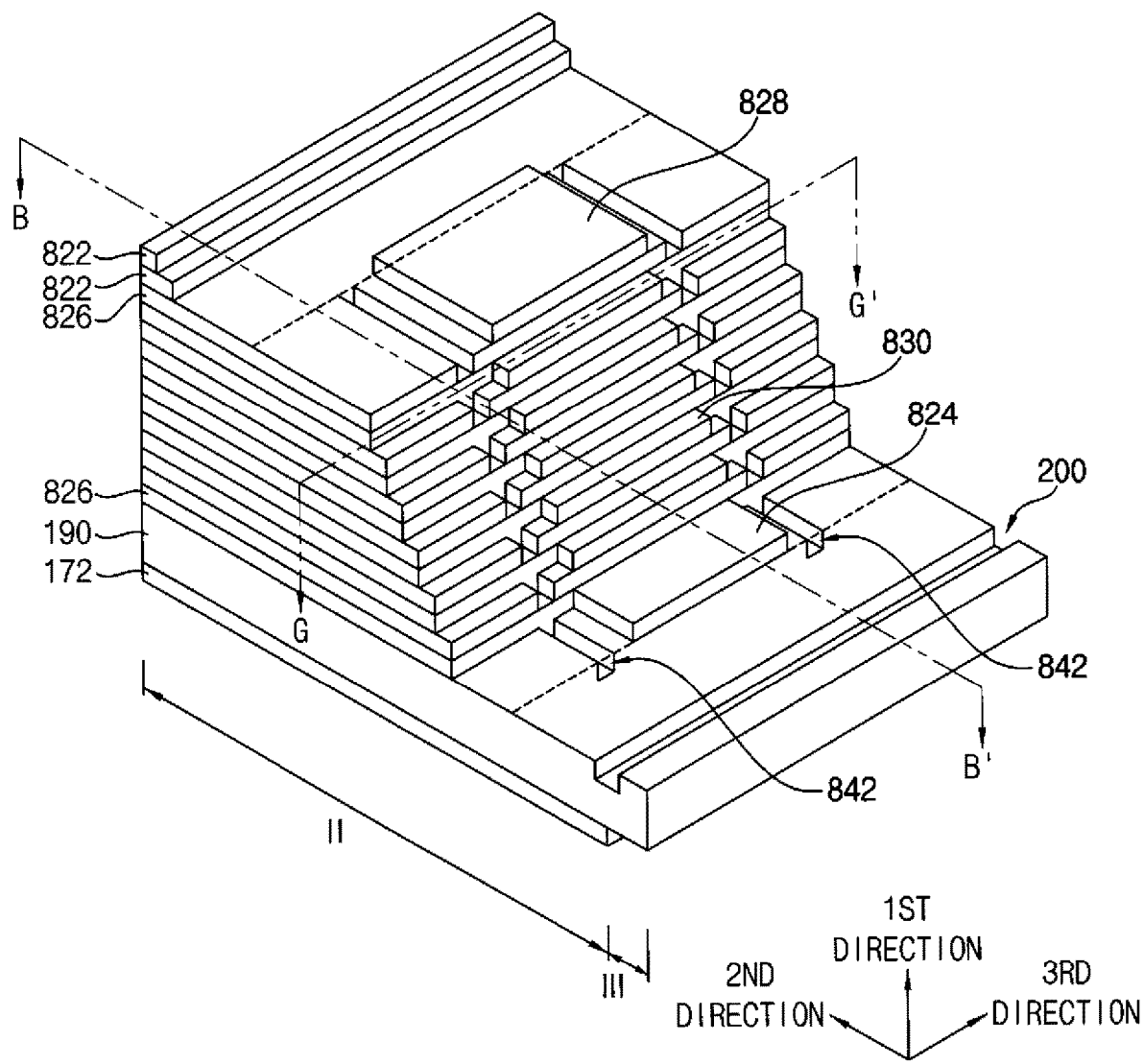
Figure 72:
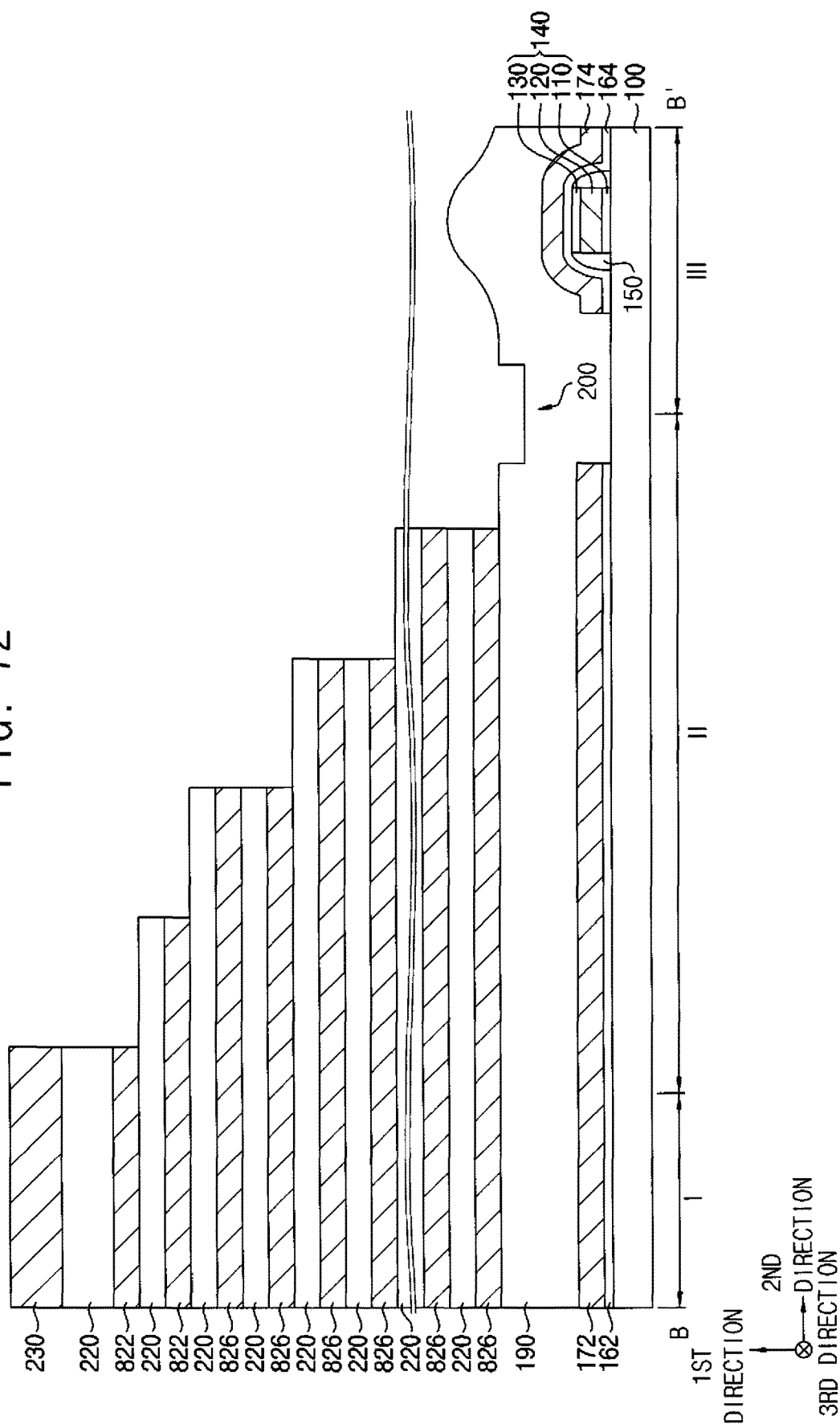
Figure 73:
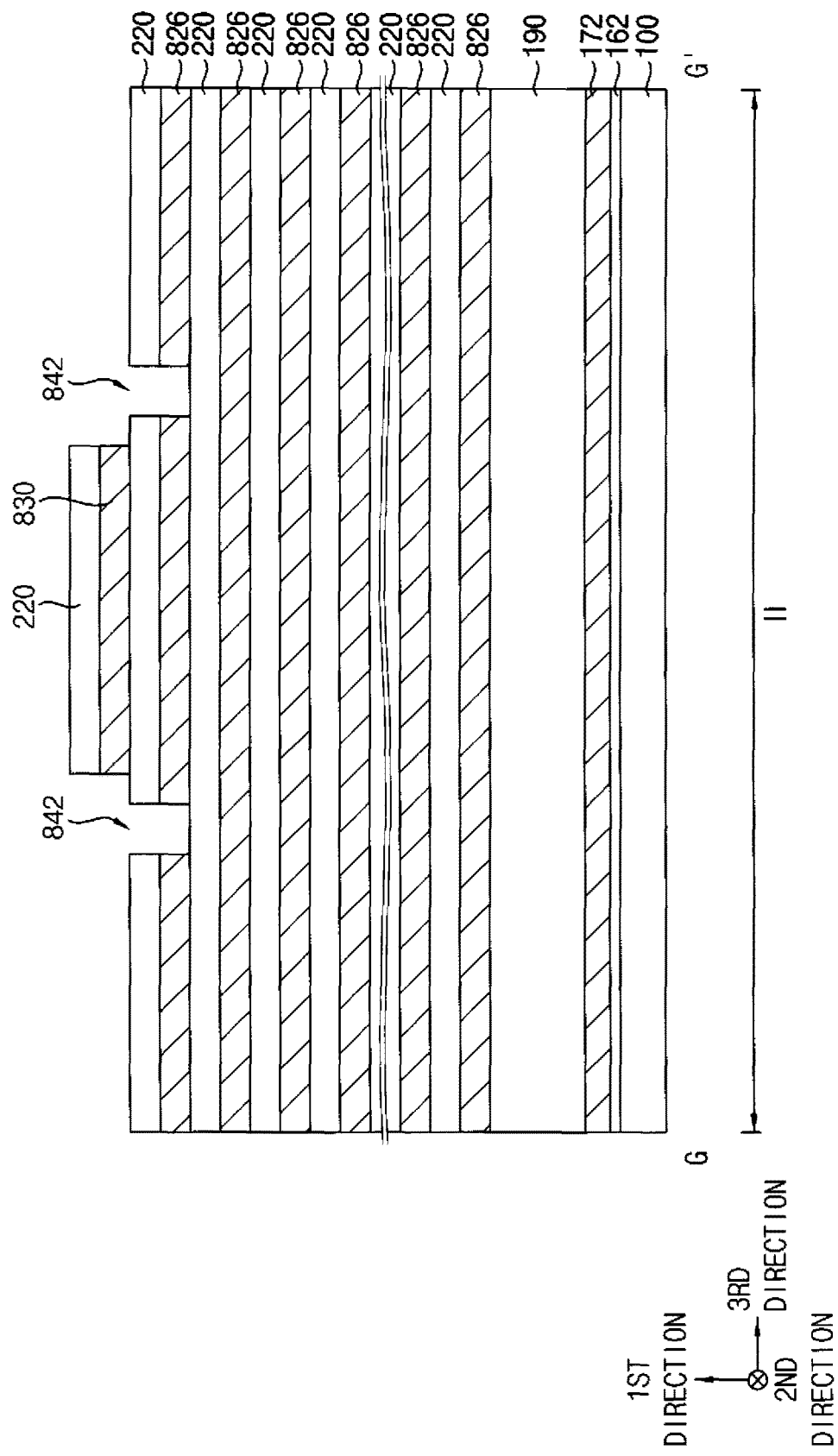

Referring to FIGS. 71 to 73, the recess 200 may be formed on the first insulating interlayer 190 at the boundary between the second and third regions II and III of the substrate 100.

Figure 74:
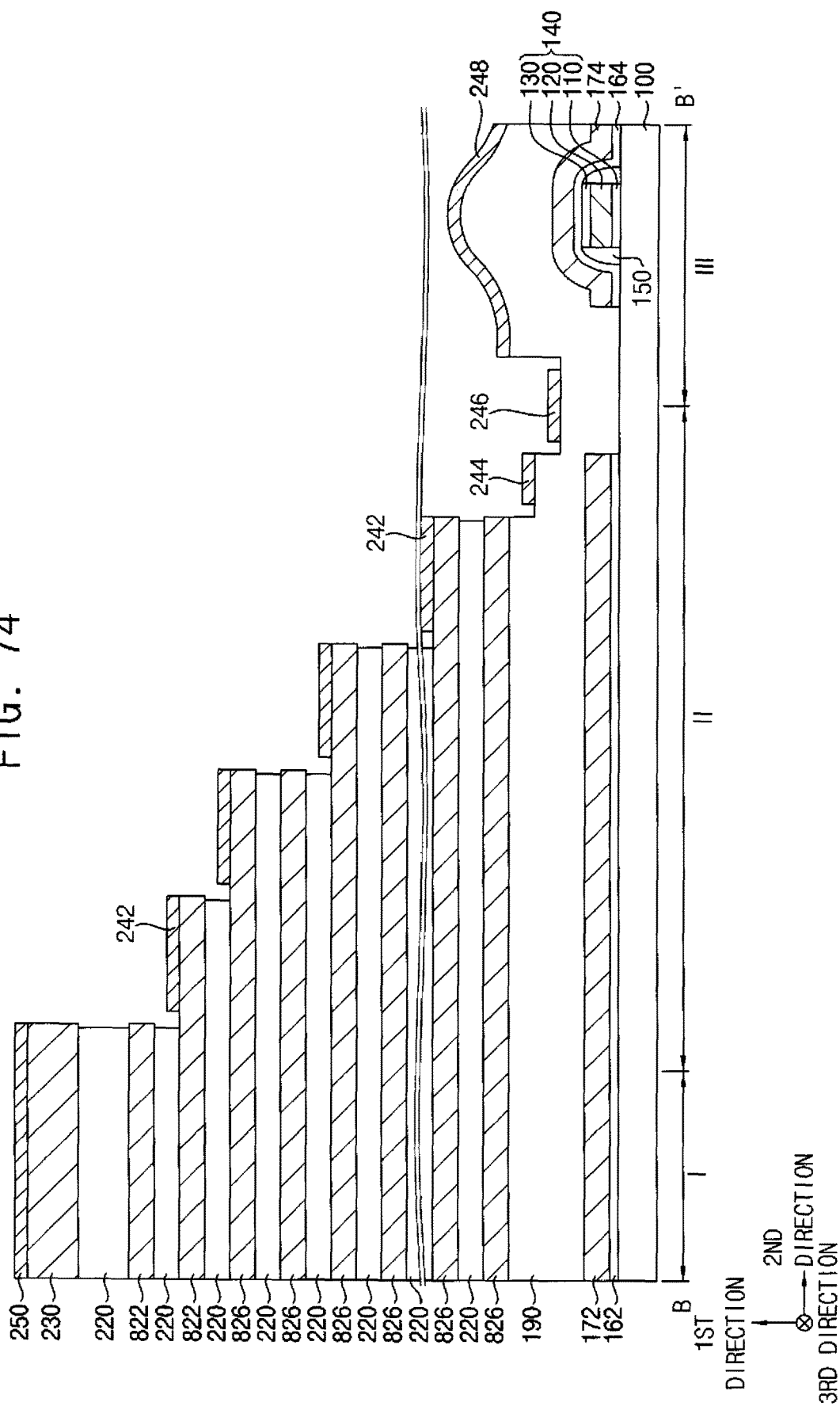
Figure 75:
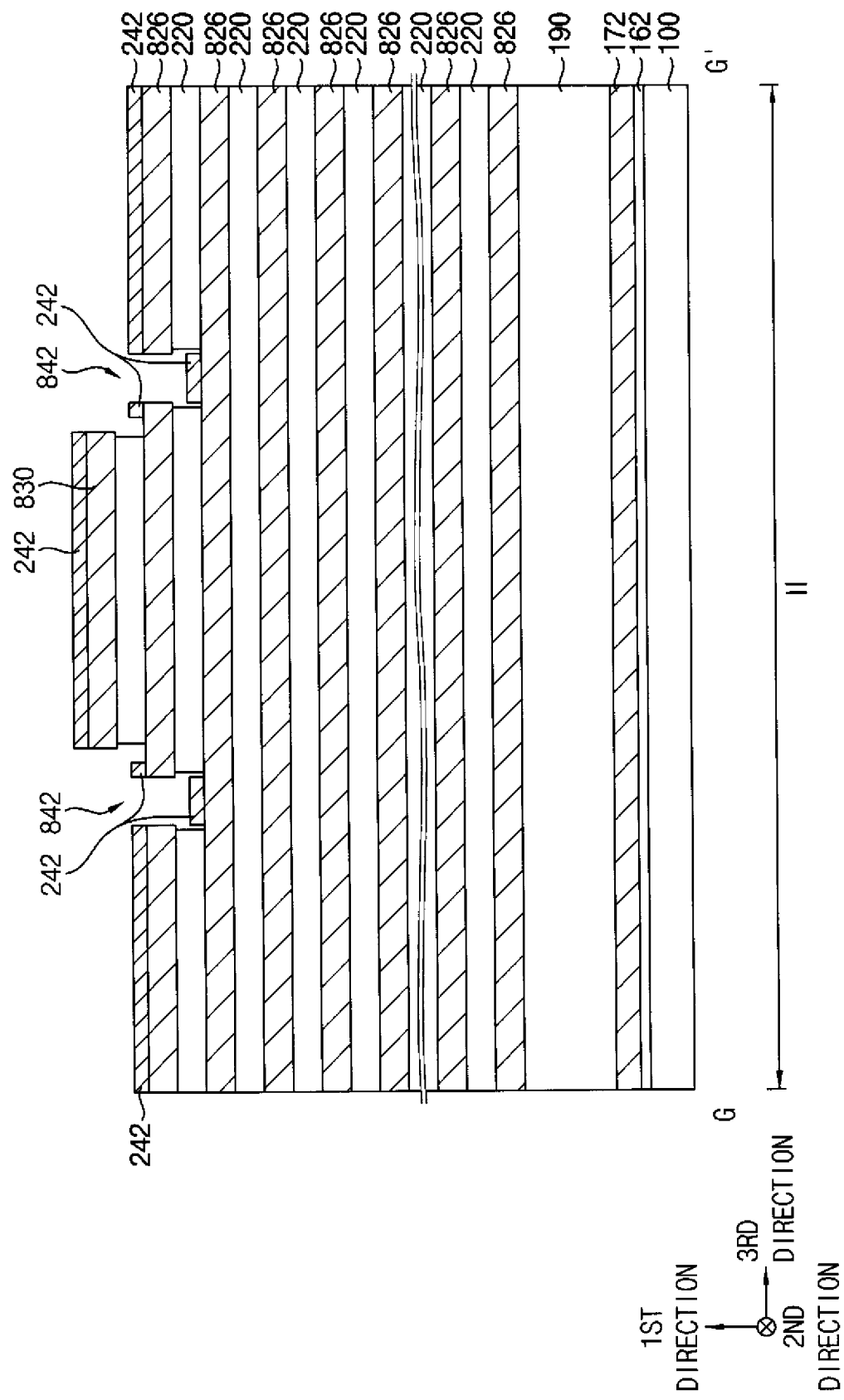

Referring to FIGS. 74 and 75, processes substantially the same as or similar to FIGS. 10 to 12 may be performed. The first insulation pad 242 may be formed on some sacrificial patterns (e.g., the fifth sacrificial pattern 826 as shown in FIG. 75) exposed by the sixth opening 842.

Figure 76:
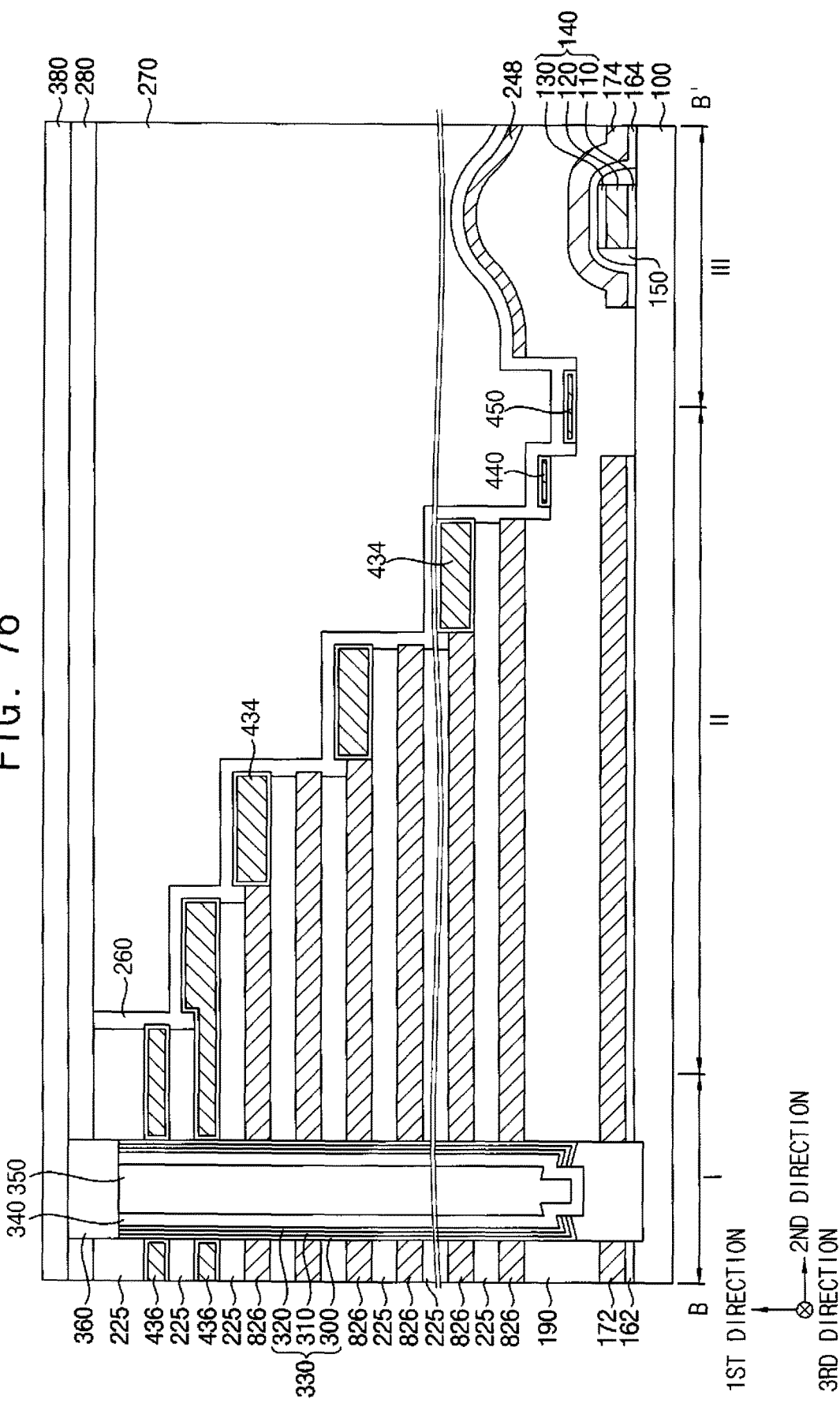
Figure 77:
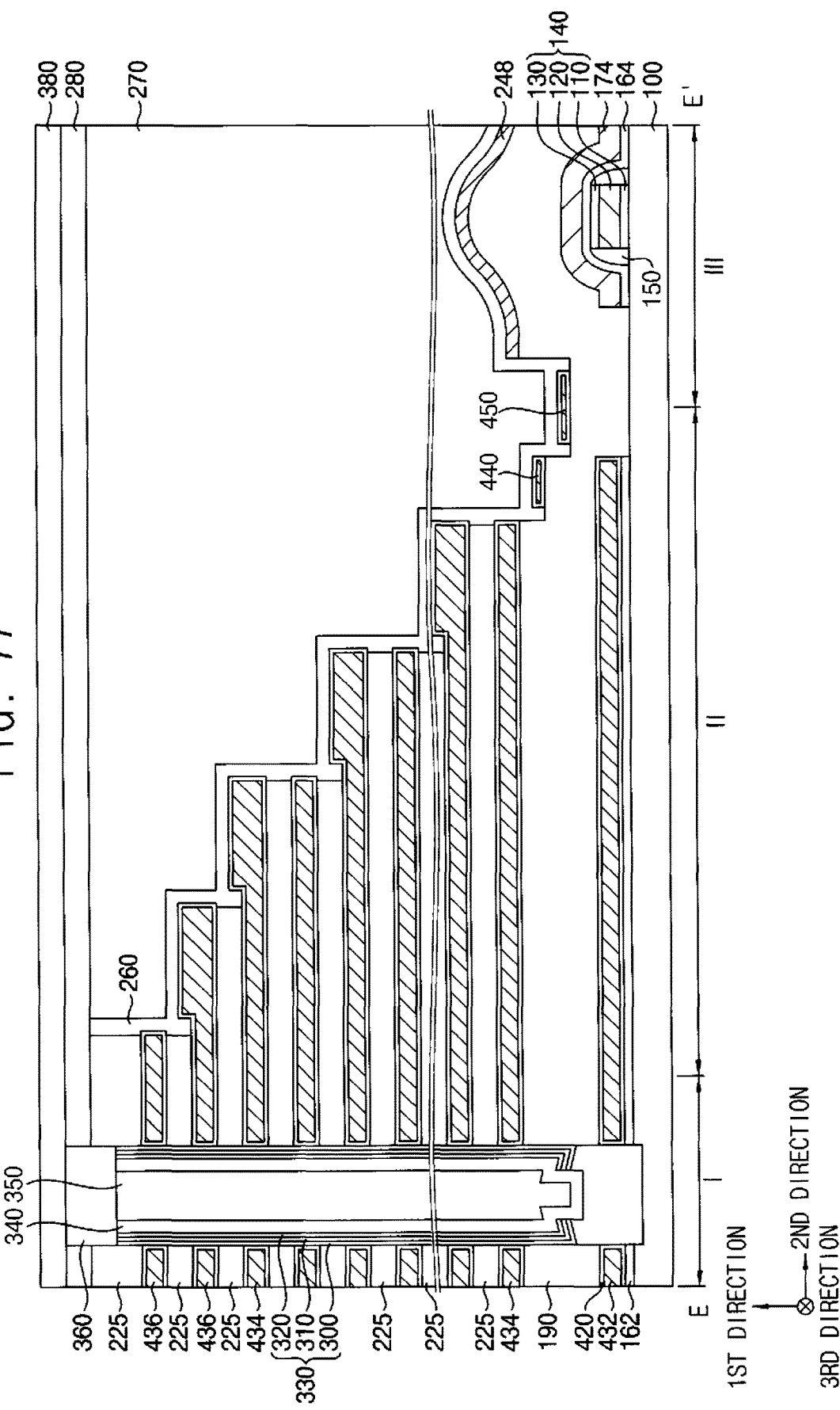
Figure 78:
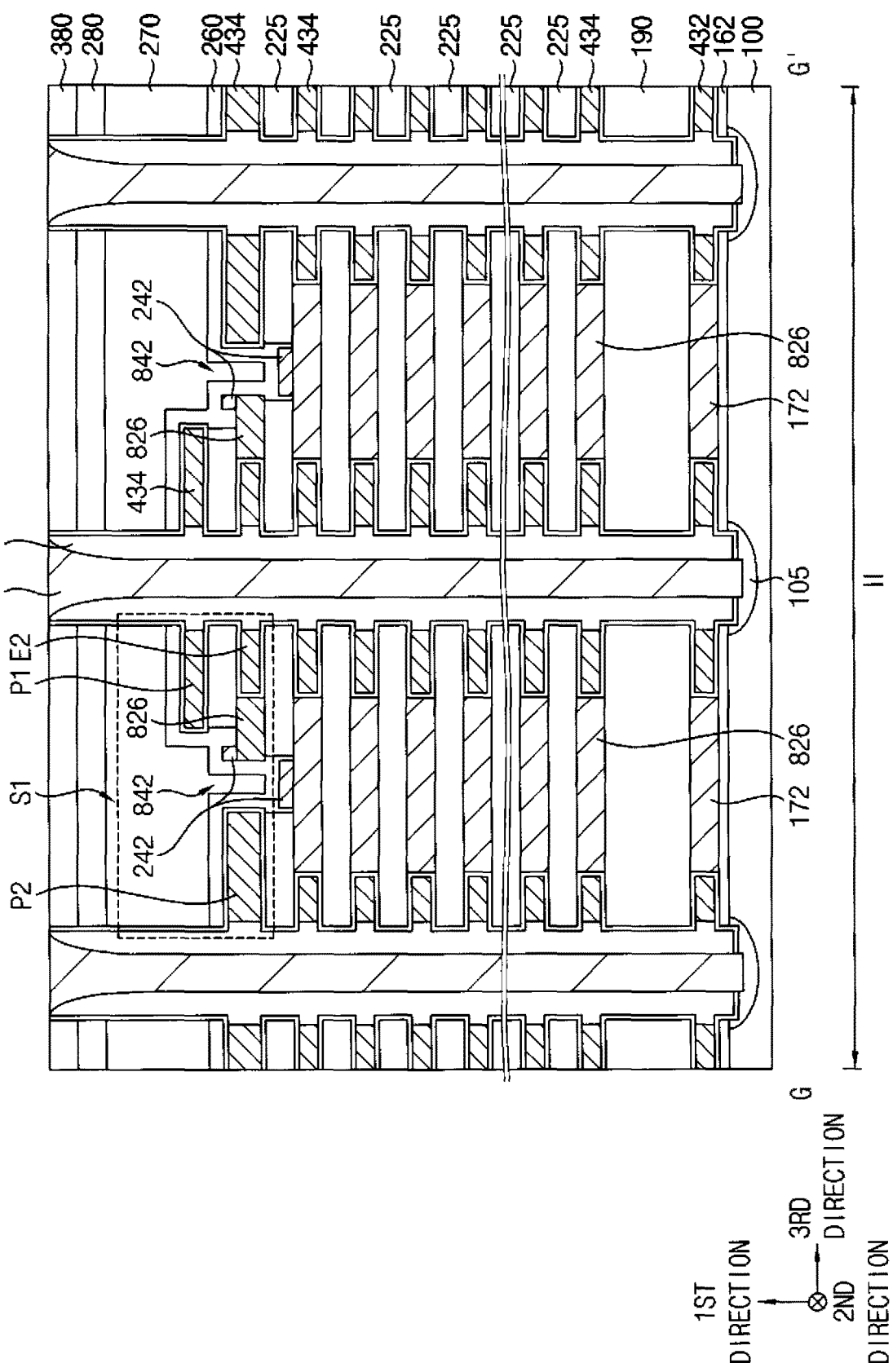
Figure 79:
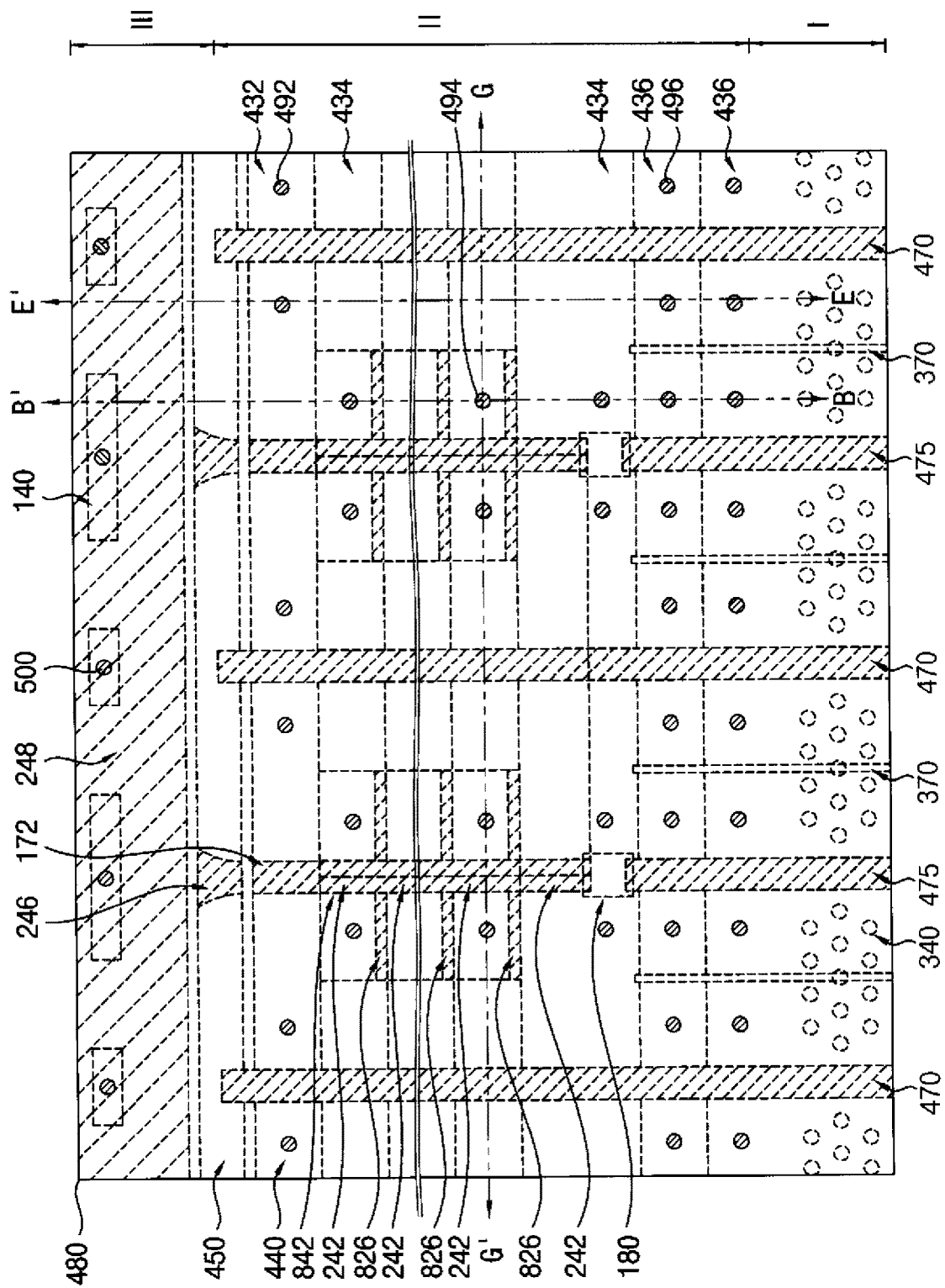
Figure 80:
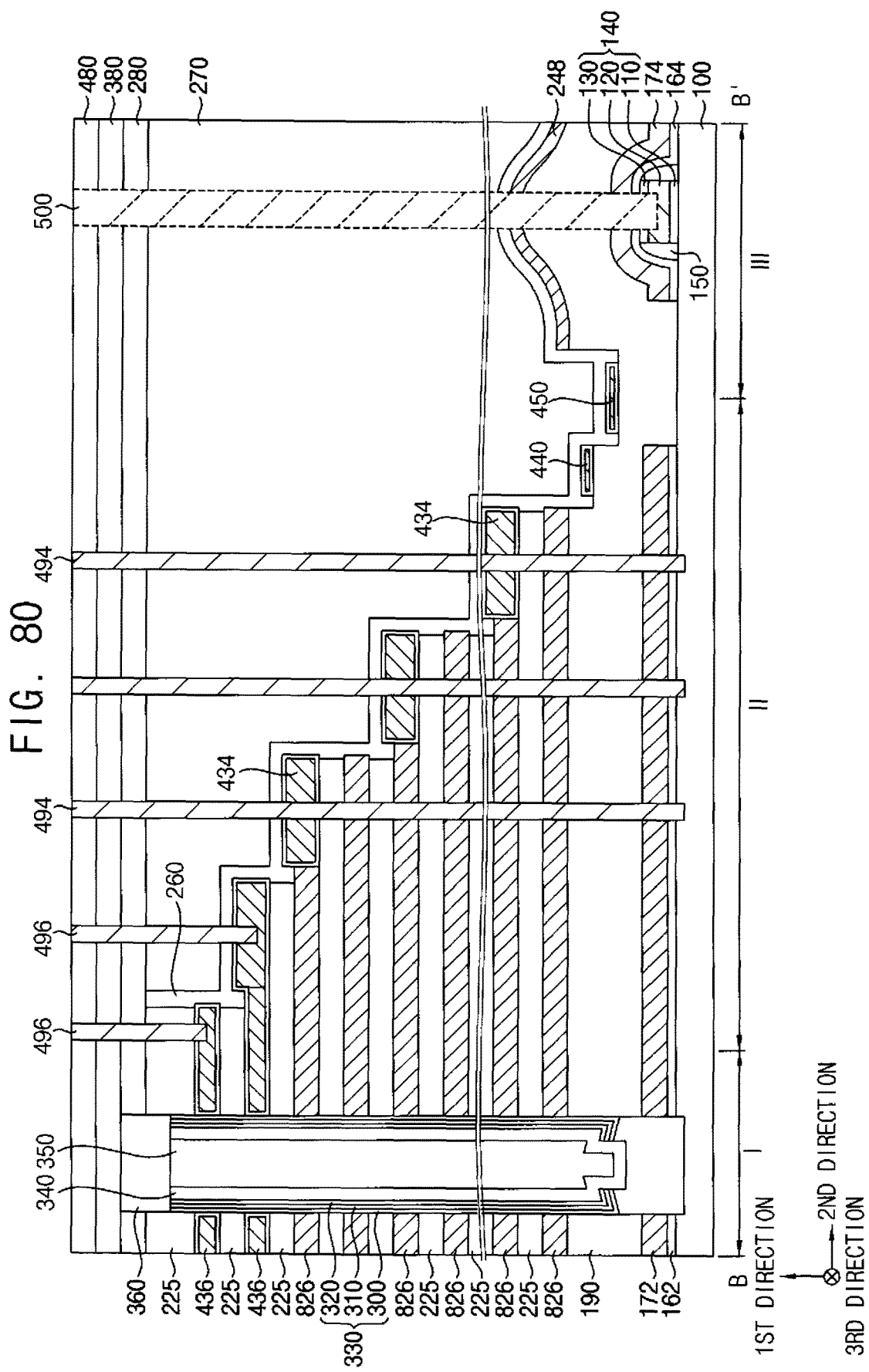

Referring to FIGS. 76 to 78, processes substantially the same as or similar to FIGS. 48 to 55 and FIG. 22 may be performed.

Thus, a gate electrode structure including steps disposed in the second direction and also steps disposed in the third direction at end portions thereof in the second direction may be formed. The gate electrode structure may have the following features, which may be illustrated by a first staircase structure S1 shown in FIG. 78.

The first staircase structure S1 may include an upper step layer including a first conductive pad P1, and a lower step layer including a second conductive pad P2, the fifth sacrificial pattern 826 and a second electrode E2. In other words, the second electrode E2 may be a portion of the second gate electrode 434 not having a conductive pad, and the first and second conductive pads P1 and P2 may be conductive pads of the second gate electrodes 434 at upper and lower levels.

In exemplary embodiments of the inventive concept, in the lower step layer, the sixth opening 842 may be formed between the second conductive pad P2 and the fifth sacrificial pattern 826, and the sixth opening 842 may be located between an end portion of the first conductive pad P1 in the third direction and an end portion of the second conductive pad P2 in the third direction. Thus, the first and second conductive pads P1 and P2 do not overlap in the first direction. This is because when the first to seventh sacrificial patterns 172, 215, 822, 824, 826, 828 and 830 are removed to form the first gap 410 through the third and fourth openings 390 and 400 to form the first to third gate electrodes 432, 434 and 436, end portions of the sacrificial patterns 172, 215, 822, 824, 826, 828 and 830 that may be removed from the third openings 390 neighboring in the third direction may be limited by the sixth opening 842. Thus, even though the first to third insulation pads 242, 244 and 246 have a relatively high etch rate to be etched at a high speed, an end of the first gap 410 in the third direction at a lower level may not overlap an end of the first gap 410 in the third direction at a higher level in the first staircase structure S1.

Referring to FIGS. 79 to 82, processes substantially the same as or similar to FIGS. 44 to 47 may be performed to complete the fabrication of the vertical memory device.

For example, the third insulation pattern 225 and the fifth sacrificial pattern 826 may be alternately and repeatedly stacked under the end portion of the first conductive pad P1 in the third direction in the first staircase structure S1 instead of the second electrode E2, and thus, the second contact plug 494 for applying an electrical signal to the first conductive pad P1 may extend through the first conductive pad P1 to reach an area thereunder. This can happen because the second conductive pad P2 at a lower level may not overlap the first conductive pad P1 at an upper level in the first direction in the first staircase structure S1.

In a method of manufacturing a vertical memory device in accordance with exemplary embodiments of the inventive concept, insulation pads may not be additionally removed so that time and cost for removing the insulation pads may be saved. For example, even though the insulation pads are replaced with a conductive structure, the CSLs may not be electrically short due to the contact plugs extending through the conductive structure.

While the inventive concept has been particularly shown and described with reference to exemplary embodiments thereof, it will be understood by one of ordinary skill in the art that variations in form and detail may be made thereto without departing from the spirit and scope of the inventive concept as set forth by the following claims.

What is claimed is:
1. A vertical memory device, comprising:
a substrate including a first region and a second region at least partially surrounding the first region;
gate electrodes at a plurality of levels, the gate electrodes spaced apart from each other in a first direction substantially perpendicular to an upper surface of the substrate, each of the gate electrodes extending in a second direction substantially parallel to the upper surface on the first region and the second region, and the gate electrodes are stacked in a staircase shape on the second region;

a channel extending in the first direction on the first region, the channel extending through the gate electrodes;

a first conductive structure on an end portion of a first gate electrode among the gate electrodes, the end portion on the second region, the first gate electrode being disposed at a lowermost level of the plurality of levels;

a second conductive structure spaced apart from the first conductive structure in the second direction on the second region, the second conductive structure not overlapping the first gate electrode in the first direction, a height of a top surface of the second conductive structure being different from a height of a top surface of the first conductive structure, and a height of a bottom surface of the second conductive structure being different from a height of a bottom surface of the first conductive structure; and a blocking pattern including a metal oxide, the blocking pattern covering upper and lower surfaces and a sidewall of each of the first and second conductive structures.

2. The vertical memory device of claim 1, wherein the second conductive structure is lower than the first conductive structure.

3. The vertical memory device of claim 1, further comprising a third conductive structure spaced apart from the first and second conductive structures in the second direction, the third conductive structure not overlapping the first gate electrode in the first direction and being disposed at a height different from that of the second conductive structure.

4. The vertical memory device of claim 1, wherein the first conductive structure is higher than the first gate electrode and lower one of the gate electrodes closest to the first gate electrode in the first direction.

5. The vertical memory device of claim 1, wherein the first and second conductive structures include a material substantially the same as that of the gate electrodes.

6. The vertical memory device of claim 1, further comprising a first insulation pad spaced apart from the first conductive structure in the second direction on the second region, the first insulation pad not overlapping the first gate electrode in the first direction and being disposed at a height substantially the same as that of the second conductive structure.

7. The vertical memory device of claim 6, wherein the first insulation pad is spaced apart from the end portion of the first gate electrode in the second direction.

8. The vertical memory device of claim 6, wherein the first insulation pad includes silicon nitride.

9. The vertical memory device of claim 6, wherein the substrate further includes a third region at least partially surrounding the second region, and wherein the vertical memory device further comprises a second insulation pad at a height different from that of the second conductive structure on the third region.

10. The vertical memory device of claim 1, wherein a plurality of first gate electrodes are spaced apart from each other in a third direction substantially parallel to the upper surface of the substrate and substantially perpendicular to the second direction, and wherein a plurality of first conductive structures are spaced apart from each other in the third direction on the first gate electrodes.

11. The vertical memory device of claim 1, wherein conductive pads are formed at end portions in the second direction of the gate electrodes, each of the conductive pads having a thickness greater than other portions of the gate electrodes on which they are formed.

12. A vertical memory device, comprising:
a substrate including a cell array region and an extension region at least partially surrounding the cell array region and a circuit region at least partially surrounding the extension region;

gate electrodes at a plurality of levels, the gate electrodes spaced apart from each other in a first direction substantially perpendicular to an upper surface of the substrate, each of the gate electrodes extending in a second direction substantially parallel to the upper surface on the cell array region and the extension region, and the gate electrodes are stacked in a staircase shape on the extension region;

a channel extending in the first direction on the cell array region, the channel extending through the gate electrodes;

a first conductive structure on an end portion of a first gate electrode among the gate electrodes, the end portion on the extension region, the first gate electrode being disposed at a lowermost level of the plurality of levels; and a second conductive structure spaced apart from the first conductive structure in the second direction on the extension region, the second conductive structure not overlapping the first gate electrode in the first direction and being disposed at a height different from that of the first conductive structure, wherein the second conductive structure is disposed on the extension region and a portion of the circuit region adjacent thereto.

13. The vertical memory device of claim 12, wherein the second conductive structure is higher than the first conductive structure.

14. A vertical memory device, comprising:
a substrate including a cell array region, an extension region at least partially surrounding the cell array region, and a circuit region at least partially surrounding the extension region;

gate electrodes at a plurality of levels, the gate electrodes spaced apart from each other in a first direction substantially perpendicular to an upper surface of the substrate, each of the gate electrodes extending in a second direction substantially parallel to the upper surface of the substrate on the cell array region and the extension region of the substrate, and the gate electrodes being stacked in a staircase shape on the extension region of the substrate;

a channel extending, in the first direction on the cell array region of the substrate, the channel extending through the gate electrodes;

a first insulation pad on a portion of the circuit region of the substrate spaced apart from an end portion, in the second direction, of a first gate electrode among the gate electrodes, the first gate electrode being disposed at a lowermost level of the plurality of levels, and the first insulation pad being higher than the first gate electrode with respect to the upper surface of the substrate; and a second insulation pad spaced apart from the first insulation pad in the second direction on the circuit region of the substrate, the second insulation pad being at a height different from that of the first insulation pad, wherein the first and second insulation pads include substantially the same material.

15. The vertical memory device of claim 14, wherein the first and second insulation pads include a nitride.

\* \* \* \* \*